US012615979B2

(12) United States Patent
Sakamoto

(10) Patent No.: US 12,615,979 B2
(45) Date of Patent: Apr. 28, 2026

(54) SEMICONDUCTOR MEMBER MANUFACTURING METHOD

(71) Applicant: HAMAMATSU PHOTONICS K.K., Hamamatsu (JP)

(72) Inventor: Takeshi Sakamoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 524 days.

(21) Appl. No.: 18/015,559

(22) PCT Filed: Jul. 1, 2021

(86) PCT No.: PCT/JP2021/024973
§ 371 (c)(1),
(2) Date: Jan. 11, 2023

(87) PCT Pub. No.: WO2022/014347
PCT Pub. Date: Jan. 20, 2022

(65) Prior Publication Data
US 2023/0307237 A1     Sep. 28, 2023

(30) Foreign Application Priority Data
Jul. 15, 2020     (JP) ................................. 2020-121653

(51) Int. Cl.
*H01L 21/268*     (2006.01)
*B23K 26/064*     (2014.01)
(Continued)

(52) U.S. Cl.
CPC .......... *H10P 34/42* (2026.01); *B23K 26/0648* (2013.01); *B23K 26/0736* (2013.01); *H10P 52/00* (2026.01)

(58) Field of Classification Search
CPC .............. H01L 21/268; H01L 21/3043; B23K 26/0648; B23K 26/0736
See application file for complete search history.

(56) References Cited

U.S. PATENT DOCUMENTS 8,703,582 B2 * 4/2014 Abe ....................... H10H 20/01
                                                                438/33
2018/0294189 A1 * 10/2018 Ogiwara .............. B23K 26/046
(Continued)

FOREIGN PATENT DOCUMENTS

| CN | 108365059 A | 8/2018 |
| JP | 2006-024840 A | 1/2006 |

(Continued)

OTHER PUBLICATIONS

International Preliminary Report on Patentability mailed Jan. 26, 2023 for PCT/JP2021/024973.

*Primary Examiner* — Omar Flores Sanchez

(74) *Attorney, Agent, or Firm* — Faegre Drinker Biddle & Reath LLP

(57) ABSTRACT

A semiconductor member manufacturing method includes a laser processing step of forming a converging spot of laser light in an object including a semiconductor while relatively moving the converging spot with respect to the object along a line extended in a circular shape when viewed from a Z direction intersecting with an incident surface of the laser light in the object, thereby forming a modified region and a fracture extended from the modified region along the line in the object, and a separation step of, after the laser processing step, separating a part of the object using the modified region and the fracture as a boundary, thereby forming a semiconductor member from the object.

8 Claims, 34 Drawing Sheets

(51) Int. Cl.
  B23K 26/073 (2006.01)
  H10P 34/42 (2026.01)
  H10P 52/00 (2026.01)

(56) References Cited

U.S. PATENT DOCUMENTS

| 2019/0337100 A1* | 11/2019 | Richter | ................... | H01L 21/78 |
| 2023/0249285 A1* | 8/2023 | Sakamoto | ............... | H01L 21/78 |
| | | | | 219/121.6 |
| 2024/0207974 A1* | 6/2024 | Murphy | ............. | B23K 26/0648 |

FOREIGN PATENT DOCUMENTS

| JP | 2014-189478 A | 10/2014 |
| JP | 5743123 B1 | 7/2015 |
| JP | 2016-060677 A | 4/2016 |
| JP | 2017-069308 A | 4/2017 |
| JP | 2017-119310 A | 7/2017 |
| JP | 2019-186559 A | 10/2019 |
| KR | 2013-0106769 A | 9/2013 |
| TW | 202012090 A | 4/2020 |
| WO | 2012/096092 A1 | 7/2012 |

* cited by examiner (a)

(b)

(a)

(b)

(a)

(b)

(a)

(b)

(a)

(b)

(a)

(b)

(a)

(b)

(c)

(a)

(b)

(c)

(a)

(b)

(a)

(b)

(a)

(b)

(a)

(b)

(c)

(a)

(b)

(a)

(b)

(a)

(b)

(c)

(a)

(b)

(a)

(b)

(a)

(b)

(a)

(b)

(a)

(b)

(a)

(b)

(a)

(b)

SEMICONDUCTOR MEMBER MANUFACTURING METHOD

TECHNICAL FIELD

The present disclosure relates to a semiconductor member manufacturing method.

BACKGROUND ART

Patent Literature 1 describes a laser dicing device. The laser dicing device includes a stage that moves a wafer, a laser head that irradiates the wafer with laser light, and a control unit that controls each unit. The laser head has a laser light source that emits processing laser light for forming a modified region inside the wafer, a dichroic mirror and a converging lens that are sequentially arranged on an optical path of the processing laser light, and an AF device.

CITATION LIST

Patent Literature

Patent Literature 1: Japanese Patent No. 5743123
Patent Literature 2: Japanese Unexamined Patent Publication No. 2006-24840

SUMMARY OF INVENTION

Technical Problem

On the above-described wafer, a bevel may be formed on the outer peripheral portion, for example, for the purpose of holding the wafer while protecting the front and back surfaces at the time of conveyance. Patent Literature 2 describes a method of beveling a GaP wafer. In this method, a disk-shaped diamond grindstone having a grinding groove at the outer edge is rotated at a high speed, and the GaP wafer is rotated at a low speed while the peripheral end portion of the side surface of the GaP wafer is brought into contact with the groove of the diamond grindstone, thereby grinding the peripheral end portion. Thus, it is conventionally necessary to use a grinding device separately from the laser processing device as described in Patent Literature 1 in order to form a bevel on a wafer. Therefore, in the above technical field, it is significant to enable bevel formation by laser processing.

An object of the present disclosure is to provide a semiconductor member manufacturing method capable of forming a semiconductor member having a bevel by laser processing.

Solution to Problem

A semiconductor member manufacturing method according to the present disclosure includes: a laser processing step of forming a converging spot of laser light in an object including a semiconductor while relatively moving the converging spot with respect to the object along a line extended in a circular shape when viewed from a Z direction intersecting with an incident surface of the laser light in the object, thereby forming a modified region and a fracture extended from the modified region along the line in the object; and a separation step of, after the laser processing step, separating a part of the object using the modified region and the fracture as a boundary, thereby forming the semiconductor member from the object, wherein the laser processing step includes a first processing step of relatively moving the converging spot with respect to the object along the line, thereby forming a first modified region along the line as a modified region and a first fracture extended from the first modified region as a fracture, the first fracture that is inclined with respect to the Z direction in an intersecting plane intersecting with the line is formed in the first processing step, and the semiconductor member including an inclined surface defined by the first fracture as an outer side surface is formed in the separation step.

In this manufacturing, the converging spot of the laser light is relatively moved with respect to the object along the line extended in a circular shape, thereby forming the modified region and the fracture along the line in the object. At this time, the first fracture that is inclined with respect to the Z direction intersecting with the incident surface of the laser light is formed in the intersecting plane intersecting with the line. Then, a part of the object is separated using a fracture including the first fracture as a boundary, thereby forming the semiconductor member. As a result, the semiconductor member including the inclined surface defined by the first fracture as an outer side surface can be obtained. This inclined surface can be used, for example, as a bevel for holding the semiconductor member (without contacting the front and back surfaces) at the time of conveying the semiconductor member, while protecting the front and back surfaces (a surface corresponding to the incident surface of the laser light and a surface on the opposite side) of the semiconductor member. Thus, according to this manufacturing method, the semiconductor member having a bevel can be formed by laser processing.

In the semiconductor member manufacturing method according to the present disclosure, a plurality of lines are set in the object, and, in the laser processing step, the converging spot may be relatively moved along each of the plurality of lines, thereby forming the modified region and the fracture along each of the plurality of lines, and, in the separation step, a part of the object may be separated along each of the plurality of lines, thereby forming a plurality of semiconductor members from the object. The bevel can be formed on each semiconductor member also when the plurality of semiconductor members are manufactured from one object in this manner.

In the semiconductor member manufacturing method according to the present disclosure, the object may have a circular outer shape when viewed from the Z direction, and a line concentric with the outer shape of the object when viewed from the Z direction may be set in the object. In this case, one semiconductor member is manufactured from one object, but even in this case, a bevel can be formed on the semiconductor member.

In the semiconductor member manufacturing method according to the present disclosure, the laser processing step may include a second processing step of relatively moving the converging spot with respect to the object along the line, thereby forming the second modified region on the incident surface side with respect to the first fracture as a modified region, and forming a second fracture extended from the second modified region toward the first fracture as a fracture, wherein, in the first processing step, the first fracture that is inclined with respect to the Z direction may be formed in the intersecting plane so as to get away from a reference line passing through the center of the line as it goes toward the incident surface, and, in the second processing step, the second fracture extended along the Z direction may be formed in the intersecting plane. In this case, a semiconductor member including the inclined surface defined by the first fracture and the vertical surface defined by the second fracture as outer side surfaces can be formed.

In the semiconductor member manufacturing method according to the present disclosure, the laser processing step may include a third processing step of relatively moving the converging spot with respect to the object along the line, thereby forming a third modified region on the incident surface side with respect to the intersection of the first fracture and the second fracture as a modified region, and forming a third fracture extended from the third modified region toward the second fracture as a fracture, and, in the third processing step, the third fracture that is inclined with respect to the Z direction may be formed in the intersecting plane so as to approach the reference line as it goes toward the incident surface. In this case, a semiconductor member including the inclined surface defined by the first fracture, the vertical surface defined by the second fracture, and another inclined surface defined by the third fracture as outer side surfaces can be formed.

In the semiconductor member manufacturing method according to the present disclosure, the laser processing step may include a second processing step of relatively moving the converging spot with respect to the object along the line, thereby forming the second modified region on the incident surface side with respect to the first fracture as a modified region, and forming the second fracture extended from the second modified region toward the first fracture as a fracture, wherein, in the first processing step, the first fracture that is inclined with respect to the Z direction may be formed in the intersecting plane so as to approach the reference line passing through the center of the line as it goes toward the incident surface, and, in the second processing step, the second fracture extended along the Z direction may be formed in the intersecting plane. In this case, a semiconductor member including the inclined surface defined by the first fracture and the vertical surface defined by the second fracture as outer side surfaces can be formed.

The semiconductor member manufacturing method according to the present disclosure may further include a grinding step of grinding the object along the Z direction to remove the modified region from the object between the laser processing step and the separation step. Alternatively, the semiconductor member manufacturing method according to the present disclosure may further include the grinding step of grinding the semiconductor member along the Z direction to remove the modified region from the semiconductor member after the separation step. In this case, the semiconductor member from which the modified region has been removed can be obtained.

In the semiconductor member manufacturing method according to the present disclosure, the first processing step may include a first forming step of relatively moving the converging spot along the line while setting a position of the converging spot in the Z direction at a first Z position, thereby forming a fourth modified region as the first modified region, and a second forming step of relatively moving the converging spot along the line while setting a position of the converging spot in the Z direction at a second Z position that is closer to the incident surface than the first Z position, thereby forming a fifth modified region as the first modified region, and forming the first fracture extended from the fifth modified region, wherein, in the first forming step, a position of the converging spot in a Y direction intersecting with an X direction that is a direction in which the converging spot is relatively moved and the Z direction may be set at a first Y position, and, in the second forming step, a position of the converging spot in the Y direction may be set at a second Y position shifted from the first Y position, while the laser light is modulated such that a beam shape of the converging spot in a YZ plane including the Y direction and the Z direction has an inclined shape that is inclined in the direction of the shift at least on the incident surface side with respect to the center of the converging spot, thereby forming the first fracture so as to be inclined in the direction of the shift in the YZ plane. In this case, the inclined first fracture can be suitably formed by laser processing.

Advantageous Effects of Invention

According to the present disclosure, the semiconductor member manufacturing method in which a semiconductor member having a bevel can be formed by laser processing can be provided.

BRIEF DESCRIPTION OF DRAWINGS

FIG. 2 is a schematic diagram illustrating a configuration of a laser irradiation unit illustrated in.

DESCRIPTION OF EMBODIMENTS

Figure 1:
FIG. 1 is a schematic diagram illustrating a configuration of a laser processing device according to an embodiment.
Figure 1:
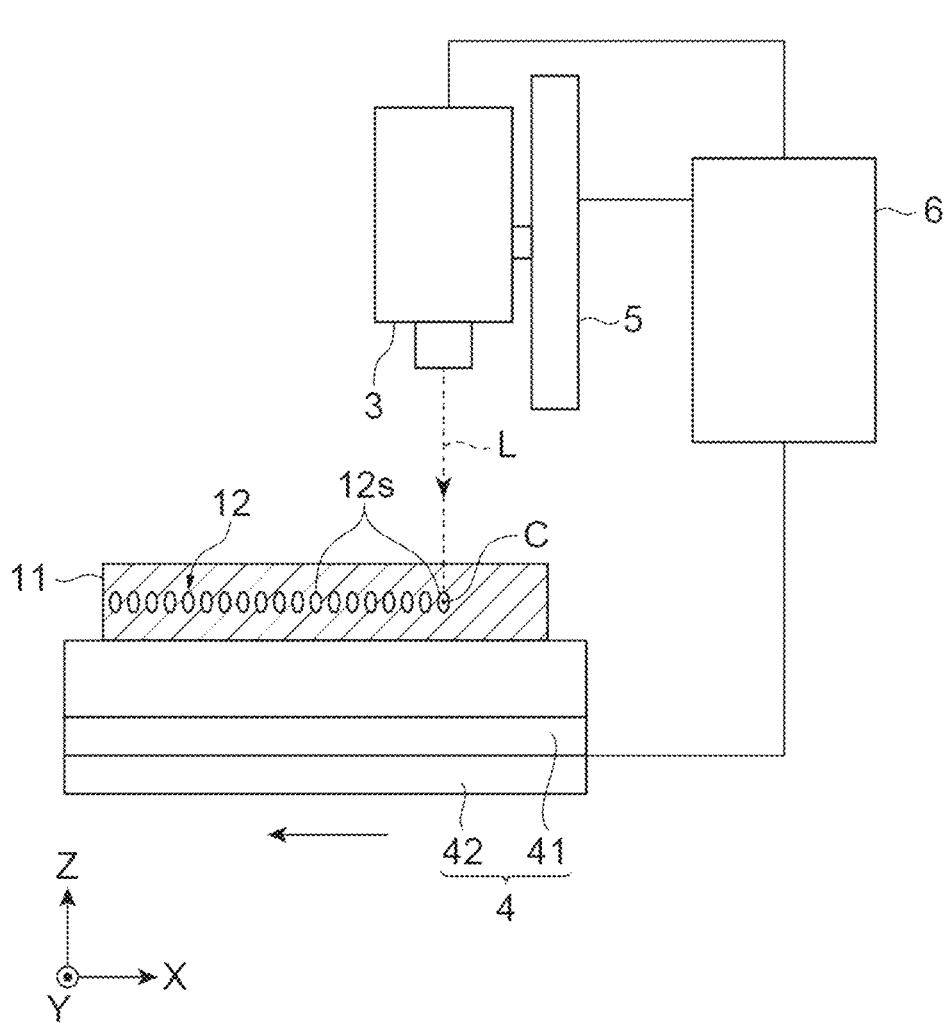

Hereinafter, an embodiment will be described in detail with reference to the drawings. In the drawings, the same or corresponding portions are denoted by the same reference numerals, and redundant description may be omitted. In addition, each drawing may indicate an orthogonal coordinate system defined by an X axis, a Y axis, and a Z axis.

[Overview of Laser Processing Device and Laser Processing]

FIG. 1 is a schematic diagram illustrating a configuration of a laser processing device according to an embodiment. As illustrated in FIG. 1, the laser processing device 1 includes a stage 2, a laser irradiation unit 3, drive units (movement units) 4 and 5, and a control unit 6. The laser processing device 1 is a device for forming a modified region 12 in an object 11 by irradiating the object 11 with laser light L.

The stage 2 supports the object 11, for example, by holding a film attached to the object 11. The stage 2 is rotatable about an axis parallel to the Z direction serving as a rotation axis. The stage 2 may be movable along each of the X direction and the Y direction. The X direction and the Y direction are a first horizontal direction and a second horizontal direction intersecting with (orthogonal to) each other, respectively, and the Z direction is a vertical direction.

The laser irradiation unit 3 converges the laser light L having transparency into the object 11 and irradiates the object 11 with the laser light L. When the laser light L is converged inside the object 11 supported by the stage 2, the laser light L is particularly absorbed in a portion corresponding to a converging spot C (for example, a center Ca to be described later) of the laser light L, and the modified region 12 is formed inside the object 11. Although described in detail later, the converging spot C is an area within a predetermined range from a position where the beam intensity of the laser light L is highest or a centroid position of the beam intensity.

The modified region 12 is a region that differs from its surrounding unmodified regions in density, refractive index, mechanical strength, and other physical properties. Examples of the modified region 12 include a molten processed region, a crack region, a dielectric breakdown region, and a refractive index change region. In the modified region 12, a fracture can be formed so as to be extended from the modified region 12 to the incident side of the laser light L and the opposite side thereof. Such a modified region 12 and a fracture are used, for example, to cut the object 11.

As an example, when the stage 2 is moved along the X direction and the converging spot C is relatively moved with respect to the object 11 along the X direction, a plurality of reformed spots 12$s$ are formed so as to be arrayed in a row along the X direction. One reformed spot 12$s$ is formed by irradiation with one pulse of laser light L. One row of modified regions 12 is a set of the plurality of reformed spots 12$s$ arrayed in a row. Adjacent reformed spots 12$s$ may be connected to each other or may be separated from each other depending on the relative moving speed of the converging spot C with respect to the object 11 and the repetition frequency of the laser light L.

The drive unit 4 includes a first movement unit 41 that moves the stage 2 in one direction in a plane intersecting with (orthogonal to) the Z direction, and a second movement unit 42 that moves the stage 2 in another direction in the plane intersecting with (orthogonal to) the Z direction. As an example, the first movement unit 41 moves the stage 2 along the X direction, and the second movement unit 42 moves the stage 2 along the Y direction. In addition, the drive unit 4 rotates the stage 2 about the axis parallel to the Z direction serving as the rotation axis. The drive unit 5 supports the laser irradiation unit 3. The drive unit 5 moves the laser irradiation unit 3 along the X direction, the Y direction, and the Z direction. When the stage 2 and/or the laser irradiation unit 3 are moved while the converging spot C of the laser light L is formed, the converging spot C is relatively moved with respect to the object 11. That is, the drive units 4 and 5 are movement units that move at least one of the stage 2 and the laser irradiation unit 3 so that the converging spot C of the laser light L relatively moves with respect to the object 11.

The control unit 6 controls the operation of the stage 2, the laser irradiation unit 3, and the drive units 4 and 5. The control unit 6 has a processing unit, a storage unit, and an input receiving unit (not illustrated). The processing unit is configured as a computer device including a processor, a memory, a storage, a communication device, and the like. In the processing unit, the processor executes software (program) read into the memory or the like, and controls reading and writing of data in the memory and the storage, and communication by the communication device. The storage unit is, for example, a hard disk or the like, and stores various data. The input receiving unit is an interface unit that displays various information and receives input of the various information from a user. The input receiving unit constitutes a graphical user interface (GUI).

Figure 2:
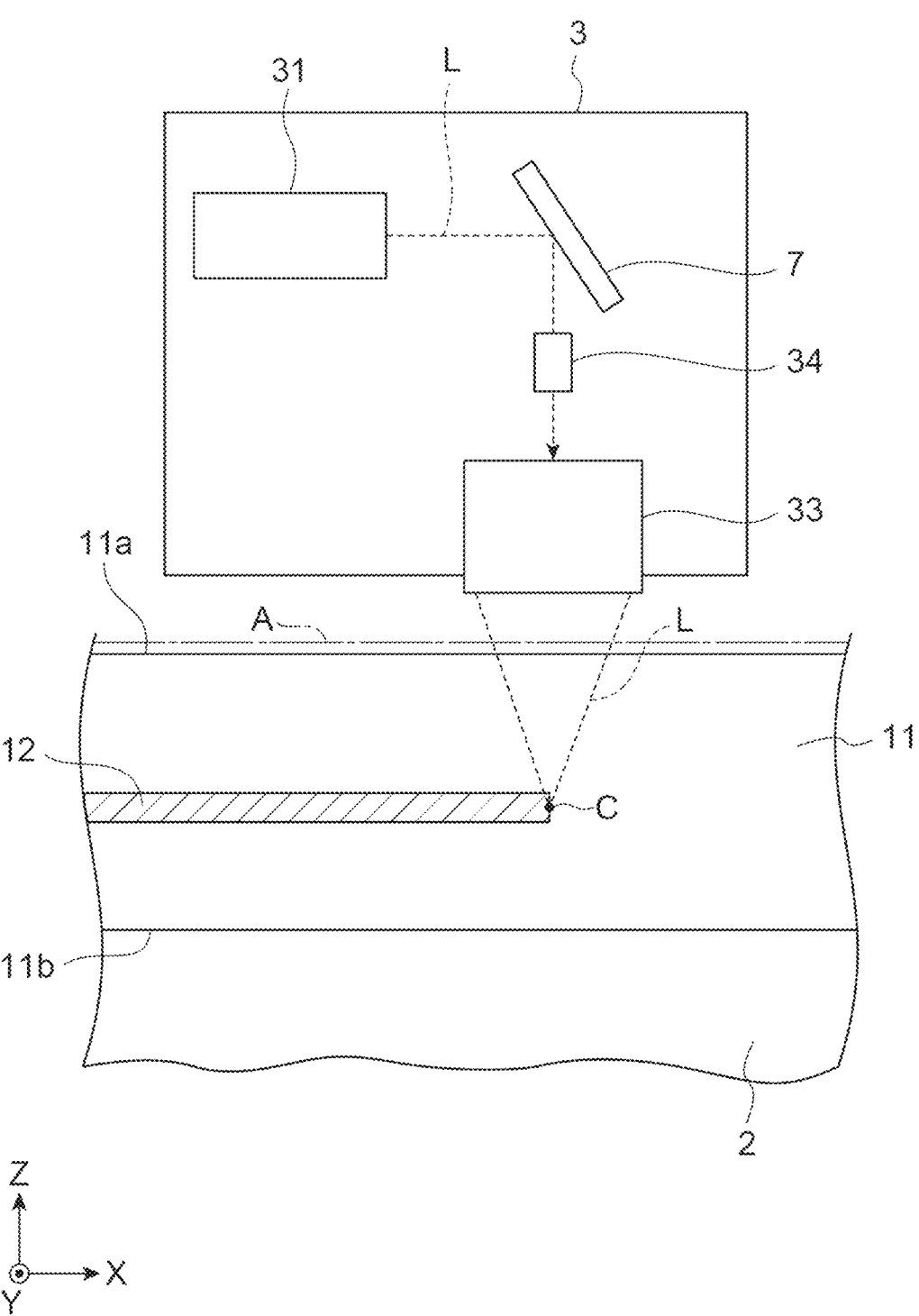

FIG. 2 is a schematic diagram illustrating a configuration of the laser irradiation unit illustrated in FIG. 1. FIG. 2 illustrates a virtual line A indicating a plan of laser processing. As illustrated in FIG. 2, the laser irradiation unit 3 has a light source 31, a space light modulator 7, a converging lens 33, and a 4f lens unit 34. The light source 31 outputs the laser light L by, for example, a pulse oscillation method. Alternatively, the laser irradiation unit 3 may not have the light source 31 and may be configured to introduce the laser light L from the outside of the laser irradiation unit 3. The space light modulator 7 modulates the laser light L output from the light source 31. The converging lens 33 converges the laser light L modulated by the space light modulator 7 and output from the space light modulator 7 toward the object 11.

Figure 3:
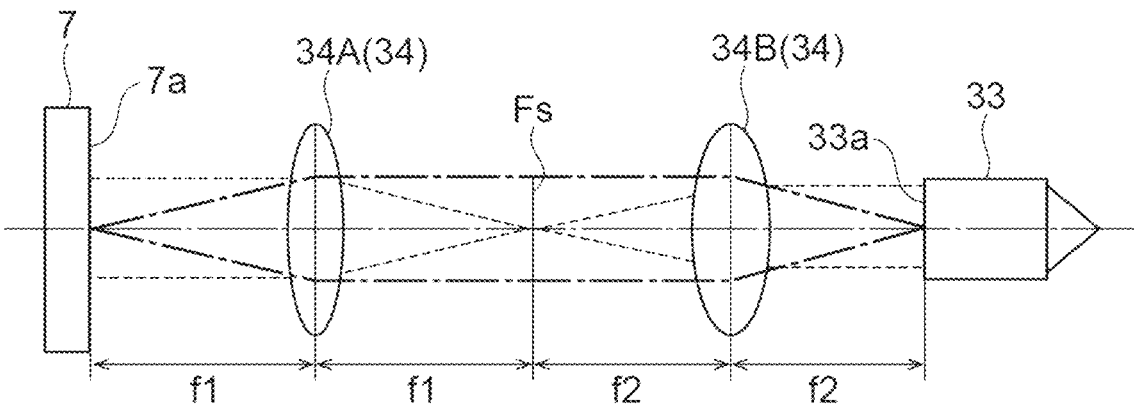
FIG. 3 is a view illustrating a 4f lens unit illustrated in FIG. 2.

As illustrated in FIG. 3, the 4f lens unit 34 has a pair of lenses 34A and 34B arrayed along an optical path of the laser light L from the space light modulator 7 toward the converging lens 33. The pair of lenses 34A and 34B constitutes a both-side telecentric optical system in which a modulation surface 7a of the space light modulator 7 and the entrance pupil plane (pupil plane) 33a of the converging lens 33 have an imaging relationship. With this configuration, an image of the laser light L on the modulation surface 7a of the space light modulator 7 (an image of the laser light L modulated by the space light modulator 7) is transferred to (formed on) the entrance pupil plane 33a of the converging lens 33. Fs in the figure indicates a Fourier plane.

Figure 4:
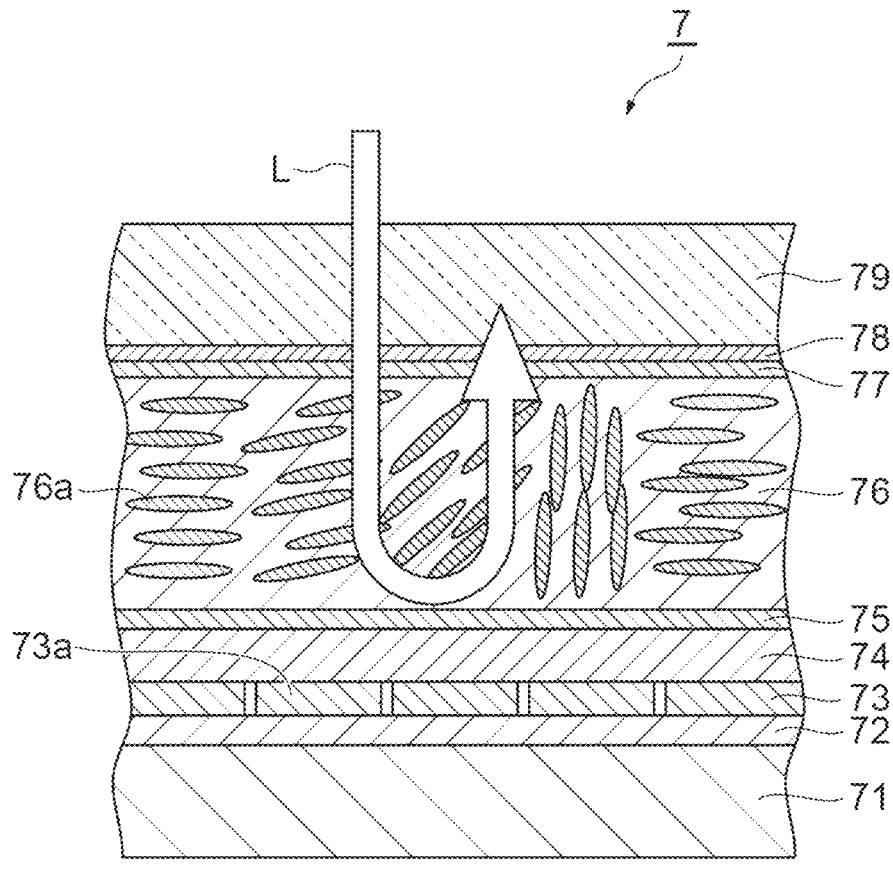
FIG. 4 is a view illustrating a space light modulator illustrated in FIG. 2.

As illustrated in FIG. 4, the space light modulator 7 is a spatial light modulator (SLM) of reflective liquid crystal on silicon (LCOS). The space light modulator 7 is configured by laminating a drive circuit layer 72, a pixel electrode layer 73, a reflective film 74, an alignment film 75, a liquid crystal layer 76, an alignment film 77, a transparent conductive film 78, and a transparent substrate 79 in this order on a semiconductor substrate 71.

The semiconductor substrate 71 is, for example, a silicon substrate. The drive circuit layer 72 constitutes an active matrix circuit on the semiconductor substrate 71. The pixel electrode layer 73 includes a plurality of pixel electrodes 73a arrayed in a matrix along the surface of the semiconductor substrate 71. Each pixel electrode 73a is formed of, for example, a metal material such as aluminum. A voltage is applied to each pixel electrode 73a by the drive circuit layer 72.

The reflective film 74 is, for example, a dielectric multilayer film. The alignment film 75 is provided on the surface of the liquid crystal layer 76 on the reflective film 74 side, and the alignment film 77 is provided on the surface of the liquid crystal layer 76 on the side opposite to the reflective film 74. Each of the alignment films 75 and 77 is formed of, for example, a polymer material such as polyimide, and a contact surface of each of the alignment films 75 and 77 with the liquid crystal layer 76 is subjected to, for example, rubbing treatment. The alignment films 75 and 77 array liquid crystal molecules 76a included in the liquid crystal layer 76 in a certain direction.

The transparent conductive film 78 is provided on the surface of the transparent substrate 79 on the alignment film 77 side, and faces the pixel electrode layer 73 across the liquid crystal layer 76 and others. The transparent substrate 79 is, for example, a glass substrate. The transparent conductive film 78 is formed of, for example, a light transmissive and conductive material such as ITO. The transparent substrate 79 and the transparent conductive film 78 allow the laser light L to pass therethrough.

In the space light modulator 7 configured as described above, when a signal indicating the modulation pattern is input from the control unit 6 to the drive circuit layer 72, a voltage corresponding to the signal is applied to each pixel electrode 73a, and an electric field is formed between each pixel electrode 73a and the transparent conductive film 78. When the electric field is formed, in the liquid crystal layer 76, the array direction of the liquid crystal molecules 76a changes in each area corresponding to each pixel electrode 73a, and the refractive index changes in each area corresponding to each pixel electrode 73a. This state is a state in which the modulation pattern is displayed on the liquid crystal layer 76. The modulation pattern is for modulating the laser light L.

That is, when the laser light L enters the liquid crystal layer 76 from the outside through the transparent substrate 79 and the transparent conductive film 78, is reflected by the reflective film 74, and is emitted from the liquid crystal layer 76 to the outside through the transparent conductive film 78 and the transparent substrate 79 while the modulation pattern is displayed on the liquid crystal layer 76, the laser light L is modulated in accordance with the modulation pattern displayed on the liquid crystal layer 76. As described above, according to the space light modulator 7, it is possible to modulate the laser light L (for example, modulate the intensity, amplitude, phase, polarization, and the like of the laser light L) by appropriately setting the modulation pattern to be displayed on the liquid crystal layer 76. Note that the modulation surface 7a illustrated in FIG. 3 is, for example, the liquid crystal layer 76.

As described above, the laser light L output from the light source 31 enters the converging lens 33 through the space light modulator 7 and the 4f lens unit 34, and is converged in the object 11 by the converging lens 33, thereby forming the modified region 12 and a fracture extended from the modified region 12 at the converging spot C in the object 11. Further, the control unit 6 controls the drive units 4 and 5 to relatively move the converging spot C with respect to the object 11, so that the modified region 12 and the fracture are formed along the movement direction of the converging spot C.

[Description of Knowledge on Inclined Fracture Formation]

Here, the movement direction (processing forward direction) of the converging spot C at this time is defined as the X direction. Further, a direction intersecting with (orthogonal to) a first surface 11a that is an incident surface of the laser light L in the object 11 is defined as the Z direction. A direction intersecting with (orthogonal to) the X direction and the Z direction is defined as the Y direction. The X direction and the Y direction are directions along the first surface 11a. The Z direction may be defined as an optical axis of the converging lens 33 or an optical axis of the laser light L converged toward the object 11 through the converging lens 33.

Figure 5:
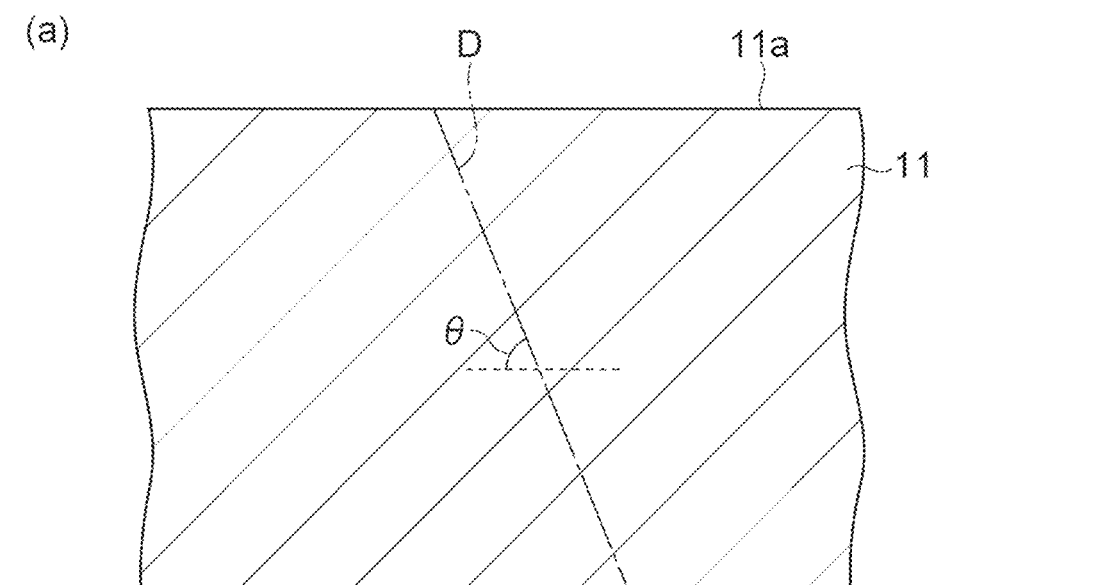
FIG. 5 is a cross-sectional view of an object for explaining knowledge of inclined fracture formation.
Figure 5:
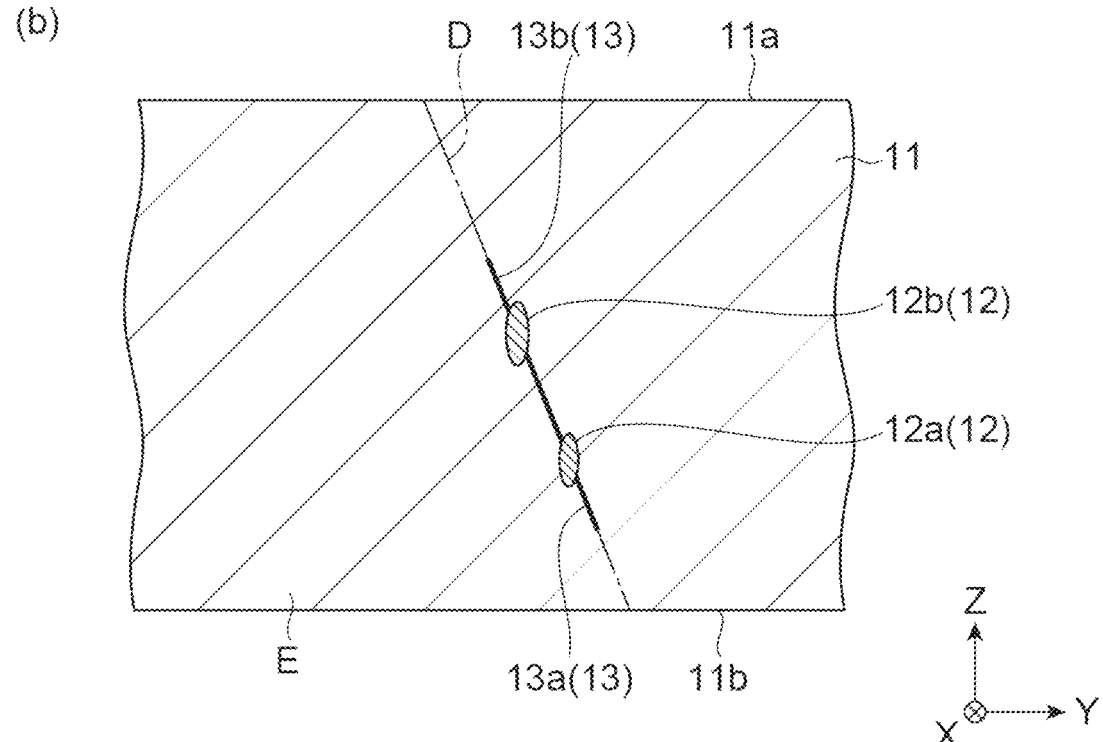

As illustrated in FIG. 5, there is a demand for forming a fracture inclined along a line D that is inclined with respect to the Z direction and the Y direction (here, a line D inclined at a predetermined angle θ from the Y direction) in an intersecting plane intersecting with the X direction that is the processing forward direction (YZ plane E including the Y direction and the Z direction). Knowledge of the present inventor on such inclined fracture formation will be described with reference to processing examples.

Figure 6:
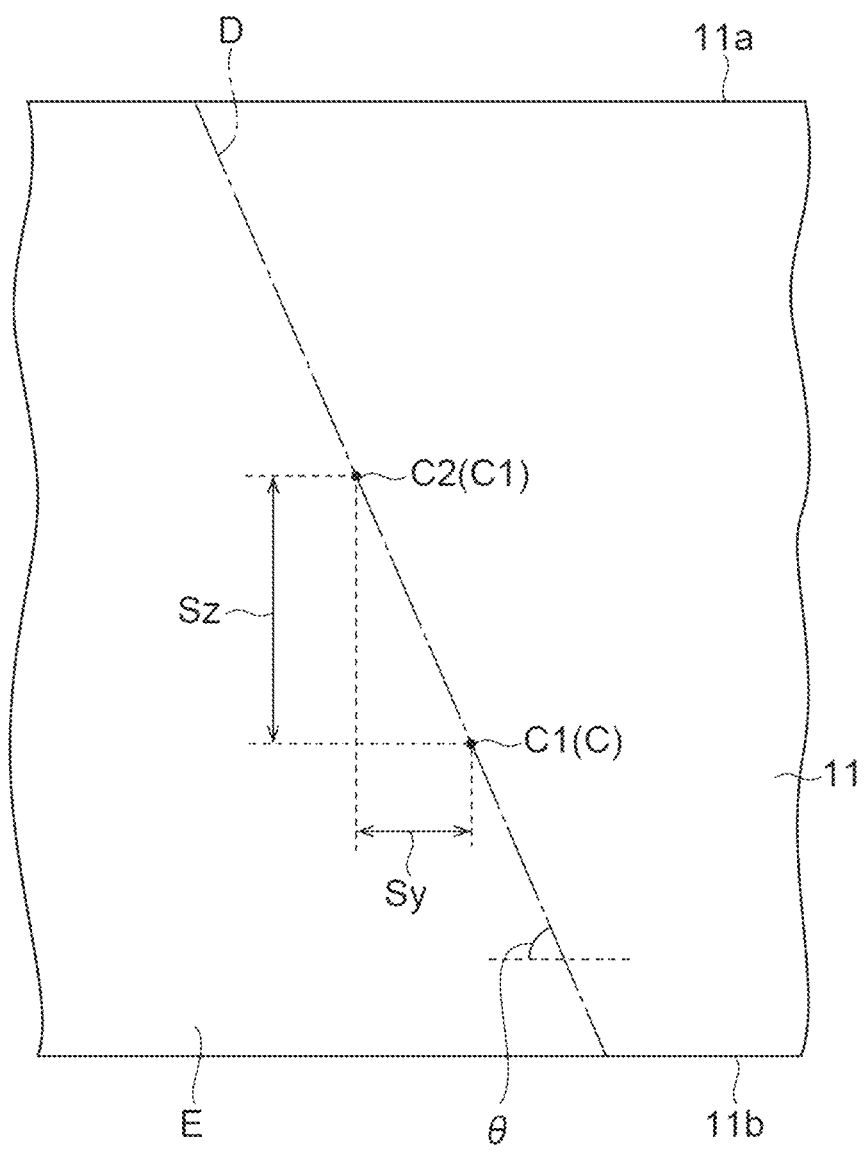
FIG. 6 is a cross-sectional view of an object for explaining knowledge of inclined fracture formation.
Figure 6:
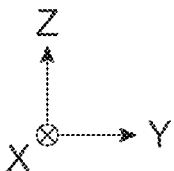

Here, modified regions 12a and 12b are formed as the modified region 12. As a result, a fracture 13a extended from the modified region 12a and a fracture 13b extended from the modified region 12b are connected to form a fracture 13 extended obliquely along the line D. Here, first, as illustrated in FIG. 6, a converging spot C1 is formed using the first surface 11a of the object 11 as the incident surface of the laser light L. Meanwhile, a converging spot C2 is formed using the first surface 11a as the incident surface of the laser light L on the side closer to the first surface 11a than the converging spot C1. At this time, the converging spot C2 is shifted from the converging spot C1 in the Z direction by a distance Sz, and is shifted from the converging spot C1 in the Y direction by a distance Sy. As an example, the distance Sz and the distance Sy correspond to a slope of the line D.

Figure 7:
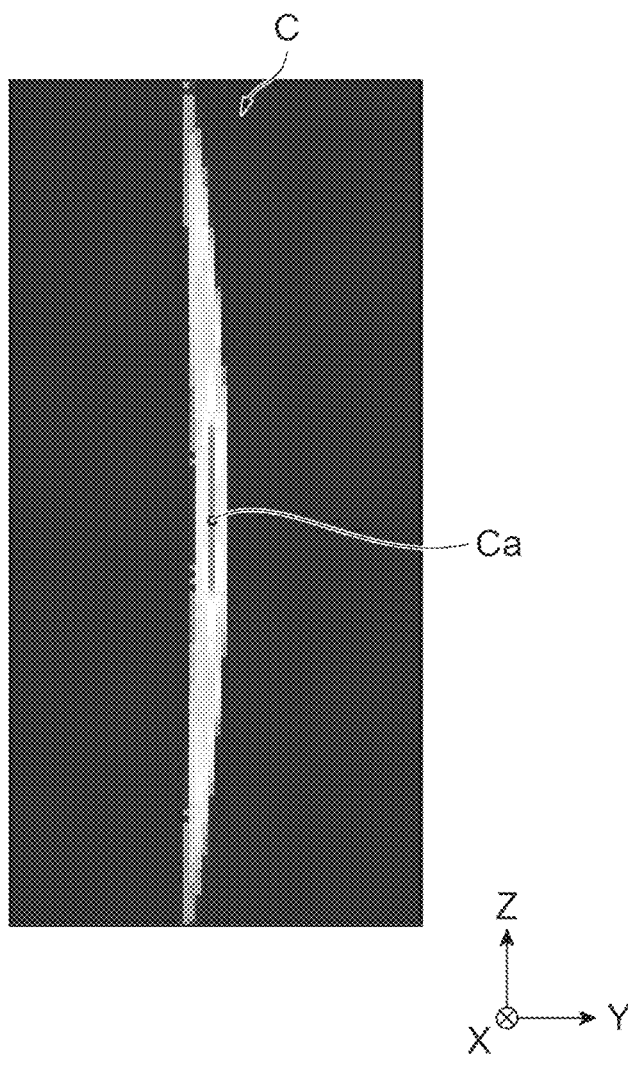
FIG. 7 is a view illustrating a beam shape of a converging spot of laser light.

Meanwhile, as illustrated in FIG. 7, the beam shape of the converging spot C (at least the converging spot C2) in a YZ plane E is formed into an inclined shape that is inclined in the shift direction with respect to the Z direction (here, to the negative side in the Y direction) at least on the first surface 11a side with respect to the center Ca of the converging spot C by modulating the laser light L using the space light modulator 7. In the example of FIG. 7, an arc shape is formed that is inclined to the negative side in the Y direction with respect to the Z direction on the first surface 11*a* side with respect to the center Ca, and is inclined to the negative side in the Y direction with respect to the Z direction also on the side opposite to the first surface 11*a* with respect to the center Ca. Note that the beam shape of the converging spot C in the YZ plane E refers to an intensity distribution of the laser light L at the converging spot C in the YZ plane E.

Figure 8:
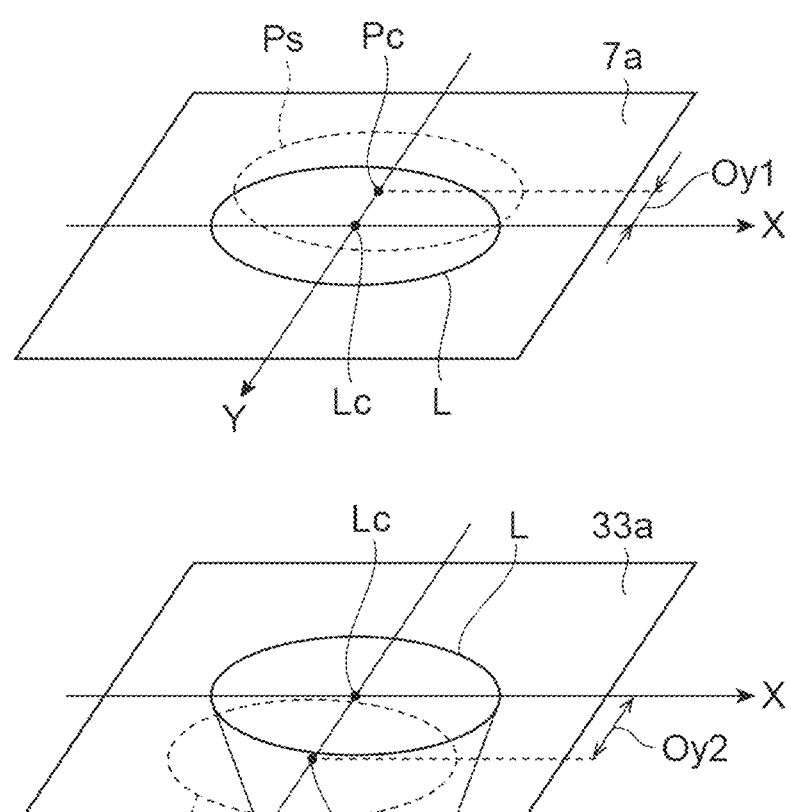
FIG. 8 is a view illustrating offset of a modulation pattern.
Figure 8:
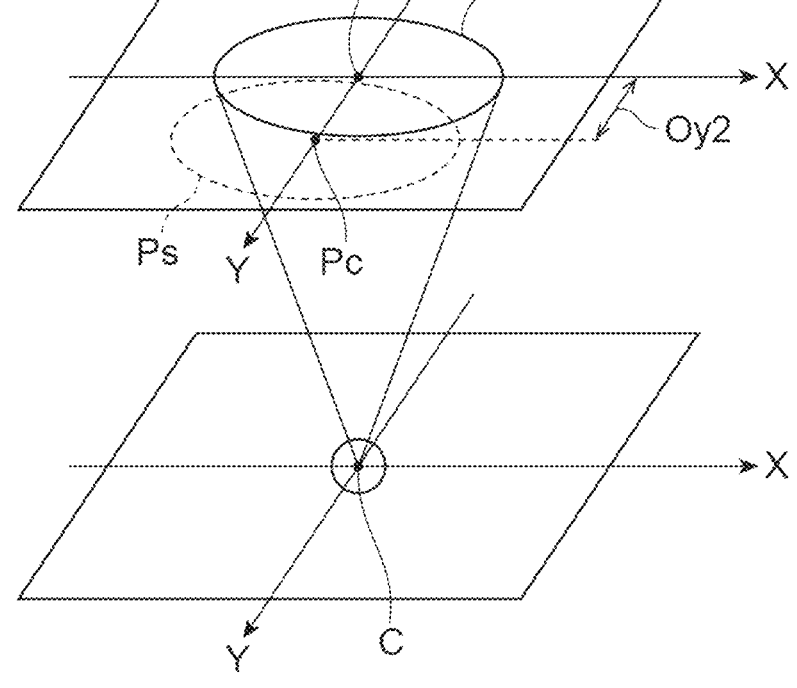

As described above, when at least two converging spots C1 and C2 are shifted in the Y direction and the beam shape of at least the converging spot C2 (here, both the converging spots C1 and C2) is formed into an inclined shape, the obliquely extended fracture 13 can be formed as illustrated in FIG. 8(*a*). Note that, the converging spots C1 and C2 may be simultaneously formed by branching the laser light L, for example, with the control of the modulation pattern of the space light modulator 7 to form the modified region 12 and the fracture 13 (multifocal processing), or the modified region 12*b* and the fracture 13*b* may be formed by forming the converging spot C2 after the modified region 12*a* and the fracture 13*a* are formed by forming the converging spot C1 (single-pass processing).

In addition, as illustrated in FIG. 8(*b*), another modified region 12*c* may be interposed between the modified region 12*a* and the modified region 12*b* to form a longer obliquely extended fracture 13 by forming another converging spot between the converging spot C1 and the converging spot C2.

Figure 15:
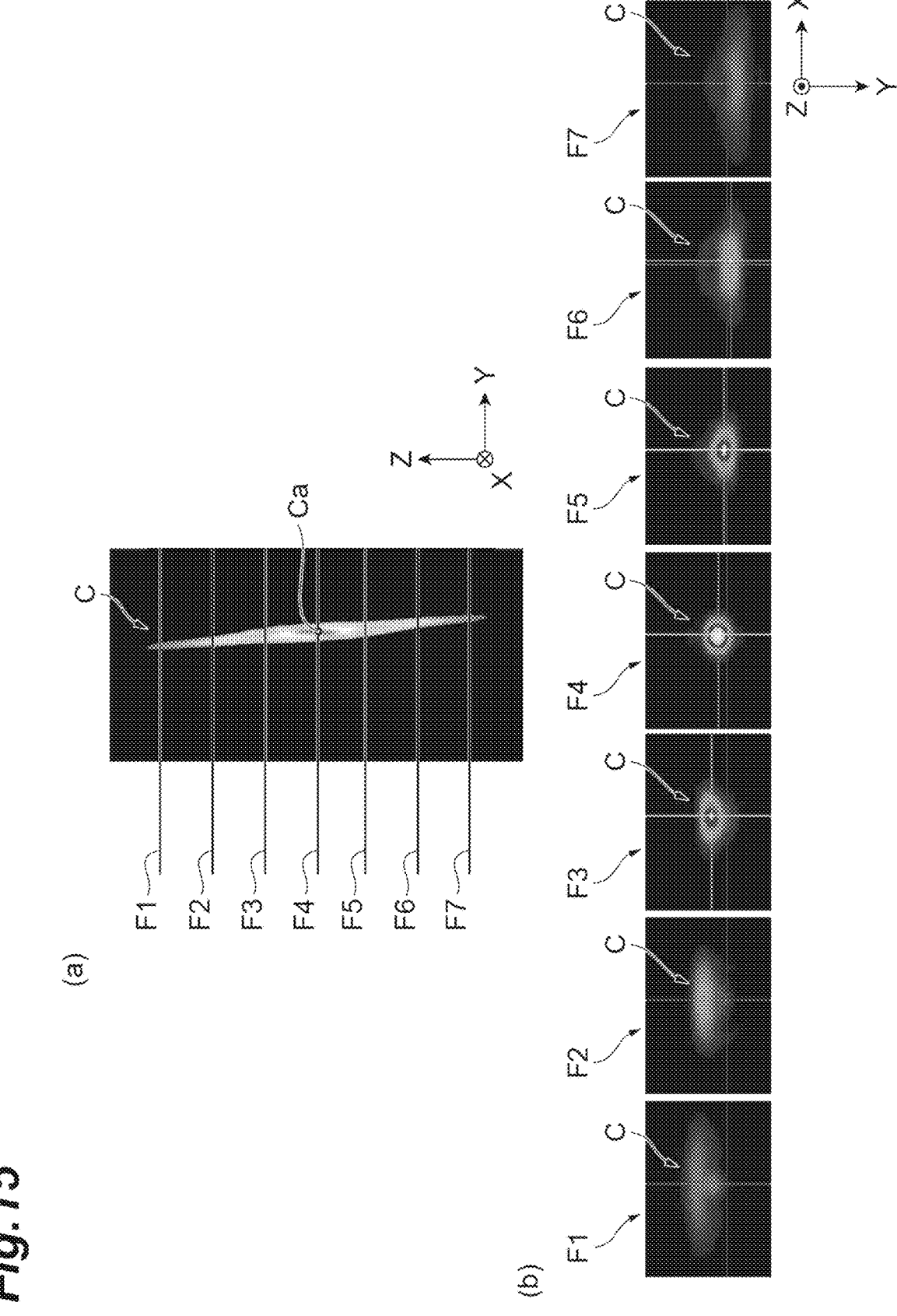
FIG. 15 is a view illustrating the beam shape of the converging spot and observation results of an intensity distribution of the converging spot.

Next, knowledge for forming the beam shape of the converging spot C in the YZ plane E into an inclined shape will be described. First, the definition of the converging spot C will be specifically described. Here, the converging spot C is an area within a predetermined range from the center Ca (for example, a range of +25 μm from the center Ca in the Z direction). As described above, the center Ca is a position where the beam intensity is highest or a centroid position of the beam intensity. The centroid position of the beam intensity is, for example, a position where the centroid of the beam intensity is located on the optical axis of the laser light L in a state in which modulation by a modulation pattern for shifting the optical axis of the laser light L, such as a modulation pattern for branching the laser light L, is not performed. The position where the beam intensity is highest and the centroid position of the beam intensity can be acquired as follows. That is, the object 11 is irradiated with the laser light L in a state in which the output of the laser light L is lowered to such an extent that the modified region 12 is not formed in the object 11 (lower than the processing threshold value). At the same time, the reflected light of the laser light L from the surface of the object 11 opposite to the incident surface of the laser light L (here, the second surface 11*b*) is photographed by a camera for a plurality of positions F1 to F7 in the Z direction, for example, as illustrated in FIG. 15. Thus, the position where the beam intensity is highest and the centroid position can be acquired based on the obtained image. The modified region 12 is formed near the center Ca.

There is a method that offsets the modulation pattern to form the beam shape at the converging spot C into an inclined shape. More specifically, various patterns such as a distortion correction pattern for correcting the distortion of the wavefront, a grating pattern for branching the laser light, a slit pattern, an astigmatism pattern, a coma aberration pattern, and a spherical aberration correction pattern are displayed on the space light modulator 7 (a pattern in which these are superimposed is displayed). As illustrated in FIG.

9, the beam shape of the converging spot C can be adjusted by offsetting a spherical aberration correction pattern Ps.

Figure 9:
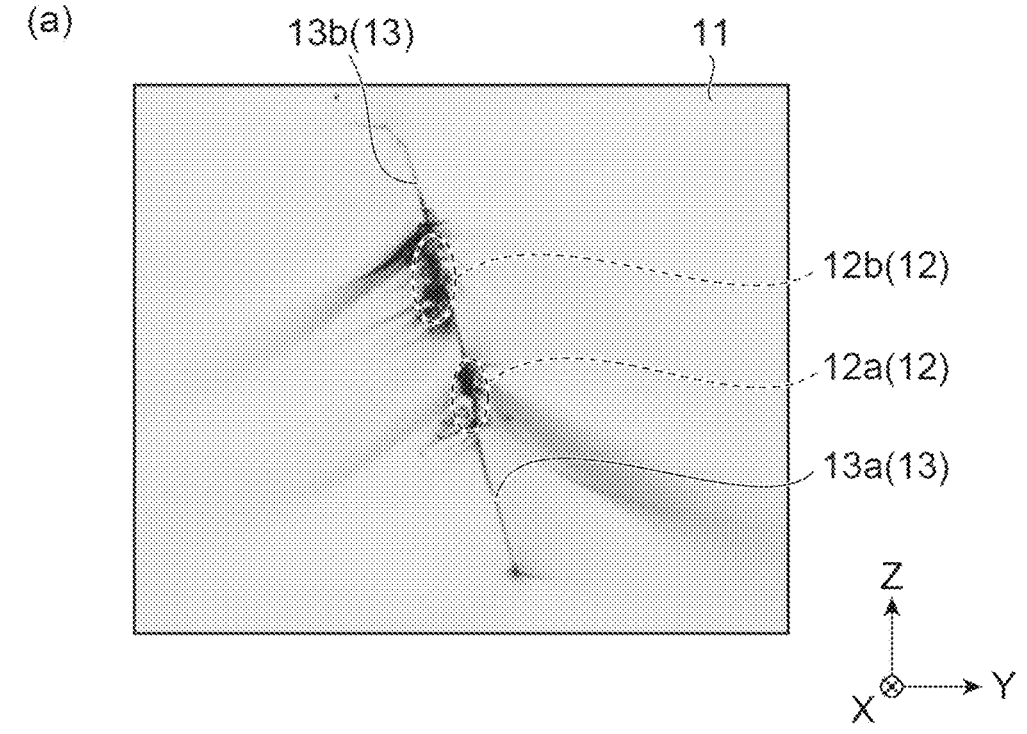
FIG. 9 is a cross-sectional photograph illustrating a state in which an inclined fracture is formed.
Figure 9:
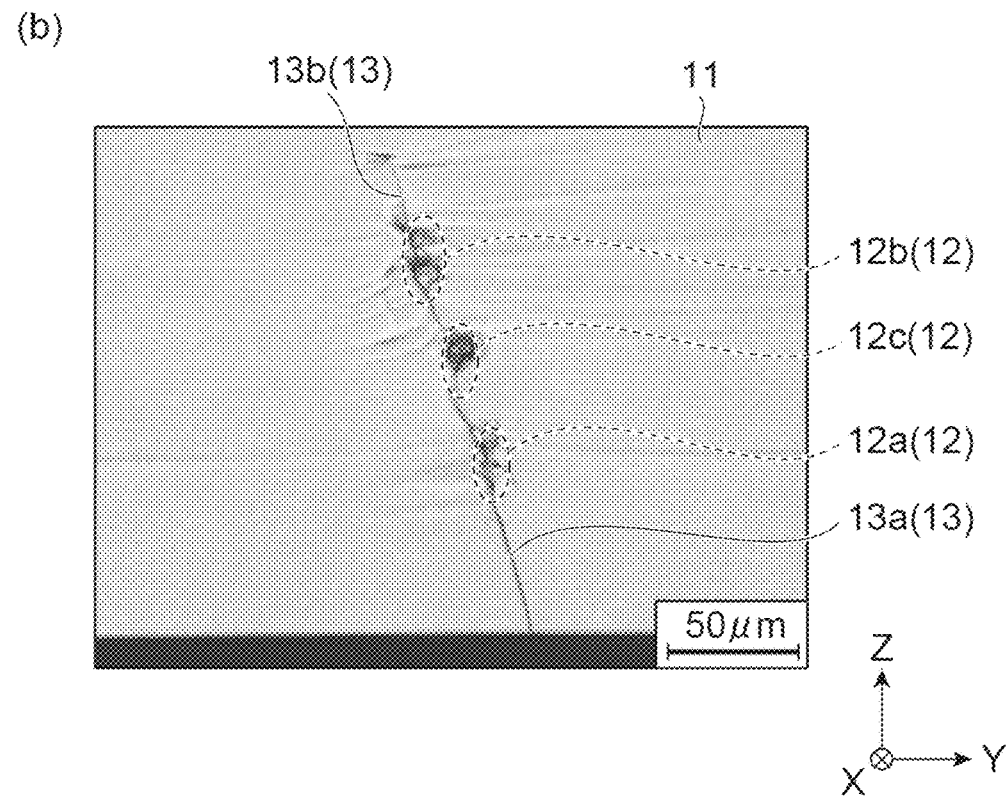

In the example of FIG. 9, on the modulation surface 7*a*, a center Pc of the spherical aberration correction pattern Ps is offset to the negative side in the Y direction by an offset amount Oy1 with respect to a center Lc (of the beam spot) of the laser light L. As described above, the modulation surface 7*a* is transferred to the entrance pupil plane 33*a* of the converging lens 33 by the 4f lens unit 34. Therefore, the offset on the modulation surface 7*a* is an offset to the positive side in the Y direction on the entrance pupil plane 33*a*. That is, on the entrance pupil plane 33*a*, the center Pc of the spherical aberration correction pattern Ps is offset to the positive side in the Y direction by an offset amount Oy2 from the center Lc of the laser light L and the center of the entrance pupil plane 33*a* (that coincides with the center Lc here).

As described above, the beam shape of the converging spot C of the laser light L is deformed into an arcuate inclined shape as illustrated in FIG. 7 by offsetting the spherical aberration correction pattern Ps. Offsetting the spherical aberration correction pattern Ps as described above corresponds to imparting coma aberration to the laser light L. Therefore, the beam shape of the converging spot C may be inclined by including the coma aberration pattern for imparting coma aberration to the laser light L in the modulation pattern of the space light modulator 7. As the coma aberration pattern, a pattern corresponding to the ninth term of the Zernike polynomial (the Y component of the third-order coma aberration), in which coma aberration occurs in the Y direction, can be used.

Figure 10:
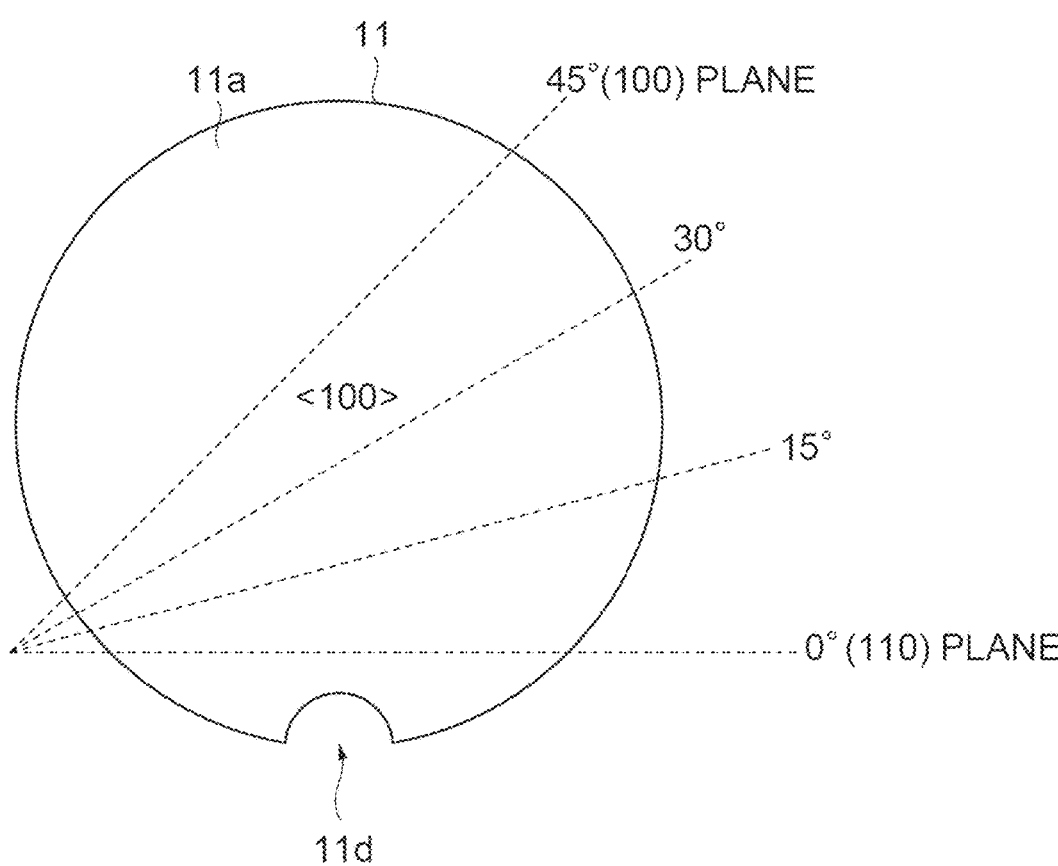
FIG. 10 is a schematic plan view of the object.

Next, knowledge on the relationship between the crystallinity of the object 11 and the fracture 13 will be described. FIG. 10 is a schematic plan view of the object. Here, the object 11 is a silicon wafer (t 775 μm, <100>, 1 Ω·cm), and a notch 11*d* is formed. For the object 11, FIG. 11(*a*) illustrates a first processing example in which the X direction that is the processing forward direction is aligned with a 0° (100) plane, FIG. 11(*b*) illustrates a second processing example in which the X direction is aligned with 15°, FIG. 12(*a*) illustrates a third processing example in which the X direction is aligned with 30°, and FIG. 12(*b*) illustrates a fourth processing example in which the X direction is aligned with a 45° (100) plane. In each processing example, the angle θ of the line D from the Y direction in the YZ plane is set to 71°.

In addition, in each processing example, single-pass processing is performed in which the converging spot C1 is relatively moved in the X direction as the first pass to form the modified region 12*a* and the fracture 13*a*, and then the converging spot C2 is relatively moved in the X direction as the second pass to form the modified region 12*b* and the fracture 13*b*. Processing conditions for the first pass and the second pass are as follows. Note that CP below indicates the intensity of the light converging correction, and a coma (LBA offset Y) indicates the offset amount of the spherical aberration correction pattern Ps in the Y direction in units of pixels of the space light modulator 7.

<First Pass>

Position in Z direction: 161 μm

CP: −18

Output: 2 W

Speed: 530 mm/s

Frequency: 80 kHz

Coma (LBA offset Y): −5

Position in Y direction: 0

<Second Pass>

Position in Z direction: 151 μm

CP: −18

Output: 2 W

Speed: 530 mm/s

Frequency: 80 KHz

Coma (LBA offset Y): −5

Position in Y direction: 0.014 mm

Figure 11:
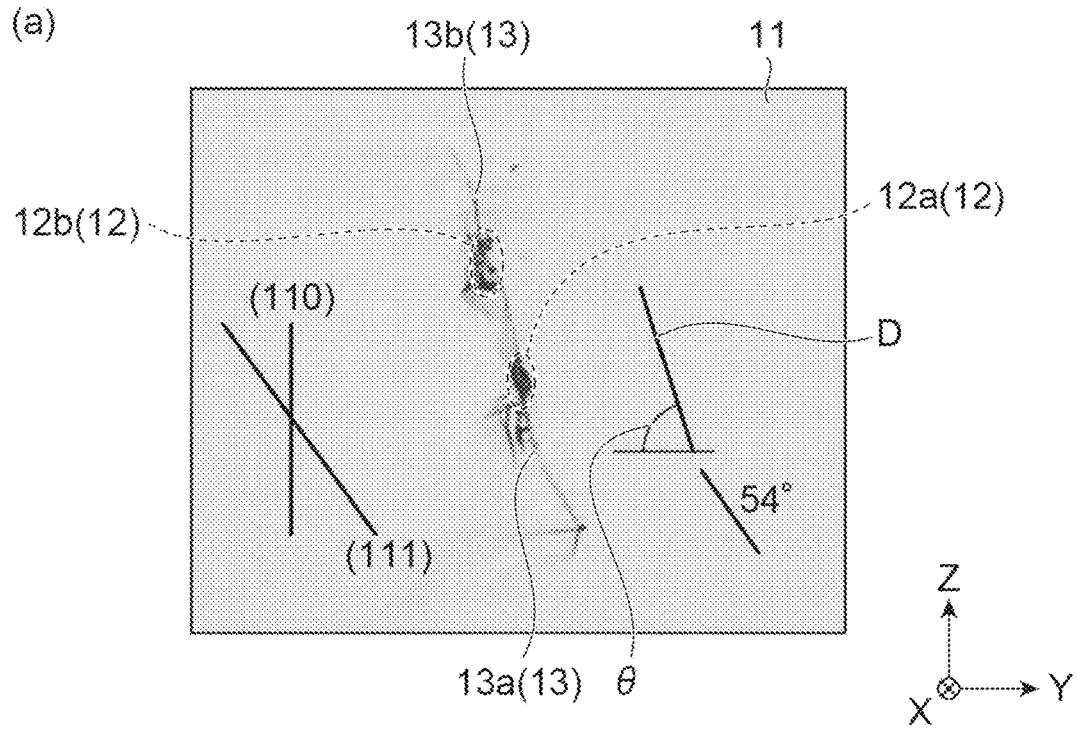
FIG. 11 is a cross-sectional photograph illustrating a state of inclined fracture formation.
Figure 11:
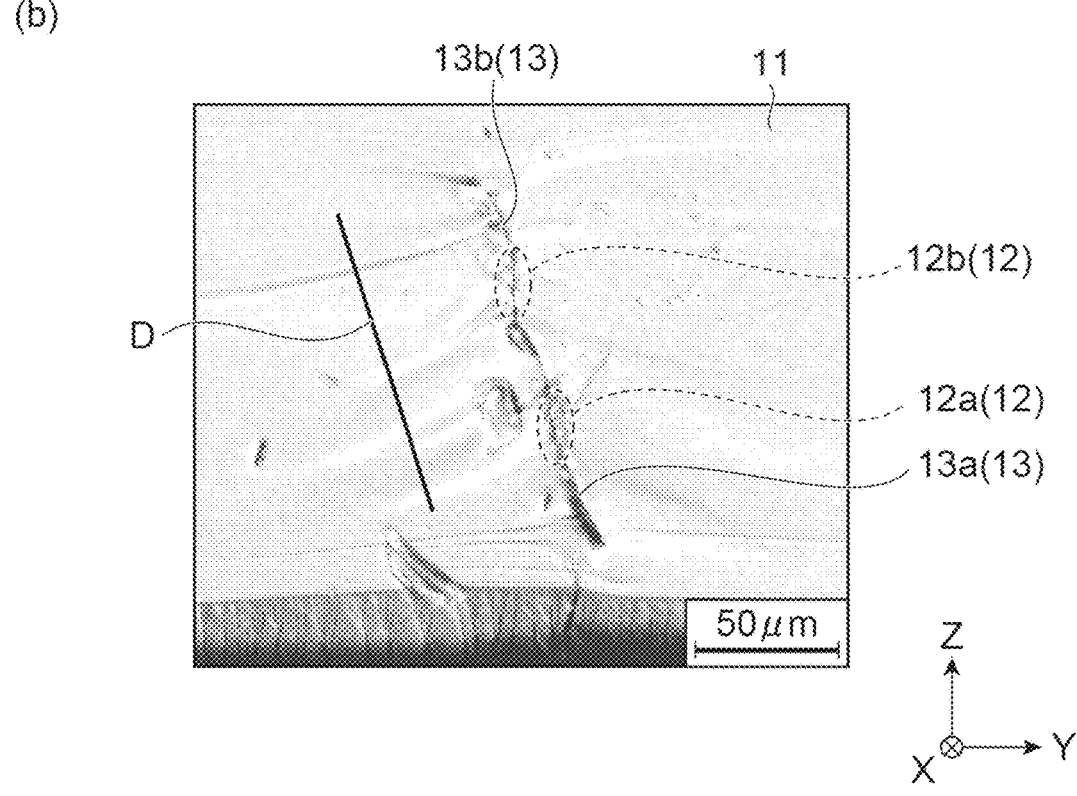
Figure 12:
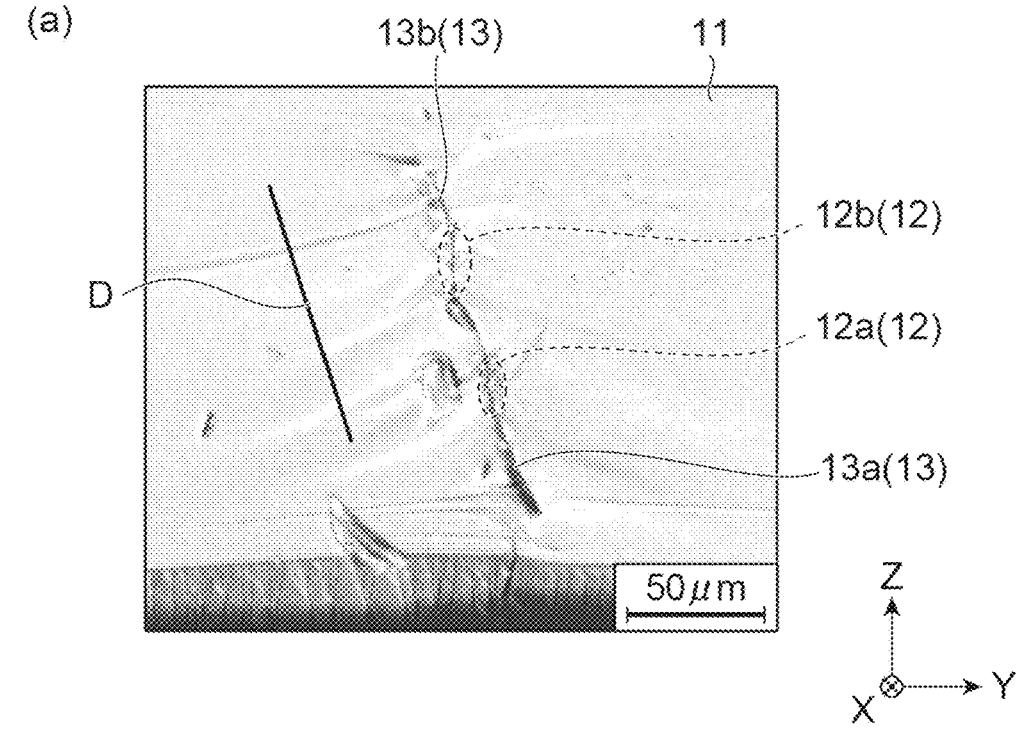
FIG. 12 is a cross-sectional photograph illustrating a state of inclined fracture formation.
Figure 12:
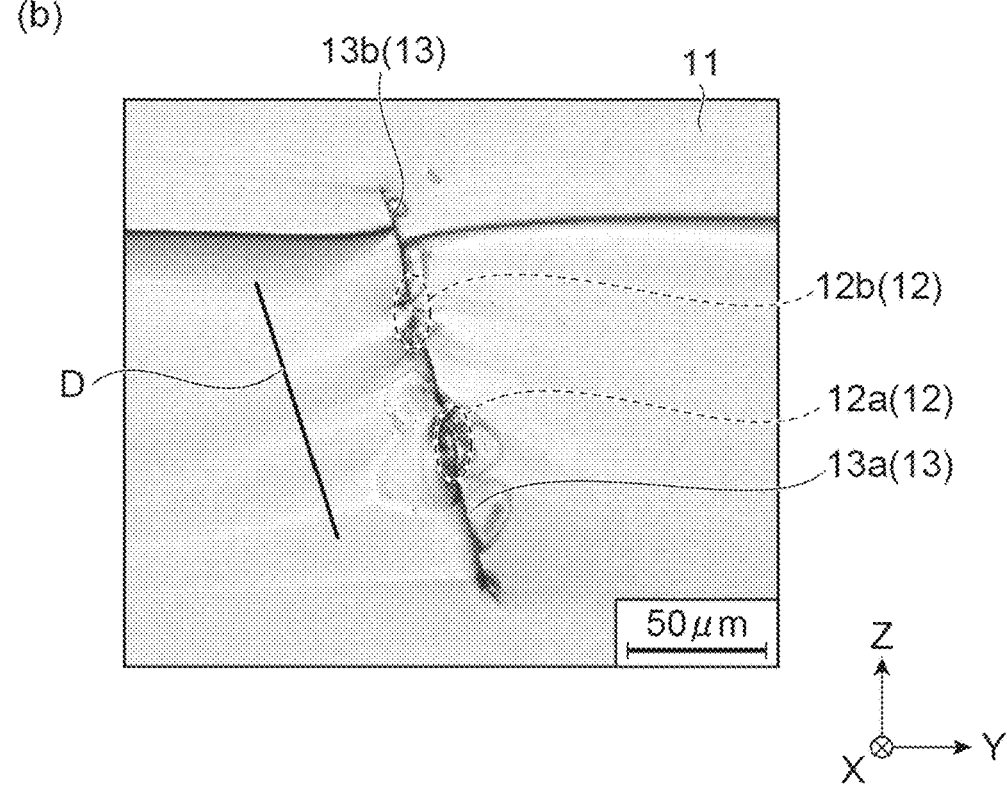

As illustrated in FIGS. 11 and 12, the fracture 13 can be formed along the line D inclined at 71° with respect to the Y direction in any case. That is, the fracture 13 extended obliquely along the desired line D can be formed regardless of the influence of the (110) plane, the (111) plane, the (100) plane, and the like that are the main cleavage planes of the object 11, that is, regardless of the crystal structure of the object 11.

Figure 13:
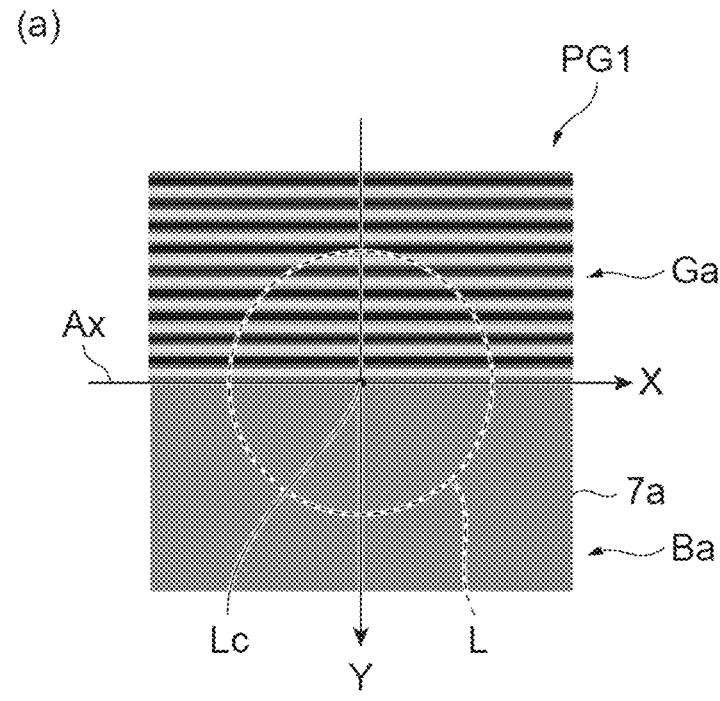
FIG. 13 is a view illustrating an example of the modulation pattern.
Figure 13:
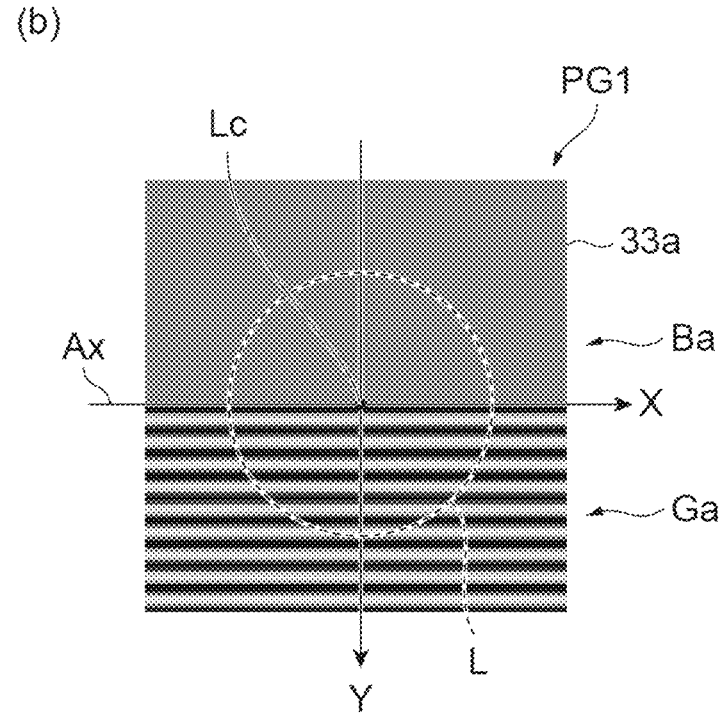

The control of the beam shape for forming the obliquely extended fracture 13 in this manner is not limited to the above example. Next, another example for forming the beam shape into an inclined shape will be described. As illustrated in FIG. 13(a), the laser light L may be modulated by a modulation pattern PG1 that is asymmetric with respect to an axis Ax along the X direction that is the processing forward direction to form the beam shape of the converging spot C into an inclined shape. The modulation pattern PG1 includes a grating pattern Ga on the negative side in the Y direction with respect to the axis Ax along the X direction passing through the center Lc of the beam spot of the laser light L in the Y direction, and includes a non-modulation area Ba on the positive side in the Y direction with respect to the axis Ax. In other words, the modulation pattern PG1 includes the grating pattern Ga only on the positive side in the Y direction with respect to the axis Ax. Note that FIG. 13(b) is a view obtained by inverting the modulation pattern PG1 of FIG. 13(a) so as to correspond to the entrance pupil plane 33a of the converging lens 33.

Figure 14:
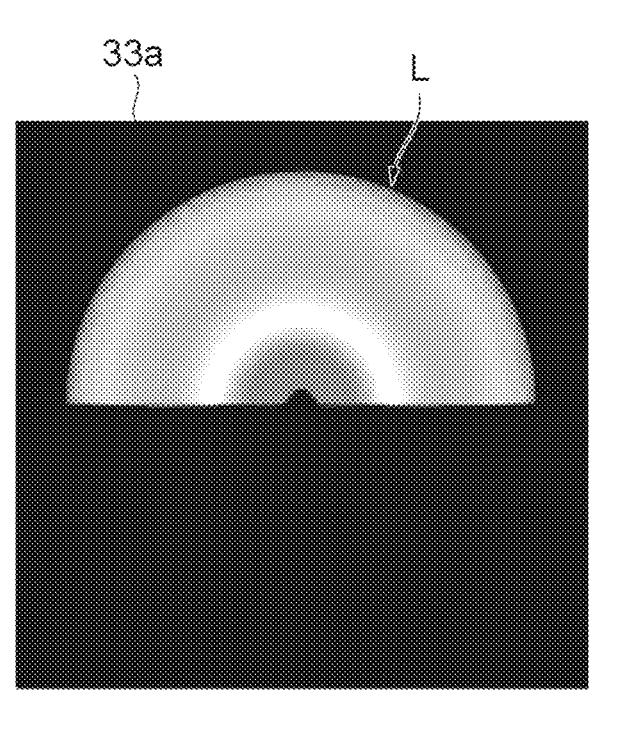
FIG. 14 is a view illustrating an intensity distribution on an entrance pupil plane of a converging lens and a beam shape of the converging spot.
Figure 14:
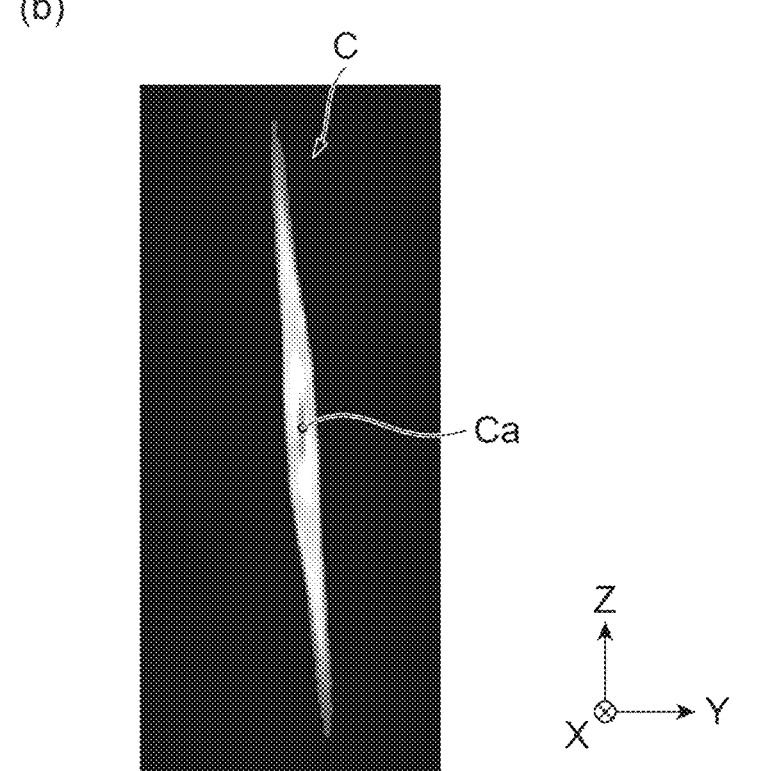

FIG. 14(a) illustrates an intensity distribution of the laser light L on the entrance pupil plane 33a of the converging lens 33. As illustrated in FIG. 14(a), a portion modulated by the grating pattern Ga of the laser light L incident on the space light modulator 7 is not incident on the entrance pupil plane 33a of the converging lens 33 by using the modulation pattern PG1. As a result, as illustrated in FIG. 14(b) and FIG. 15, the beam shape of the converging spot C in the YZ plane E can be an inclined shape that is entirely inclined in one direction with respect to the Z direction.

That is, in this case, the beam shape of the converging spot C is inclined to the negative side in the Y direction with respect to the Z direction on the first surface 11a side with respect to the center Ca of the converging spot C, and is inclined to the positive side in the Y direction with respect to the Z direction on the side opposite to the first surface 11a with respect to the center Ca of the converging spot C. Each view in FIG. 15(b) illustrates an intensity distribution in an XY plane of the laser light L at each of the positions F1 to F7 in the Z direction illustrated in FIG. 15(a), and is an actual observation result by a camera. The obliquely extended fracture 13 can be formed also when the beam shape of the converging spot C is controlled in this manner, as in the above example.

Figure 16:
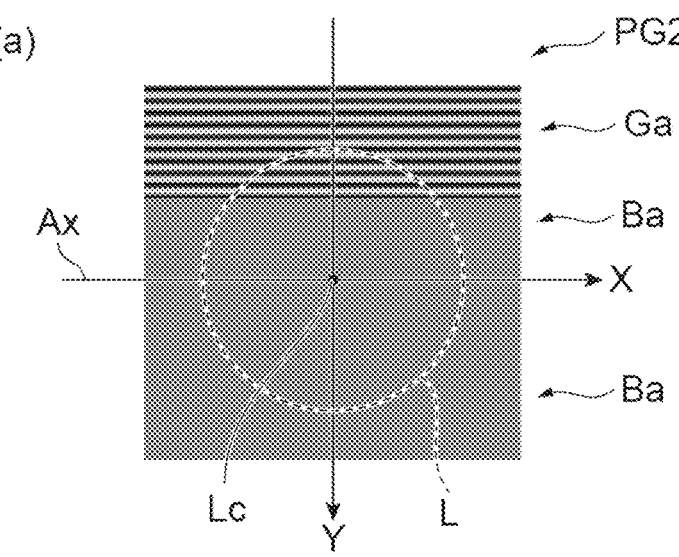
FIG. 16 is a view illustrating an example of the modulation pattern.
Figure 16:
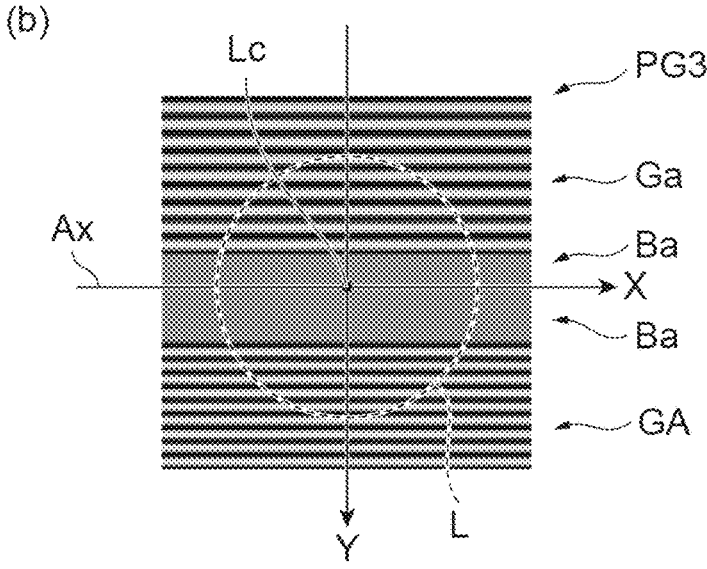
Figure 16:
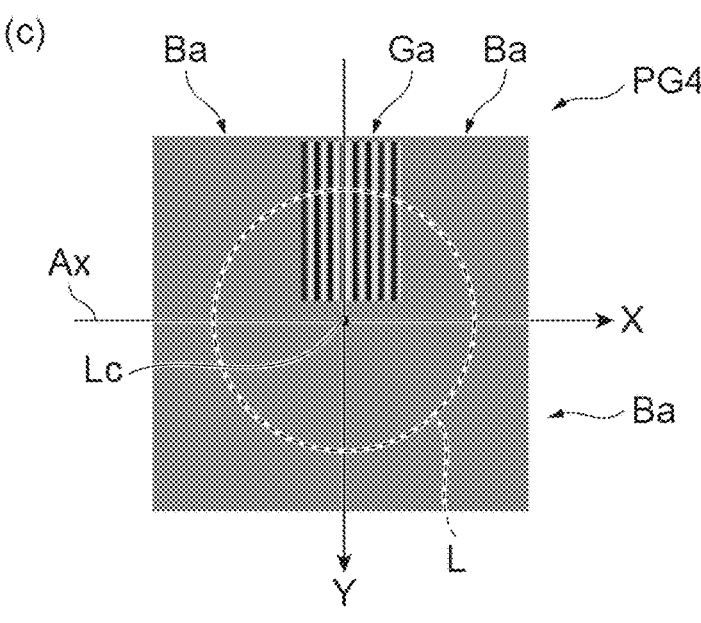

Further, modulation patterns PG2, PG3, and PG4 illustrated in FIG. 16 can also be adopted as modulation patterns asymmetric with respect to the axis Ax. The modulation pattern PG2 includes the non-modulation area Ba and the grating pattern Ga that are sequentially arrayed in a direction away from the axis Ax on the negative side in the Y direction with respect to the axis Ax, and includes the non-modulation area Ba on the positive side in the Y direction with respect to the axis Ax. That is, the modulation pattern PG2 includes the grating pattern Ga on a part of an area on the negative side in the Y direction with respect to the axis Ax.

The modulation pattern PG3 includes the non-modulation area Ba and the grating pattern Ga that are sequentially arrayed in a direction away from the axis Ax on the negative side in the Y direction with respect to the axis AX, and includes the non-modulation area Ba and the grating pattern Ga that are sequentially arrayed in a direction away from the axis Ax also on the positive side in the Y direction with respect to the axis Ax. The modulation pattern PG3 is formed by making the ratio of the non-modulation area Ba and the grating pattern Ga different between the positive side in the Y direction and the negative side in the Y direction with respect to the axis Ax (making the non-modulation area Ba relatively narrow on the negative side in the Y direction), and thus the modulation pattern PG3 is asymmetric with respect to the axis Ax.

The modulation pattern PG4 includes the grating pattern Ga on a part of an area on the negative side in the Y direction with respect to the axis Ax, as in the modulation pattern PG2. In the modulation pattern PG4, an area provided with the grating pattern Ga is partial also in the X direction. That is, the modulation pattern PG4 includes the non-modulation area Ba, the grating pattern Ga, and the non-modulation area Ba that are sequentially arrayed in the X direction in an area on the negative side in the Y direction with respect to the axis Ax. Here, the grating pattern Ga is arranged in an area including an axis Ay along the Y direction passing through the center Lc of the beam spot of the laser light L in the X direction.

With any of the modulation patterns PG2 to PG4 described above, the beam shape of the converging spot C can be an inclined shape that is inclined to the negative side in the Y direction with respect to the Z direction at least on the first surface 11a side with respect to the center Ca. That is, an asymmetric modulation pattern including the grating pattern Ga, such as the modulation patterns PG1 to PG4 and modulation patterns not limited to the modulation patterns PG1 to PG4 can be used to control the beam shape of the converging spot C to be inclined to the negative side in the Y direction with respect to the Z direction at least on the first surface 11a side with respect to the center Ca.

Figure 17:
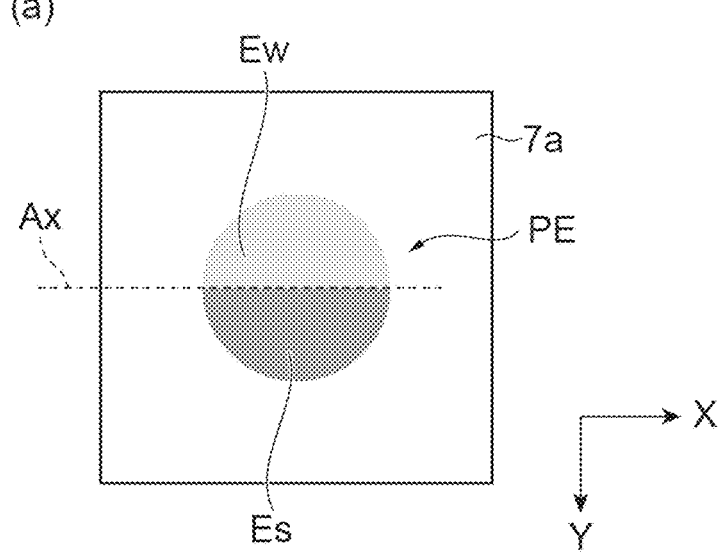
FIG. 17 is a view illustrating another example of an asymmetric modulation pattern.
Figure 17:
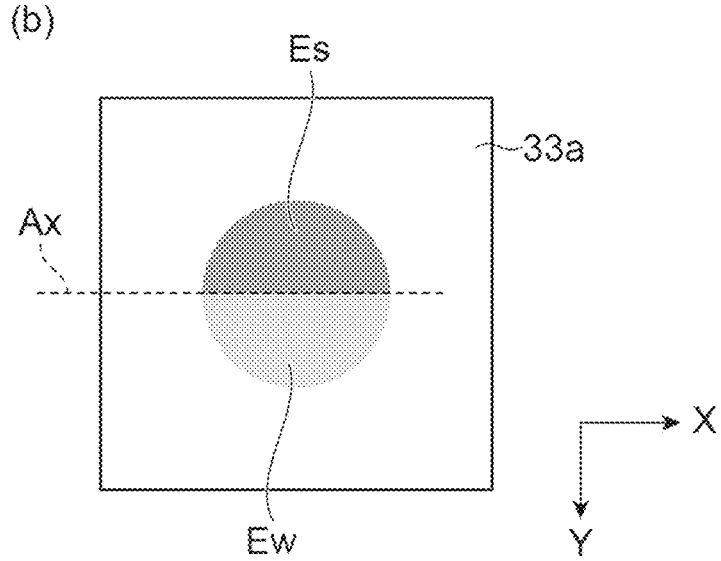
Figure 17:
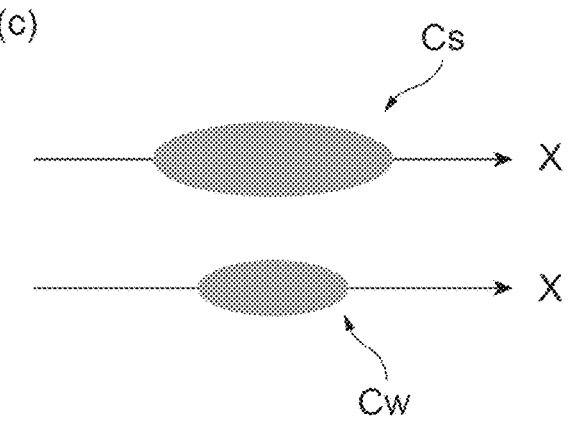

Further, the asymmetric modulation pattern for forming the beam shape of the converging spot C into an inclined shape is not limited to the pattern using the grating pattern Ga. FIG. 17 is a view illustrating another example of the asymmetric modulation pattern. As illustrated in FIG. 17(a), a modulation pattern PE includes an elliptical pattern Ew on the negative side in the Y direction with respect to the axis Ax and includes an elliptical pattern Es on the positive side in the Y direction with respect to the axis Ax. FIG. 17(b) is a view obtained by inverting the modulation pattern PE of FIG. 17(a) so as to correspond to the entrance pupil plane 33a of the converging lens 33.

As illustrated in FIG. 17(c), each of the elliptical patterns Ew and Es is a pattern for forming the beam shape of the converging spot C in the XY plane including the X direction and the Y direction into an elliptical shape having the X direction as a longitudinal direction. However, the intensity of modulation is different between the elliptical pattern Ew and the elliptical pattern Es. More specifically, the intensity of modulation by the elliptical pattern Es is made higher than the intensity of modulation by the elliptical pattern Ew. That is, the converging spot Cs formed by the laser light L modulated by the elliptical pattern Es has an elliptical shape longer in the X direction than the converging spot Cw formed by the laser light L modulated by the elliptical pattern Ew. Here, the elliptical pattern Es with relatively high intensity is arranged on the negative side in the Y direction with respect to the axis Ax.

Figure 18:
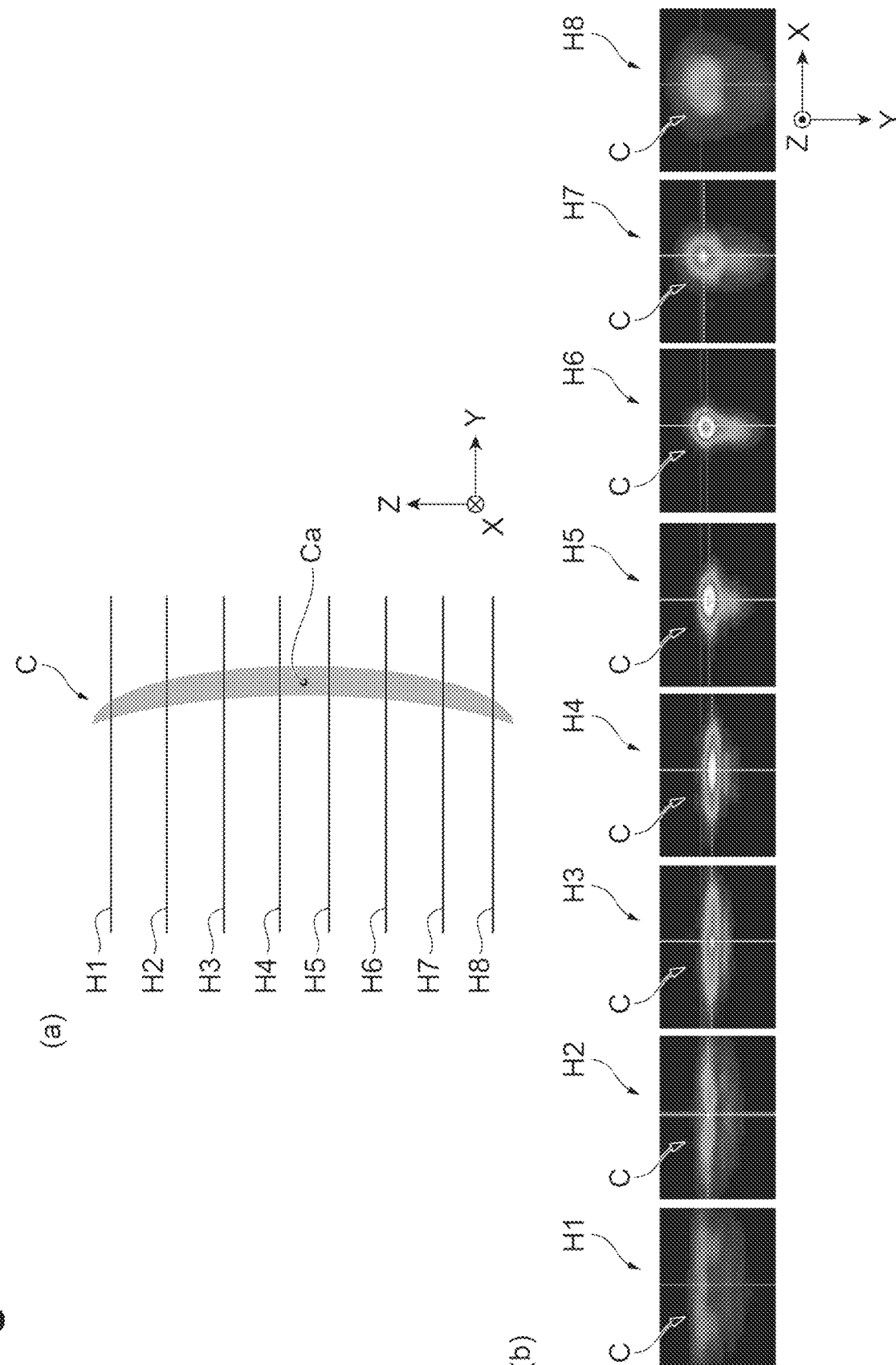
FIG. 18 is a view illustrating an intensity distribution on the entrance pupil plane of the converging lens and the beam shape of the converging spot.

As illustrated in FIG. 18(*a*), the beam shape of the converging spot C in the YZ plane E can be an inclined shape that is inclined to the negative side in the Y direction with respect to the Z direction on the first surface 11*a* side with respect to the center Ca by using the modulation pattern PE. Particularly in this case, the beam shape of the converging spot C in the YZ plane E is inclined to the negative side in the Y direction with respect to the Z direction also on the side opposite to the first surface 11*a* with respect to the center Ca, and thus the beam shape is entirely arcuate. Each view in FIG. 18(*b*) illustrates an intensity distribution in the XY plane of the laser light L at each of the positions H1 to F8 in the Z direction illustrated in FIG. 18(*a*), and is an actual observation result by the camera.

Figure 19:
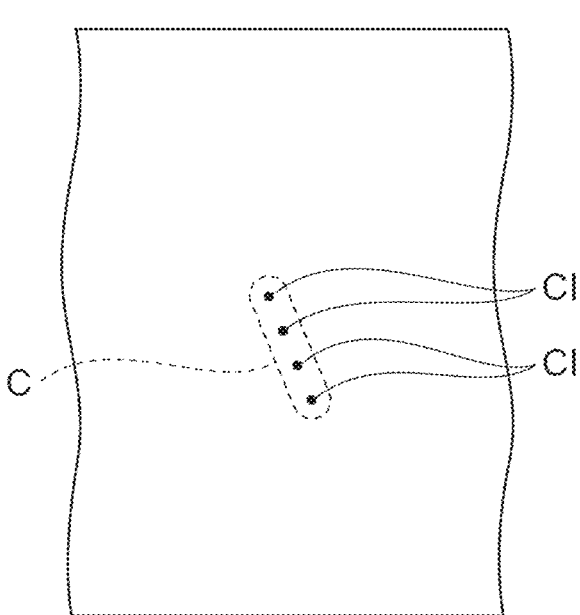
FIG. 19 is a view illustrating an example of the modulation pattern and converging spot formation.
Figure 19:
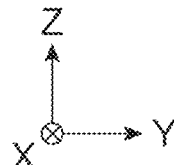

Further, the modulation pattern for forming the beam shape of the converging spot C into an inclined shape is not limited to the asymmetric pattern described above. An example of such a modulation pattern is, as illustrated in FIG. 19, a pattern for modulating the laser light L so as to form converging points CI at a plurality of positions in the YZ plane E and form the converging spot C having an inclined shape (including the plurality of converging points CI) entirely from the plurality of converging points CI. Such a modulation pattern can be formed, for example, based on an axicon lens pattern. When the modulation pattern is used, the modified region 12 itself can also be formed obliquely in the YZ plane E. Therefore, in this case, the inclined fracture 13 can be accurately formed according to a desired inclination. On the other hand, when the modulation pattern is used, the length of the fracture 13 tends to be shorter as compared with the other examples described above. Therefore, desired processing can be performed by selectively using various modulation patterns according to a request.

The converging point CI is, for example, a point where non-modulated laser light is converged. As described above, according to knowledge of the present inventor, it is possible to form the fracture 13 obliquely extended so as to be inclined in the Y direction with respect to the Z direction by shifting at least two modified regions 12*a* and 12*b* from each other in the Y direction and the Z direction in the YZ plane E and forming the beam shape of the converging spot C into an inclined shape in the YZ plane.

In the cases where the offset of the spherical aberration correction pattern is used, the coma aberration pattern is used, and the elliptical pattern is used to control the beam shape, processing with high energy can be performed as compared with the case where the diffraction grating pattern is used to cut a part of the laser light. In addition, these cases are effective when emphasis is placed on the formation of the fracture. When the coma aberration pattern is used, the beam shape of only some of the converging spots can be inclined in the case of multifocal processing. Further, when the axicon lens pattern is used, the use of other patterns is effective in a case where emphasis is placed on the formation of the modified region as compared with other patterns.

First Embodiment

Figure 20:
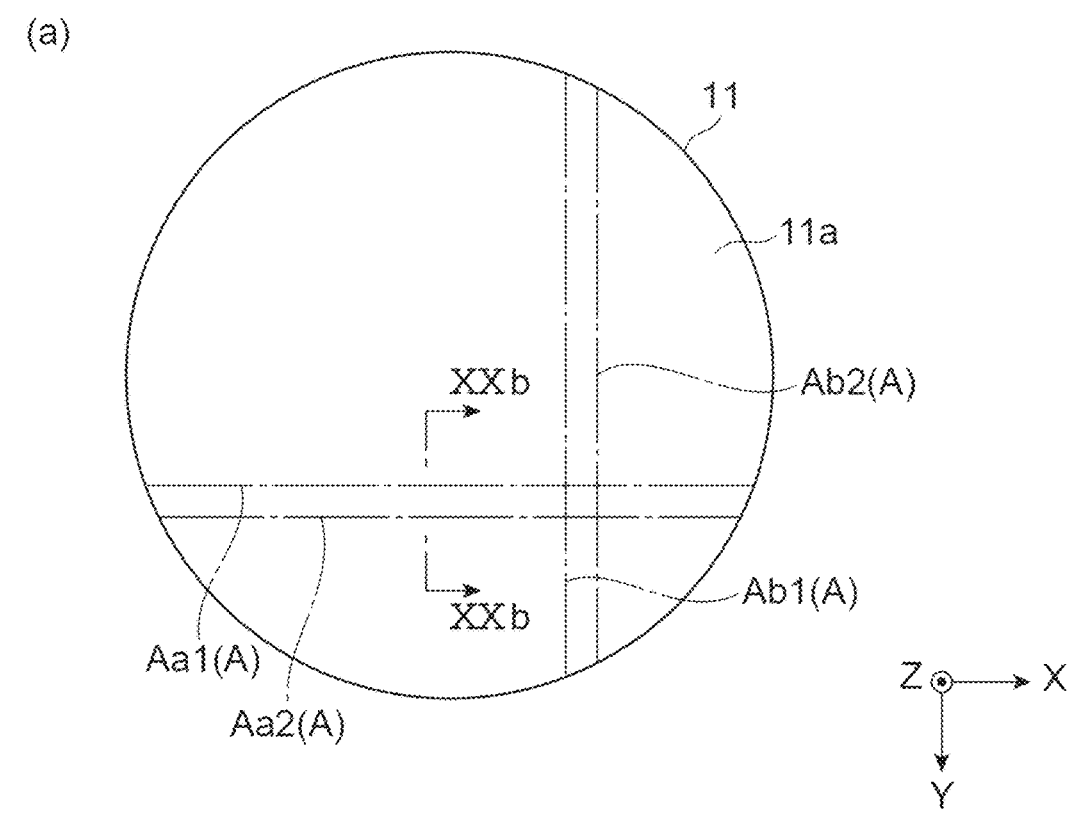
FIG. 20 is a view illustrating an object according to a first embodiment.
Figure 20:
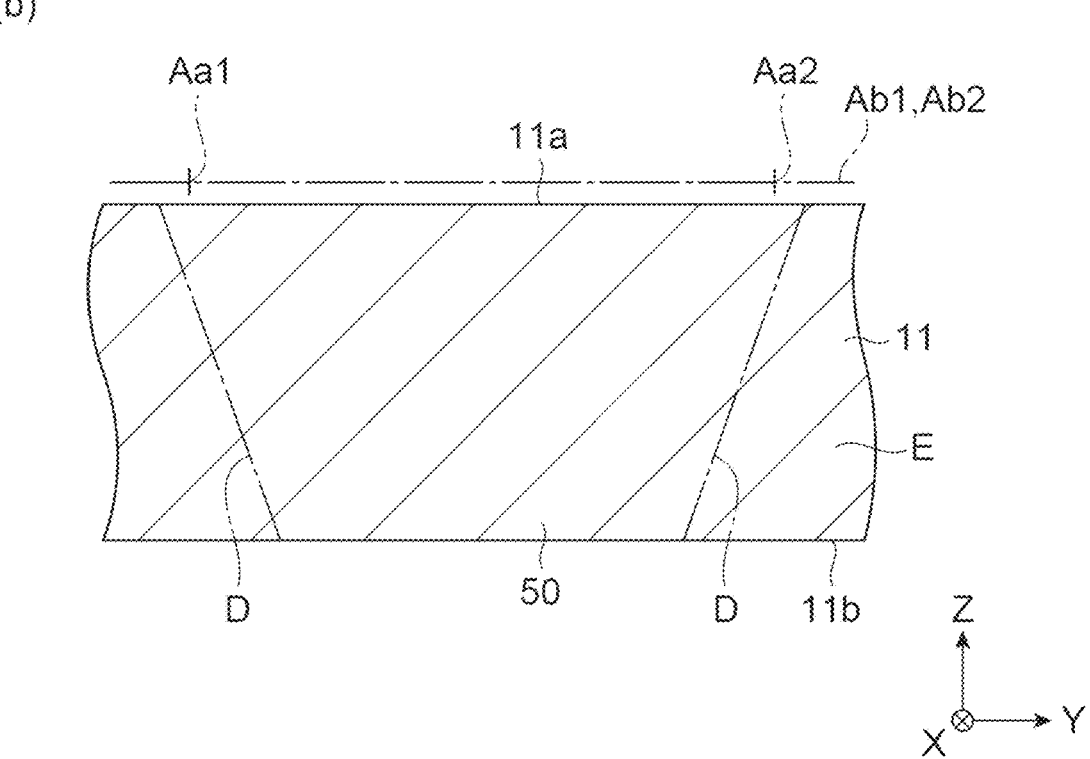

Next, a method for manufacturing a semiconductor member and a laser processing device according to a first embodiment will be described. First, an outline will be described. FIG. 20 is a view illustrating an object according to the first embodiment. FIG. 20(*a*) is a plan view, and FIG. 20(*b*) is a cross-sectional view taken along line XXb-XXb in FIG. 20(*a*). The object 11 illustrated in FIG. 20 includes, for example, a semiconductor. The object 11 is, for example, a semiconductor wafer (e.g., a silicon wafer). The object 11 includes a first surface 11*a* and a second surface 11*b* opposite to the first surface 11*a*. Here, a plurality of semiconductor members 50 are formed by cutting the object 11 into a lattice shape. For this purpose, a plurality of lines A parallel to the first surface 11*a* and the second surface 11*b* are set in a lattice shape as planned lines of cutting in the object 11. The lines A are, for example, virtual lines.

Here, a pair of lines Aa1 and Aa2 and a pair of lines Ab1 and Ab2 of the lines A are illustrated. The lines Aa1 and Aa2 are extended in one direction parallel to each other when viewed from the Z direction. The lines Ab1 and Ab2 intersect with the lines Aa1 and Aa2 are extended in one direction parallel to each other when viewed from the Z direction. Here, the object 11 is supported by the stage 2 such that the first surface 11*a* faces the converging lens 33 side.

In the present embodiment, the modified region 12 and the fracture 13 are formed along each of the lines A by irradiating the object 11 with the laser light L while relatively moving the converging spot C of the laser light L along each of the lines A. At this time, the converging spot C is relatively moved in the X direction. That is, here, the X direction is defined as a processing forward direction. In the present embodiment, the fracture 13 that is inclined in the Y direction with respect to the Z direction is formed in an intersecting plane (YZ plane E) intersecting with (orthogonal to) the X direction that is the processing forward direction. In FIG. 20(*b*), a desired direction in which the fracture 13 is extended is indicated by a line D. The lines D adjacent to each other in the YZ plane E are inclined so as to get away from each other as they go from the second surface 11*b* toward the first surface 11*a*. That is, in the present embodiment, the fractures 13 adjacent to each other in the Y direction are formed obliquely so as to get away from each other as they go from the second surface 11*b* toward the first surface 11*a*.

Next, the method for manufacturing a semiconductor member and the laser processing device according to the present embodiment will be specifically described. In this manufacturing method, first, the object 11 as described above is prepared, and the object 11 is supported by the stage 2 such that the first surface 11*a* faces the converging lens 33 side and the lines Aa1 and Aa2 go along the X direction.

In this state, first, a laser processing step is performed on one line Aa1 of converging the laser light L (laser light L1 and L2) in the object 11 to form the converging spot C (converging spots C1 and C2) of the laser light L, while relatively moving the converging spot C with respect to the object 11 in the X direction, thereby performing laser processing in the object 11.

Figure 21:
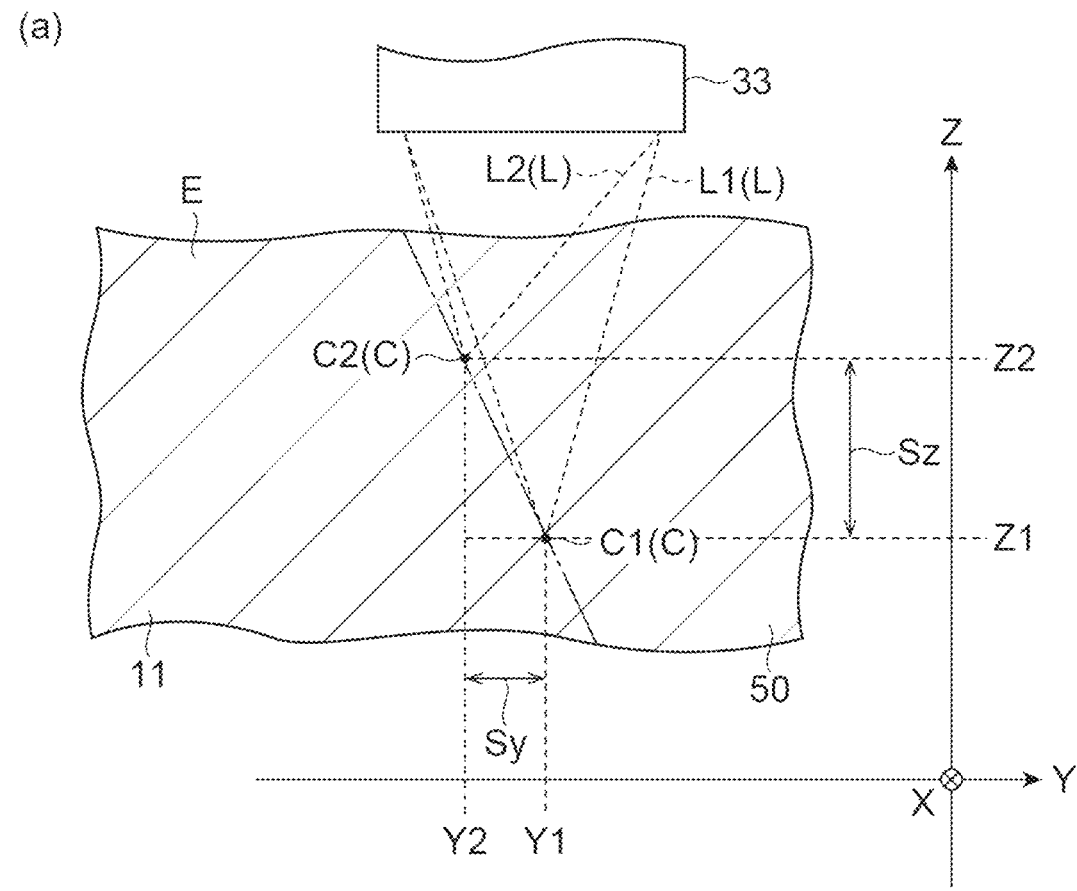
FIG. 21 is a view illustrating a laser processing step according to the first embodiment.
Figure 21:
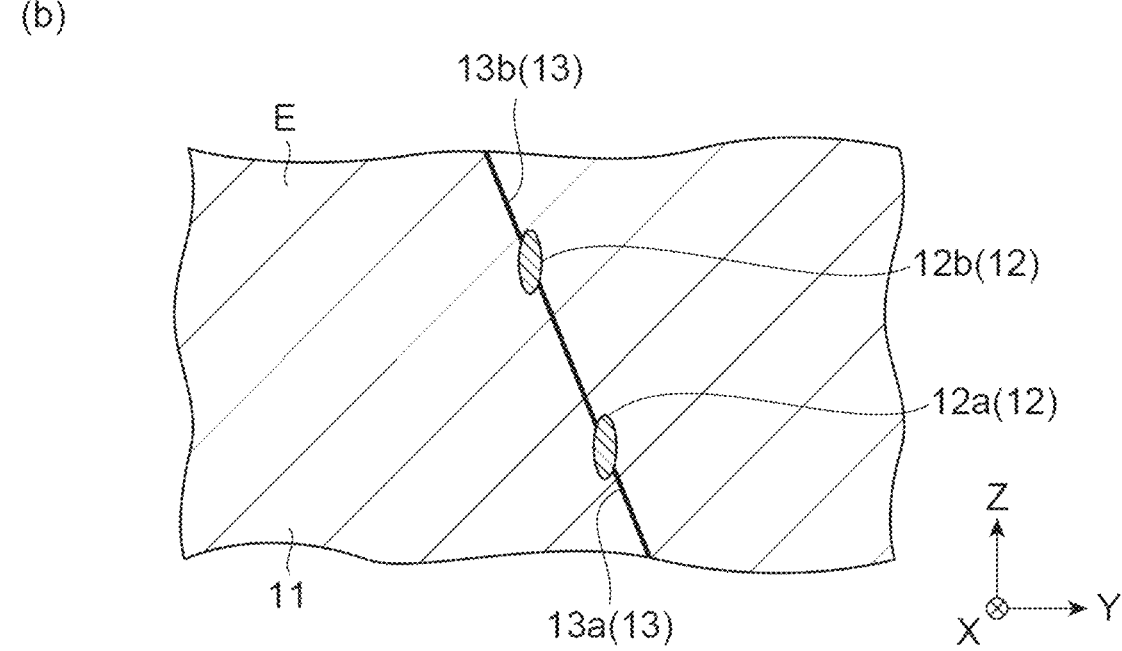

More specifically, in the laser processing step, as illustrated in FIG. 21, a first forming step is performed of relatively moving the converging spot C1 along the line Aa1 extended in the X direction while setting a position of the converging spot C1 in the Z direction intersecting with the first surface 11*a* that is the incident surface of the laser light L1 in the object 11 at a first Z position Z1, thereby forming the modified region 12*a* and the fracture 13*a* extended from the modified region 12*a* in the object 11. In the first forming step, a position of the converging spot C1 in the Y direction along the first surface 11*a* intersecting with the X direction is set at a first Y position Y1.

In addition, in the laser processing step, a second forming step is performed of relatively moving the converging spot C2 along the line Aa1 in the X direction while setting a position of the converging spot C2 of the laser light L2 in the Z direction at a second Z position Z2 that is closer to the first surface 11a (incident surface) than the first Z position Z1 of the converging spot C1 in the first forming step, thereby forming the modified region 12b and the fracture 13b extended from the modified region 12b. In the second forming step, a position of the converging spot C2 in the Y direction is set at a second Y position Y2 shifted from the first Y position Y1 of the converging spot C1. In addition, in the second forming step, the laser light L2 is modulated such that the beam shape of the converging spot C2 in the YZ plane E including the Y direction and the Z direction has an inclined shape that is inclined in the direction of the shift at least on the first surface 11a side with respect to the center of the converging spot C2. Thus, the fracture 13b is formed so as to be inclined in the direction of the shift in the YZ plane E. Note that a distance Sy (shift amount) between the converging spot C1 and the converging spot C2 in the Y direction is smaller than an interval in the Y direction between the two lines Aa1 and Aa2 adjacent in the Y direction.

Here, in the first forming step as well as the second forming step, the laser light L1 is modulated such that the beam shape of the converging spot C1 in the YZ plane E including the Y direction and the Z direction has an inclined shape that is inclined in the direction of the shift at least on the first surface 11a side with respect to the center of the converging spot C1. As described above, the fracture 13a and the fracture 13b are connected, and the fracture 13 extended obliquely through the modified regions 12a and 12b is formed. The fracture 13 may or may not reach the first surface 11a and/or the second surface 11b of the object 11 (the reaching condition may be appropriately set according to a required processing mode).

The laser processing steps including the first forming step and the second forming step can be performed, for example, by the control unit 6 of the laser processing device 1 controlling each unit of the laser processing device 1. That is, in the laser processing device 1 according to the present embodiment, the control unit 6 controls the space light modulator 7 and the drive units 4 and 5 to perform a first forming process of relatively moving the converging spot C1 along the line Aa1 extended in the X direction while setting the position of the converging spot C1 in the Z direction at the first Z position Z1, thereby forming the modified region 12a and the fracture 13a in the object 11, and a second forming process of relatively moving the converging spot C2 along the line Aa1 while setting the position of the converging spot C2 in the Z direction at the second Z position Z2 that is closer to the first surface 11a than the first Z position Z1, thereby forming the modified region 12b and the fracture 13b.

In addition, in the first forming process, the control unit 6 sets the position of the converging spot C1 in the Y direction at the first Y position Y1. In the second forming process, the control unit 6 sets the position of the converging spot C2 in the Y direction at the second Y position Y2 shifted from the first Y position Y1, and modulates the laser light L2 such that the beam shape of the converging spot C2 in the YZ plane E has an inclined shape that is inclined in the direction of the shift at least on the first surface 11a side with respect to the center of the converging spot C2 by controlling the modulation pattern to be displayed on the space light modulator 7. In the first forming process as well as the second forming process, the control unit 6 modulates the laser light L1 such that the beam shape of the converging spot C1 in the YZ plane E including the Y direction and the Z direction has an inclined shape that is inclined in the direction of the shift at least on the first surface 11a side with respect to the center of the converging spot C1. Note that the modulation pattern for forming the beam shape into an inclined shape is as described above.

That is, the modulation pattern here may include a coma aberration pattern for imparting coma aberration to the laser light L, and at least in the second forming process, the control unit 6 can control the magnitude of the coma aberration by the coma aberration pattern, thereby performing first pattern control for forming the beam shape of the converging spot C2 into an inclined shape. As described above, imparting coma aberration to the laser light L is equivalent to offsetting a spherical aberration correction pattern.

Therefore, the modulation pattern here may include the spherical aberration correction pattern Ps for correcting the spherical aberration of the laser light L, and at least in the second forming process, the control unit 6 may offset the center Pc of the spherical aberration correction pattern Ps in the Y direction with respect to the center of the entrance pupil plane 33a of the converging lens 33, thereby performing second pattern control for forming the beam shape of the converging spot C2 into an inclined shape.

Alternatively, in the second forming process, the control unit 6 may cause a modulation pattern asymmetric with respect to the axis Ax along the X direction to be displayed on the space light modulator 7, thereby performing third pattern control for forming the beam shape of the converging spot C2 into an inclined shape. The modulation pattern asymmetric with respect to the axis Ax may be the modulation patterns PG1 to PG4 including the grating pattern Ga, or may be the modulation pattern PE including the elliptical patterns Es and Ew (or may include both).

That is, the modulation pattern here may include an elliptical patterns Es and Ew for forming the beam shape of the converging spot C in the XY plane into an elliptical shape having the X direction as a longitudinal side, and in the second forming process, the control unit 6 may cause the modulation pattern PE to be displayed on the space light modulator 7 such that the intensity of the elliptical patterns Es and Ew is asymmetric with respect to the axis Ax along the X direction, thereby performing fourth pattern control for forming the beam shape of the converging spot C2 into an inclined shape.

Further, in the second forming process, the control unit 6 may cause a modulation pattern (for example, an axicon lens pattern PA described above) for forming a plurality of converging spots C arrayed along the direction of the shift in the YZ plane E to be displayed on the space light modulator 7, thereby performing fifth pattern control for forming the beam shape of the converging spot C2 into an inclined shape. The various patterns described above may be arbitrarily combined and superimposed. That is, the control unit 6 can perform the first pattern control to the fifth pattern control by arbitrarily combining them.

The first forming step (first forming process) and the second forming step (second forming process) may be performed simultaneously (multifocal processing) or sequentially (single-pass processing). That is, the control unit 6 may perform the second forming process after performing the first forming process on one line A (for example, the line Aa1). Alternatively, the control unit 6 may simultaneously perform the first forming process and the second forming process on one line A (for example, the line Aa1) set in the object 11 by causing a modulation pattern including a branch pattern for branching the laser light L into the laser light L1 and L2 to be displayed on the space light modulator 7.

In the method for manufacturing a semiconductor member according to the present embodiment, the above-described laser processing step is performed for all the lines A. Thus, the modified region 12 and the fracture 13 are formed along all the lines A. Thereafter, in the method for manufacturing a semiconductor member according to the present embodiment, a separation step is performed of separating a part of the object 11 to form the semiconductor member 50 from the object 11.

Figure 22:
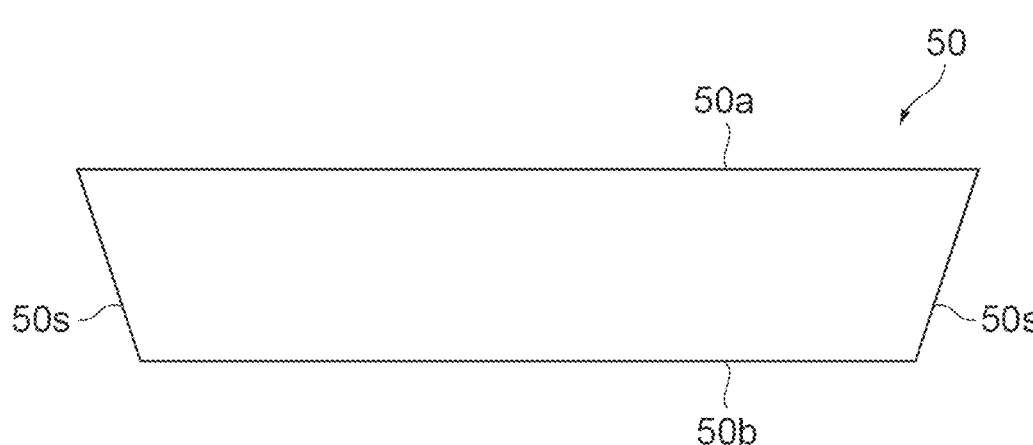
FIG. 22 is a view illustrating a semiconductor member obtained from the object.
Figure 22:
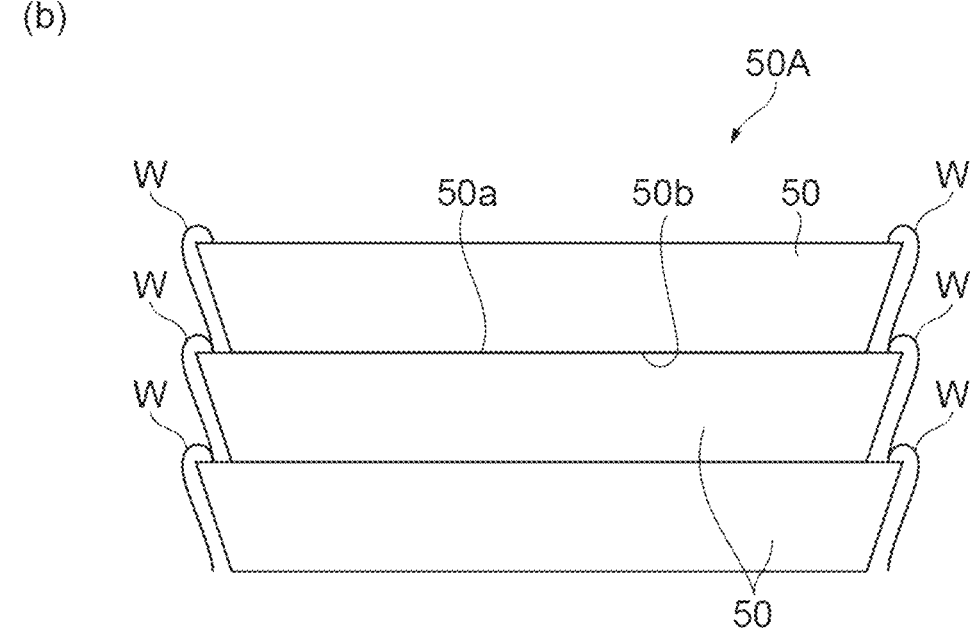

More specifically, in the separation step, the semiconductor member 50 including a side surface 50s that is an inclined surface defined at least by the fracture 13b is formed by separating a part of the object 11 using the fracture 13 as a boundary, as illustrated in FIG. 22(a). Here, a plurality of semiconductor members 50 are formed by cutting the object 11 along the line A using the fracture 13 as the boundary. The side surface 50s is an outer surface of the semiconductor member 50 and is a surface connecting a first surface 50a of the semiconductor member 50 that is a part of the first surface 11a and a second surface 50b of the semiconductor member 50 that is a part of the second surface 11b, and is inclined with respect to the normal line of the first surface 50a and the second surface 50b.

Thus, the semiconductor member 50 is obtained (see FIG. 22(a)). The above-described method for manufacturing a semiconductor member includes the laser processing method according to the present embodiment. The laser processing method according to the present embodiment includes the above-described laser processing step.

As illustrated in FIG. 22(b), the plurality of semiconductor members 50 obtained by the method for manufacturing a semiconductor member according to the present embodiment can be stacked such that the first surface 50a of one semiconductor member 50 and the second surface 50b of another semiconductor member 50 face each other to form a stacked semiconductor element 50A. Here, the area of the first surface 50a is larger than the area of the second surface 50b. Due to this, in the semiconductor element 50A, an area that is not covered by the second surface 50b of another semiconductor member 50 (exposed from the second surface 50b) is formed on the first surface 50a of one semiconductor member 50. Therefore, by using the area of the first surface 50a not covered by the second surface 50b as an installation location of a wire W for wire bonding, the semiconductor members 50 can be electrically connected to each other without using an internal structure such as a through electrode, for example.

Figure 23:
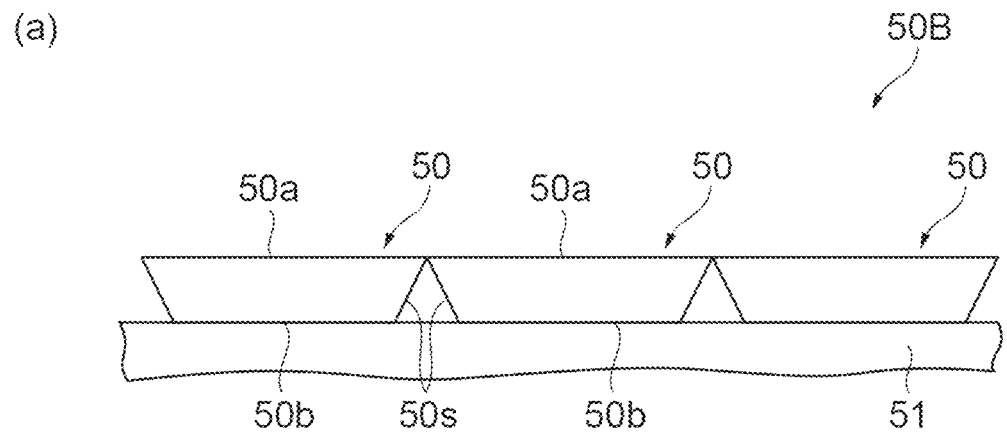
FIG. 23 is a view illustrating a semiconductor member obtained from the object.
Figure 23:
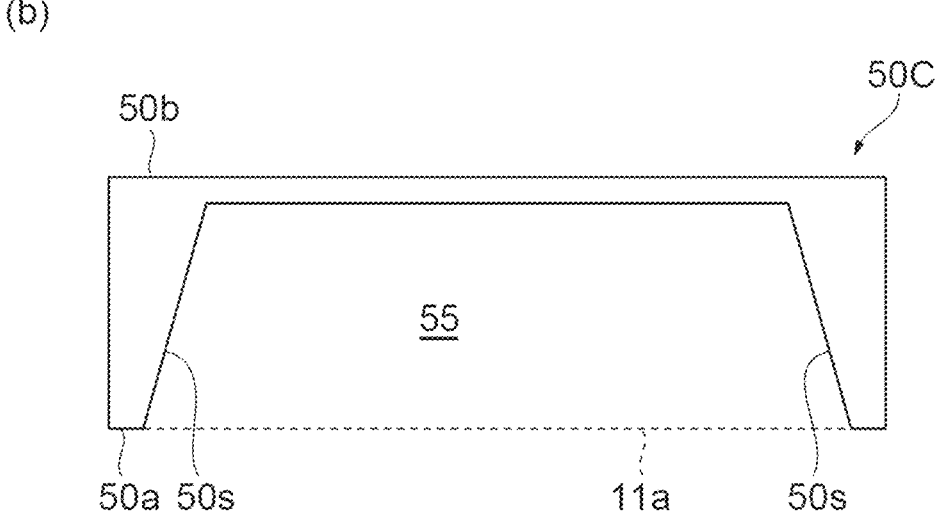
Figure 23:
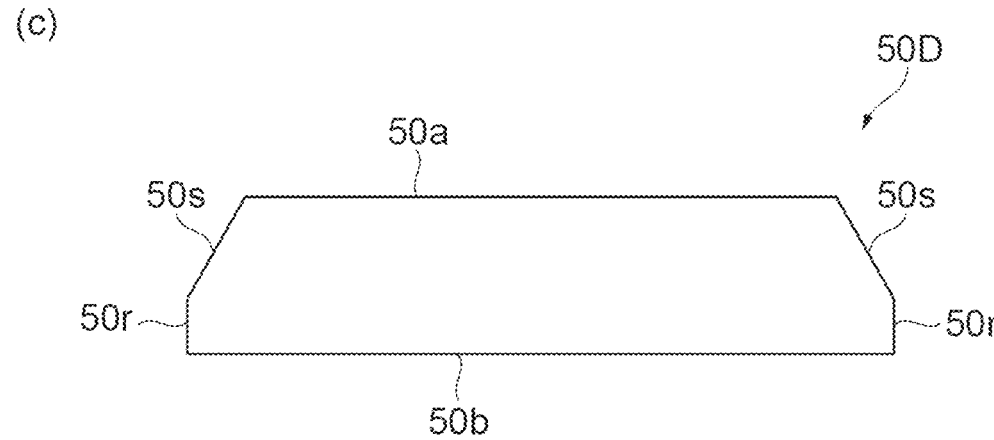

In addition, as illustrated in FIG. 23(a), for example, the plurality of semiconductor members 50 are arrayed and installed on a substrate 51 such that the first surface 50a faces in the same direction (by tiling), so that a semiconductor element 50B can be configured. In this case, since the side surfaces 50s of the adjacent semiconductor members 50 are apart from each other according to the inclination, the interference of the protrusion can be avoided between the adjacent semiconductor members 50 even when a protrusion is generated on the side surface 50s when the semiconductor member 50 is formed, and thus the plurality of semiconductor members 50 can be densely arranged.

Further, as illustrated in FIG. 23(b), a semiconductor member 50C may be formed as another remaining part by separating a part 55 from the object 11 in the separation step.

More specifically, in the separation step, etching is extended along the fracture 13 and the modified region 12 by etching the object 11, so that the part 55 can be removed from the object 11. As a result, the semiconductor member 50C including the side surface 50s that is the inner surface defined by the fracture 13 is obtained.

Further, as illustrated in FIG. 23(c), a chamfered semiconductor member 50D can also be formed. In this case, as an example, another modified region is formed on the first surface 11a side with respect to the modified region 12b and the fracture 13b in the laser processing step, thereby forming a vertical fracture extended along the Z direction from the another modified region so as to be connected to the fracture 13. Then, a part is separated from the object 11 using the fracture 13 and the vertical fracture as a boundary in the separation step, thereby obtaining the semiconductor member 50D including a side surface 50s that is an inclined surface defined by the fracture 13 and a side surface 50r that is a vertical surface defined by the vertical fracture. The semiconductor member 50D has a chamfered shape by the inclined side surface 50s being connected between the side surface 50r and the first surface 50a. This prevents chipping.

As described above, in the method for manufacturing a semiconductor member (laser processing method) and the laser processing device 1 according to the present embodiment, the converging spot C1 of the laser light L1 is relatively moved along the line Aa1 extended in the X direction at the first Z position Z1, thereby forming the modified region 12a and the fracture 13a. In addition, the converging spot C2 of the laser light L2 is relatively moved along the line Aa1 at the second Z position Z2 that is closer to the first surface 11a than the first Z position Z1, thereby forming the modified region 12b and the fracture 13b. The converging spot C1 is at the first Y position Y1 in the Y direction when the modified region 12a and the fracture 13a are formed, and is at the second Y position Y2 shifted from the first Y position Y1 in the Y direction when the modified region 12b and the fracture 13b are formed.

Further, when the modified region 12b and the fracture 13b are formed, the beam shape of the converging spot C2 in the YZ plane E is an inclined shape that is inclined in the shift direction of the converging spot C2 at least on the first surface 11a side with respect to the center of the converging spot C2. According to knowledge of the present inventor, at least the fracture 13b can be an inclined fracture inclined in the direction of the shift in the YZ plane E by shifting the converging spot C2 in the Y direction and controlling the beam shape of the converging spot C2. That is, an inclined fracture can be formed.

In the laser processing device 1 according to the present embodiment, in the first forming process, the control unit 6 may modulate the laser light L such that the beam shape of the converging spot C1 in the YZ plane E has an inclined shape that is inclined in the shift direction at least on the first surface 11a side with respect to the center of the converging spot C1, thereby forming the fracture 13a so as to be inclined in the shift direction in the YZ plane E. Therefore, it is possible to reliably form the fracture 13 extended obliquely through the modified region 12a and the modified region 12b.

In the laser processing device 1 according to the present embodiment, the modulation pattern may include a coma aberration pattern for imparting positive coma aberration to the laser light L. In this case, the control unit 6 may control the magnitude of the coma aberration by the coma aberration pattern in the second forming process, thereby performing the first pattern control for forming the beam shape of the converging spot C an inclined shape. According to knowledge of the present inventor, in this case, the beam shape of the converging spot C in the YZ plane E is formed into an arc shape. That is, in this case, the beam shape of the converging spot C is inclined in the shift direction on the first surface 11a side with respect to the center Ca of the converging spot C, and is inclined in the direction opposite to the shift direction on the second surface 11b side with respect to the center Ca of the converging spot C. It is possible to form an inclined fracture inclined in the shift direction also in this case.

In addition, in the laser processing device 1 according to the present embodiment, the modulation pattern may include the spherical aberration correction pattern Ps for correcting the spherical aberration of the laser light L. In this case, in the second forming process, the control unit 6 may offset the center Pc of the spherical aberration correction pattern Ps in the Y direction with respect to the center of the entrance pupil plane 33a of the converging lens 33, thereby performing the second pattern control for forming the beam shape of the converging spot C into an inclined shape. According to knowledge of the present inventor, also in this case, the beam shape of the converging spot C in the YZ plane E can be formed into an arc shape, and an inclined fracture inclined in the shift direction can be formed, as in the case where the coma aberration pattern is used.

In addition, in the laser processing device 1 according to the present embodiment, in the second forming process, the control unit 6 may cause a modulation pattern asymmetric with respect to the axis Ax along the X direction to be displayed on the space light modulator 7, thereby performing the third pattern control for forming the beam shape into an inclined shape. According to knowledge of the present inventor, in this case, the entire beam shape of the converging spot C in the YZ plane E can be inclined in the shift direction. It is possible to form an inclined fracture inclined in the shift direction also in this case. In addition, in the laser processing device 1 according to the present embodiment, the modulation pattern may include the elliptical patterns Es and Ew for forming the beam shape of the converging spot C in the XY plane including the X direction and the Y direction into an elliptical shape having the X direction as a longitudinal side. In this case, in the second forming process, the control unit 6 may cause a modulation pattern to be displayed on the space light modulator 7 such that the intensity of the elliptical patterns Es and Ew is asymmetric with respect to the axis Ax along the X direction, thereby performing the fourth pattern control for forming the beam shape of the converging spot C into an inclined shape. According to knowledge of the present inventor, also in this case, the beam shape of the converging spot C in the YZ plane E can be formed into an arc shape, and an inclined fracture inclined in the shift direction can be formed.

In addition, in the laser processing device 1 according to the present embodiment, in the second forming process, the control unit 6 may cause a modulation pattern for forming the plurality of converging points CI to be displayed on the space light modulator 7, thereby performing the fifth pattern control for forming the beam shape of the converging spot C including a plurality of converging points CI arrayed along the shift direction in the YZ plane E into an inclined shape. According to knowledge of the present inventor, it is possible to form an inclined fracture inclined in the shift direction also in this case.

In the laser processing device 1 according to the present embodiment, the control unit 6 may perform the second forming process after performing the first forming process on one line Aa1 set along the X direction in the object 11. An inclined fracture can be formed also when the first forming process and the second forming process are separately performed in this manner. Further, in the laser processing device 1, the control unit 6 may simultaneously perform the first forming process and the second forming process on one line Aa1 set in the object 11 by causing a modulation pattern including a branch pattern for branching the laser light L to be displayed on the space light modulator 7. An inclined fracture can be formed also when the first forming process and the second forming process are simultaneously performed in this manner.

Second Embodiment

Figure 24:
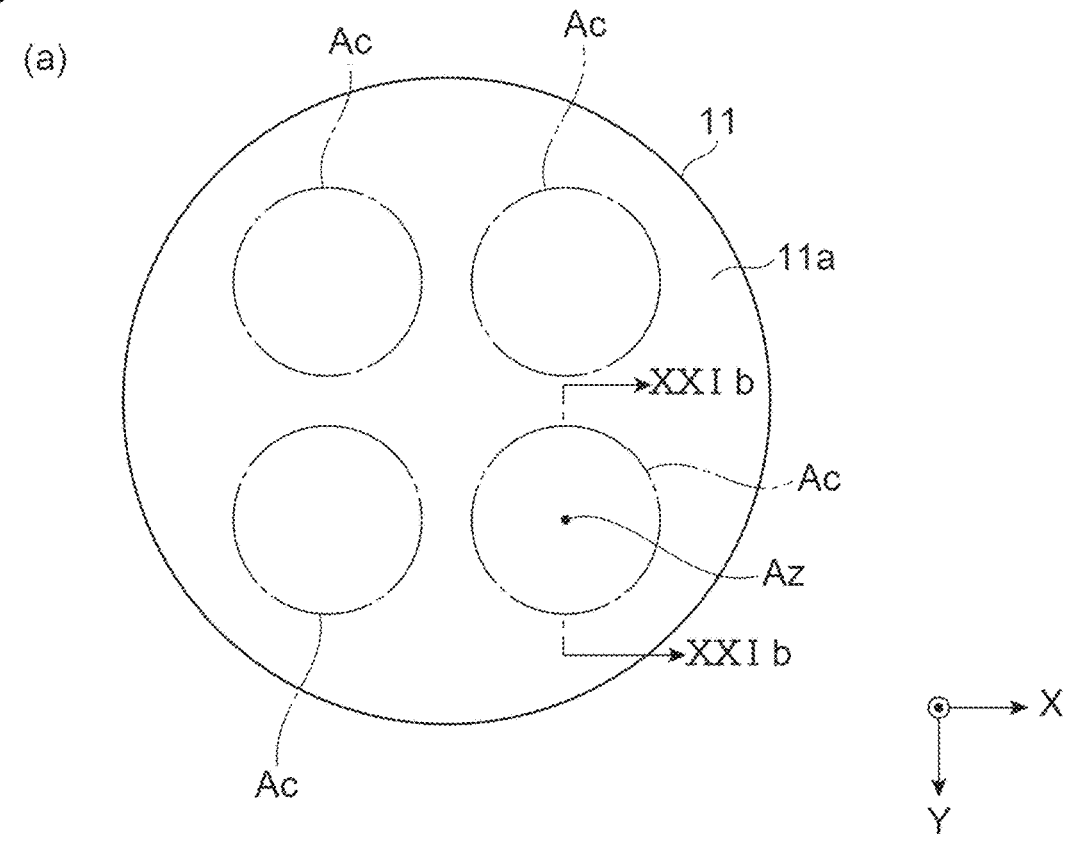
FIG. 24 is a view illustrating an object according to a second embodiment.
Figure 24:
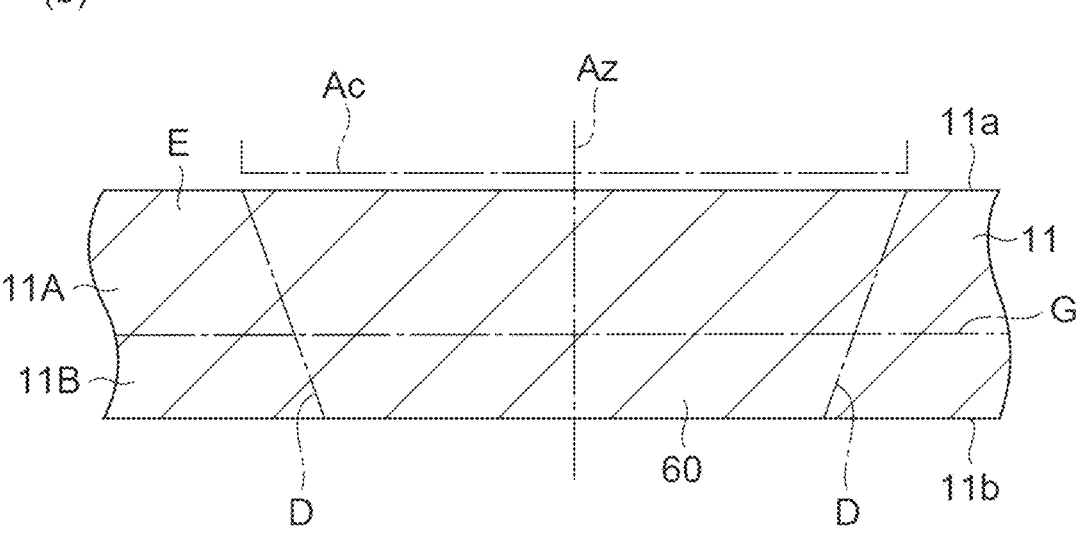
Figure 24:
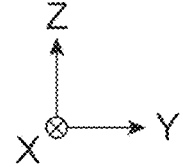

Next, a method for manufacturing a semiconductor member and a laser processing device according to a second embodiment will be described. First, an outline will be described. FIG. 24 is a view illustrating an object according to the second embodiment. FIG. 24(a) is a plan view, and FIG. 24(b) is a cross-sectional view taken along line XXIb-XXIb in FIG. 24(a). The object 11 illustrated in FIG. 24 includes, for example, a semiconductor. The object 11 is, for example, a semiconductor wafer (e.g., a silicon wafer). The object 11 includes a first surface 11a and a second surface 11b opposite to the first surface 11a. In addition the object 11 includes a first area 11A including the first surface 11a and a second area 11B including the second surface 11b.

A line G in the figure is a virtual line indicating a boundary between the first area 11A and the second area 11B. The first area 11A is a planned area of grinding along the first surface 11a. Here, a circular semiconductor member 60 is cut out from the object 11 (second area 11B). For this purpose, a plurality of lines Ac extended in a circular shape when viewed from the Z direction are set as planned lines of cutting in the object 11. The lines Ac are, for example, virtual lines.

As an example, the object 11 is supported by the stage 2 such that the first surface 11a faces the converging lens 33 side. In the present embodiment, the modified region 12 and the fracture 13 are formed along each of the lines Ac by irradiating the object 11 with the laser light L while relatively moving the converging spot C of the laser light L along each of the lines A. At this time, the converging spot C is relatively moved in the X direction. That is, here, the X direction is defined as a processing forward direction. In the present embodiment, the fracture 13 that is inclined in the Y direction with respect to the Z direction is formed in an intersecting plane (YZ plane E) intersecting with (orthogonal to) the X direction that is the processing forward direction.

In FIG. 24(b), a desired direction in which the fracture 13 is extended is indicated by a line D. The lines D adjacent to each other in the YZ plane E are inclined so as to get away from each other as they go from the second surface 11b toward the first surface 11a. That is, in the present embodiment, the fractures 13 adjacent to each other in the Y direction in the YZ plane E are formed obliquely so as to get away from each other as they go from the second surface 11b toward the first surface 11a. Further, in other words, in the present embodiment, the fracture 13 inclined with respect to the Z direction so as to get away from a reference line Az passing through the center of the line Ac (along the Z direction) as it goes from the second surface 11b toward the first surface 11a is formed in the YZ plane E.

Note that the inclination direction of the fracture may be inverse. That is, the lines D adjacent to each other in the YZ plane E may be inclined so as to approach each other as they go from the second surface 11b toward the first surface 11a. That is, the fractures 13 adjacent to each other in the Y direction in the YZ plane E may be formed obliquely so as to approach each other as they go from the second surface 11b toward the first surface 11a. Further, in other words, the fracture 13 inclined with respect to the Z direction so as to approach the reference line Az passing through the center of the line Ac (along the Z direction) while going from the second surface 11b toward the first surface 11a may be formed in the YZ plane E. These variations of the inclination direction can be arbitrarily selected according to a request regarding the shape, application, separation method, and the like of the semiconductor member to be obtained. For example, as described later (as illustrated in FIG. 26(c)), the variations may be appropriately selected depending on whether the obtained semiconductor member 60 is picked up from the first surface 11a (first surface 60a) side or the second surface 11b (second surface 60b) side.

Next, the method for manufacturing a semiconductor member and the laser processing device according to the present embodiment will be specifically described. In this method, first, the object 11 as described above is prepared, and the object 11 is supported by the stage 2 such that the first surface 11a faces the converging lens 33 side. In this state, first, a laser processing step (a first processing step) is performed on one line Ac of forming the converging spot C (converging spots C1 and C2) of the laser light L (laser light L1 and L2) in the object 11, while relatively moving the converging spot C along the line Ac with respect to the object 11, thereby forming the modified region 12 and the fracture 13 extended from the modified region 12 along the line Ac in the object 11.

Figure 25:
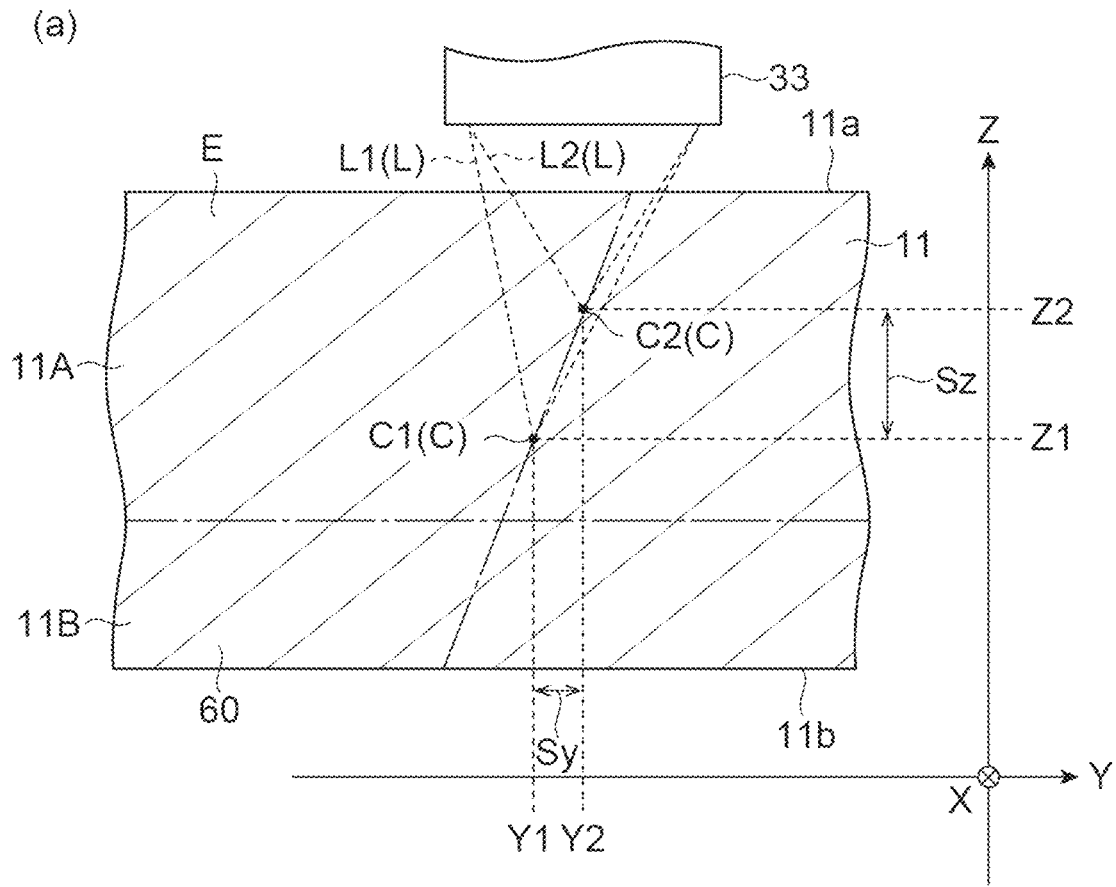
FIG. 25 is a view illustrating a laser processing step according to the second embodiment.
Figure 25:
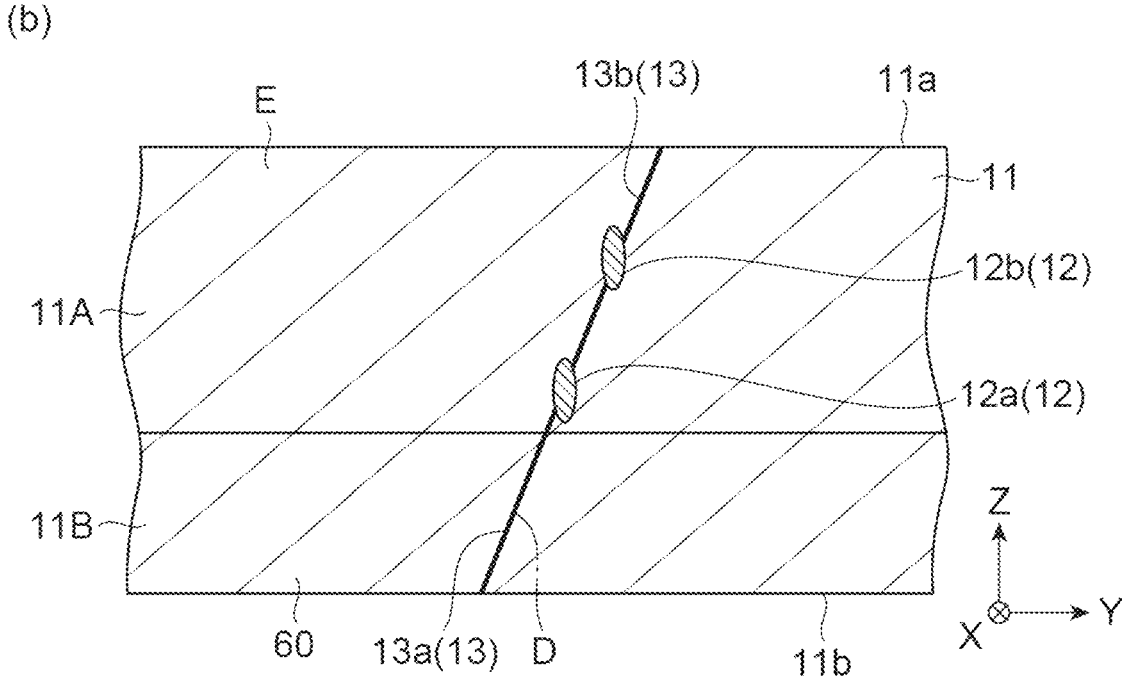

More specifically, in the laser processing step, as illustrated in FIG. 25, the first forming step is performed of relatively moving the converging spot C1 along the line Aa1 while setting a position of the converging spot C1 in the Z direction intersecting with the first surface 11a that is the incident surface of the laser light L1 in the object 11 at the first Z position Z1, thereby forming the modified region (first modified region and fourth modified region) 12a and the fracture (first fracture) 13a extended from the modified region 12a in the object 11. The first Z position Z1 is set in the first area 11A that is a planned area of grinding. In the first forming step, a position of the converging spot C1 in the Y direction along the first surface 11a intersecting with the X direction is set at a first Y position Y1.

In addition, in the laser processing step, the second forming step is performed of relatively moving the converging spot C2 along the line Ac in the X direction while setting a position of the converging spot C2 of the laser light L2 in the Z direction at the second Z position Z2 that is closer to the first surface 11a (incident surface) than the first Z position Z1 of the converging spot C1 in the first forming step, thereby forming the modified region (first modified region and fifth modified region) 12b and the fracture (first fracture) 13b extended from the modified region 12b. The second Z position Z2 is set in the first area 11A that is a planned area of grinding. In the second forming step, a position of the converging spot C2 in the Y direction is set at a second Y position Y2 shifted from the first Y position Y1 of the converging spot C1. In addition, in the second forming step, the laser light L2 is modulated such that the beam shape of the converging spot C2 in the YZ plane E has an inclined shape that is inclined in the direction of the shift at least on the first surface 11a side with respect to the center of the converging spot C2. Thus, the fracture 13b is formed so as to be inclined in the direction of the shift in the YZ plane E.

Here, in the first forming step as well as the second forming step, the laser light L1 is modulated such that the beam shape of the converging spot C1 in the YZ plane E has an inclined shape that is inclined in the direction of the shift at least on the first surface 11a side with respect to the center of the converging spot C1. As described above, the fracture 13a and the fracture 13b are connected, and the fracture 13 extended obliquely through the modified regions 12a and 12b is formed. In the illustrated example, the fracture 13 reaches the first surface 11a and the second surface 11b of the object 11, but may not reach them.

The laser processing step including the first forming step and the second forming step can be performed, for example, by the control unit 6 of the laser processing device 1 controlling each unit of the laser processing device 1, as in First Embodiment. That is, in the laser processing device 1 according to the present embodiment, the control unit 6 controls the space light modulator 7 and the drive units 4 and 5 to perform a first forming process of relatively moving the converging spot C1 along the line Ac while setting the position of the converging spot C1 in the Z direction at the first Z position Z1, thereby forming the modified region 12a and the fracture 13a in the object 11, and a second forming process of relatively moving the converging spot C2 along the line Ac while setting the position of the converging spot C2 in the Z direction at the second Z position Z2 that is closer to the first surface 11a than the first Z position Z1, thereby forming the modified region 12b and the fracture 13b.

In addition, in the first forming process, the control unit 6 sets the position of the converging spot C1 in the Y direction at the first Y position Y1. In the second forming process, the control unit 6 sets the position of the converging spot C2 in the Y direction at the second Y position Y2 shifted from the first Y position Y1, and modulates the laser light L2 such that the beam shape of the converging spot C2 in the YZ plane E has an inclined shape that is inclined in the direction of the shift at least on the first surface 11a side with respect to the center of the converging spot C2 by controlling the modulation pattern to be displayed on the space light modulator 7. Here, the control unit 6 similarly modulates the laser light L1 such that the beam shape of the converging spot C1 in the YZ plane E has an inclined shape that is inclined in the direction of the shift at least on the first surface 11a side with respect to the center of the converging spot C1. Note that the modulation pattern for forming the beam shape into an inclined shape is as described above.

The first forming step (first forming process) and the second forming step (second forming process) may be performed simultaneously (multifocal processing) or sequentially (single-pass processing). That is, the control unit 6 may perform the second forming process after performing the first forming process on one line Ac. Alternatively, the control unit 6 may simultaneously perform the first forming process and the second forming process on one line Ac set in the object 11 by causing a modulation pattern including a branch pattern for branching the laser light L into the laser light L1 and L2 to be displayed on the space light modulator 7.

To relatively move the converging spots C1 and C2 in the X direction, for example, the control unit 6 may control the drive unit 4 to move the stage 2 two-dimensionally so that the converging spots C1 and C2 move along the circular line Ac in a state in which the converging spots C1 and C2 are positioned on the line Ac when viewed from the Z direction.

Alternatively, the laser irradiation unit 3 may be moved by the control unit 6 controlling the drive unit 5 so that the converging spots C1 and C2 move along the line Ac, the control unit 6 may perform control to rotate the stage 2, or the control unit 6 may perform control in combination thereof.

When processing is performed by relatively moving the converging spots C1 and C2 along the circular line Ac in this manner, it is possible to perform control so as to rotate the converging spots C1 and C2 such that the converging spots C1 and C2 are elongated in the XY plane while the longitudinal direction of the converging spots C1 and C2 is inclined with respect to the X direction that is the processing forward direction. As an example, the converging spots C1 and C2 can be rotated such that the angle between the longitudinal direction and the X direction is a first angle (+10° to +35°) in the XY plane and can be rotated such that the angle is a second angle (−35° to −10°). Whether to use the first angle or the second angle can be selected according to the relationship between the line Ac and the crystal orientation of the object 11. In this case, in the space light modulator 7, the modulation pattern for forming the beam shape in the YZ plane into an inclined shape as described above and the pattern for forming the beam shape in the XY plane into an elongated shape are superimposed.

In the method for manufacturing a semiconductor member according to the present embodiment, the above-described laser processing step is performed for all the lines Ac. Thus, the modified region 12 and the fracture 13 are formed along all the lines Ac. That is, here, in the laser processing step, the modified region 12 and the fracture 13 are formed along each of the plurality of lines Ac by relatively moving the converging spot C along each of the plurality of lines Ac.

Figure 26:
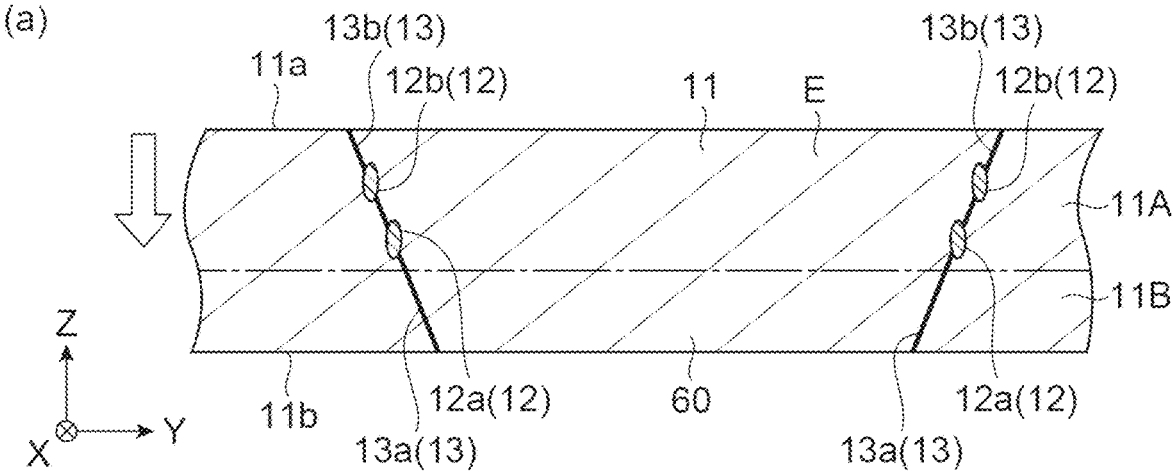
FIG. 26 is a view illustrating a separation step according to the second embodiment.
Figure 26:
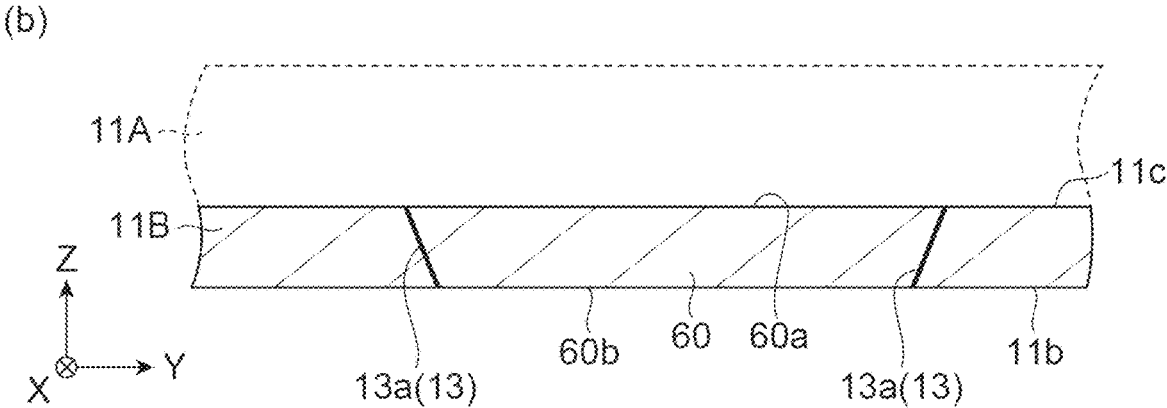
Figure 26:
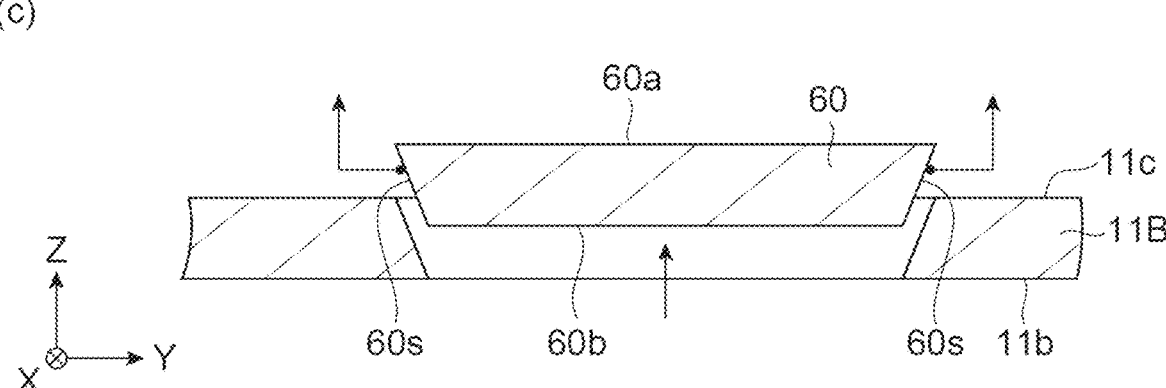

Thereafter, in the method for manufacturing a semiconductor member according to the present embodiment, a separation step is performed of separating a part of the object 11 to form the semiconductor member 60 from the object 11. More specifically, first, as illustrated in FIGS. 26(*a*) and 26(*b*), a grinding step of grinding the object 11 from the first surface 11*a* side to remove the first area 11A is performed before the separation step. Thus, a part of the modified region 12 and a part of the fracture 13 are removed together with the first area 11A. In addition, a new first surface 11*c* (the surface of the remaining second area 11B) is formed on the side opposite to the second surface 11*b*. That is, here, a grinding step of grinding the object 11 along the Z direction to remove the modified region 12 from the object 11 is performed between the laser processing step and the separation step.

Thereafter, as illustrated in FIG. 26(*c*), a force is applied to a part to be separated (a portion corresponding to the semiconductor member 60) from the second surface 11*b* side, and the part is separated from the second area 11B while an outer surface of the part (a surface corresponding to an outer surface 60*s* of the semiconductor member 60) is held by a jig. Thus, the semiconductor member 60 is formed. The semiconductor member 60 includes a first surface 60*a* that is a part of the new first surface 11*c* and a second surface 60*b* that is a part of the second surface 11*b*. The outer surface 60*s* is a surface connecting the first surface 60*a* and the second surface 60*b*, and is an inclined surface defined by the fracture 13. The outer surface 60*s* is inclined with respect to the normal line of the first surface 60*a* and the second surface 60*b*.

The grinding step may be performed after the separation step. That is, the grinding step of removing the modified region 12 from the semiconductor member 60 by grinding the semiconductor member 60 along the Z direction may be performed after the separation step.

The above-described method for manufacturing a semiconductor member includes the laser processing method according to the present embodiment. The laser processing method according to the present embodiment includes the above-described laser processing step.

Figure 27:
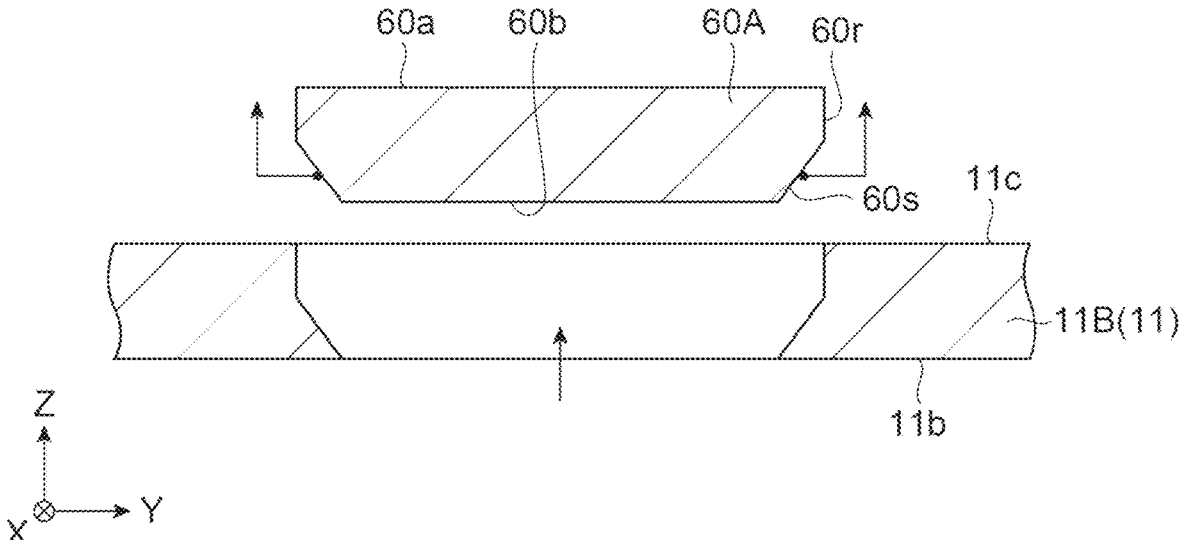
FIG. 27 is a view illustrating a semiconductor member obtained from the object.
Figure 27:
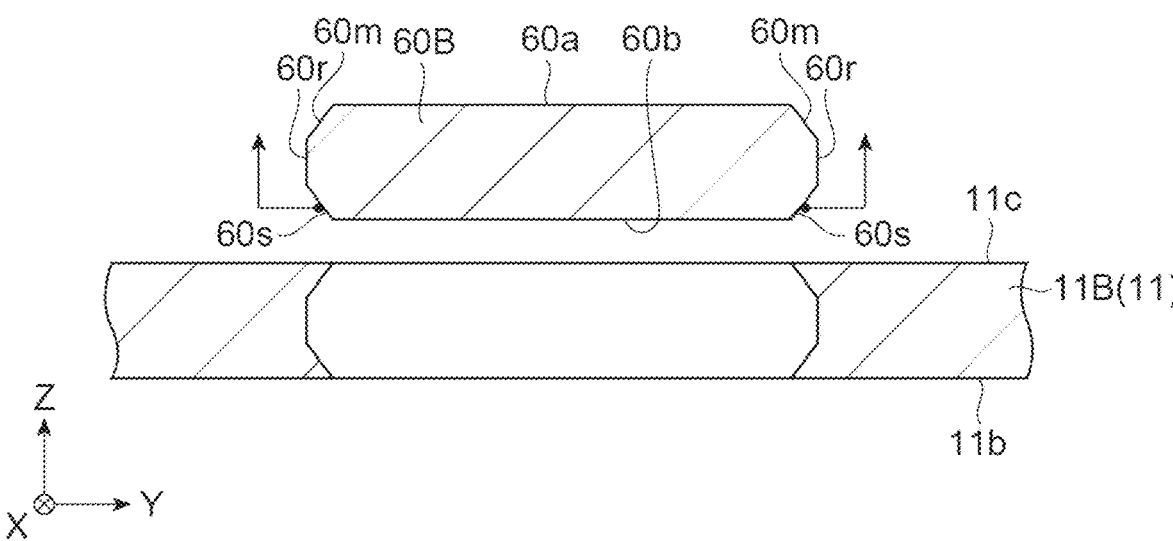

Note that, in the present embodiment, a member having a shape different from that of the semiconductor member 60, such as a semiconductor member 60A illustrated in FIG. 27(*a*) or a semiconductor member 60B illustrated in FIG. 27(*b*), can be manufactured. Next, an example of a case of manufacturing these semiconductor members 60A and 60B will be described.

The semiconductor member 60A includes the first surface 60*a*, the second surface 60*b*, and the outer surface 60*s*, as the semiconductor member 60 does. Further, the semiconductor member 60A includes an outer surface 60*r*. The outer surface 60*r* is parallel to the normal line of the first surface 60*a* and the second surface 60*b*. The outer surface 60*s* is connected to the second surface 60*b*, and the outer surface 60*r* is connected to the first surface 60*a*. Thus, the outer surfaces 60*s* and 60*r* connect the first surface 60*a* and the second surface 60*b*.

Figure 28:
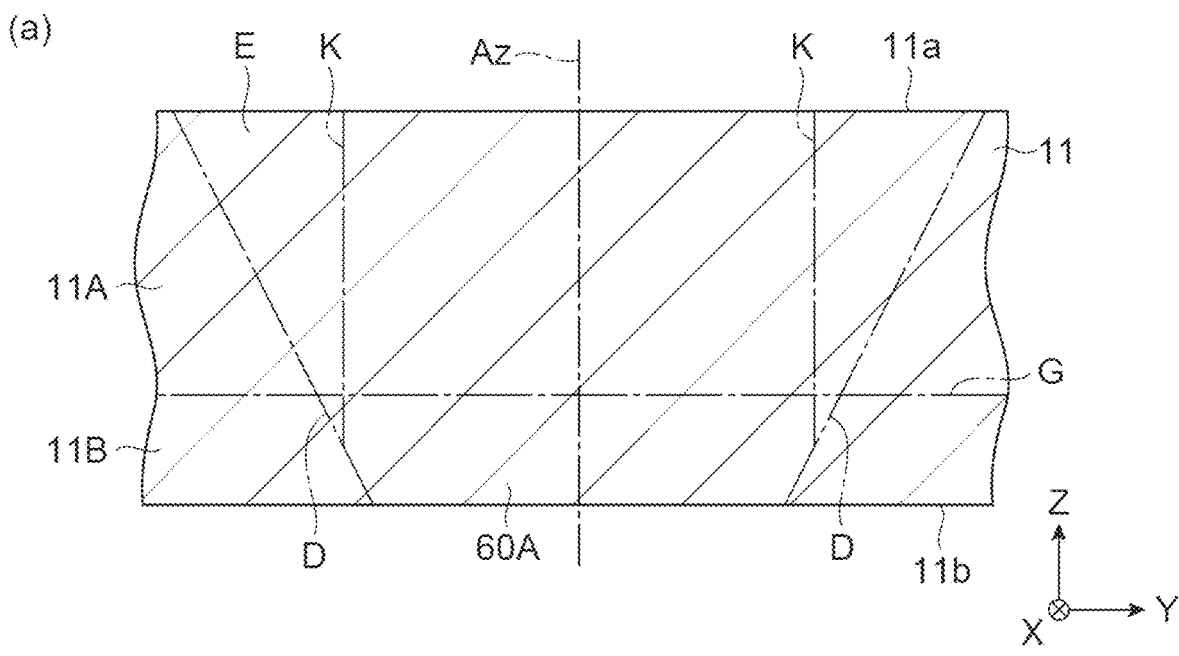
FIG. 28 is a cross-sectional view illustrating a modification of the laser processing step.
Figure 28:
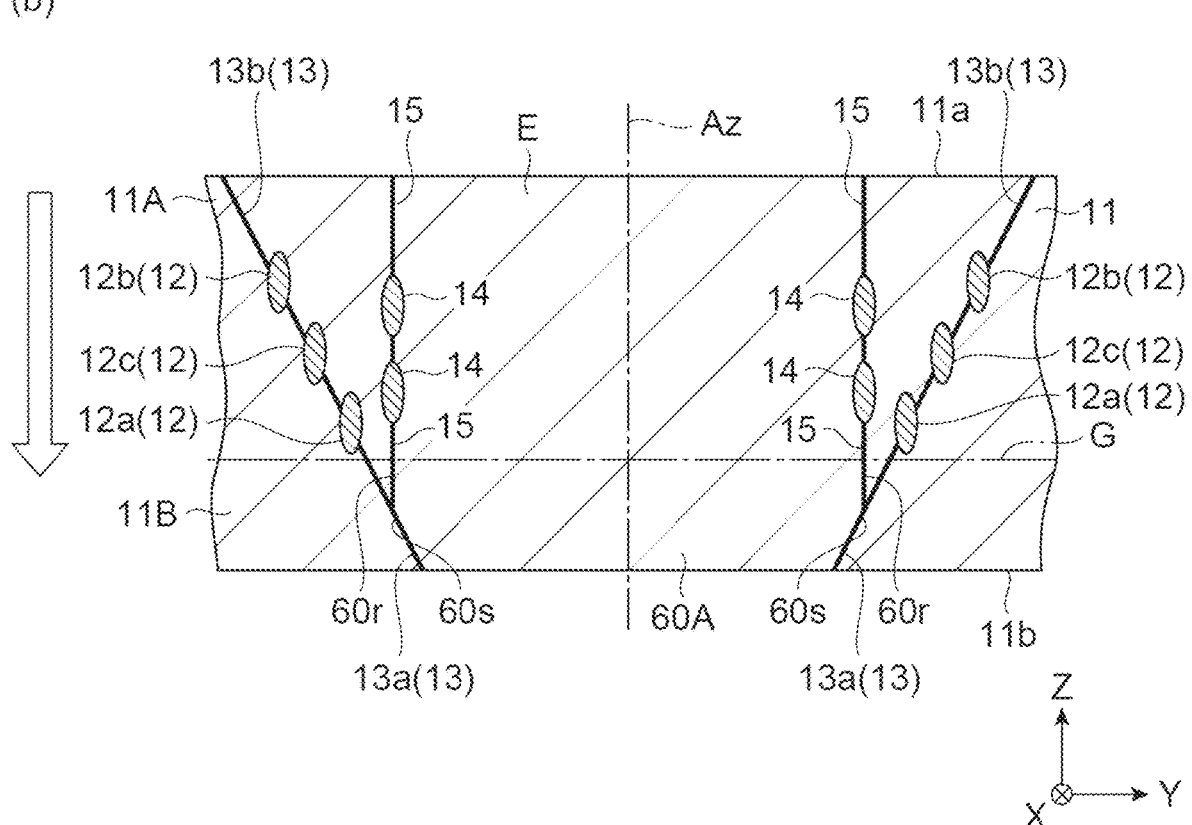

When such a semiconductor member 60A is manufactured, as illustrated in FIG. 28, a modified region (second modified region) 14 and a fracture (second fracture) 15 extended along the Z direction from the modified region 14 are further formed in the object 11 in addition to the formation of the modified region 12 and the fracture 13 described above. That is, when the semiconductor member 60A is formed, the laser processing step includes a first processing step for forming the modified region 12 and the fracture 13 and a second processing step for forming the modified region 14 and the fracture 15. The first processing step is as described above. That is, in the first processing step, the converging spot C is relatively moved with respect to the object 11 along the line Ac, thereby forming the modified region 12 along the line Ac in the object 11, and forming the fracture 13 extended from the modified region 12. The fracture 13 is inclined with respect to the Z direction so as to get away from the reference line Az passing through the center of the line Ac (along the Z direction) as it goes toward the first surface 11*a* in the YZ plane E. In the illustrated example, another modified region 12*c* interposed between the modified region 12*a* and the modified region 12*b* is further formed as the modified region 12.

On the other hand, in the second processing step, the converging spot of the laser light is relatively moved with respect to the object 11 along the line Ac, thereby forming the modified region 14 on the first surface 11*a* side with respect to the fracture 13, and forming the fracture 15 extended along the Z direction from the modified region 14 in the YZ plane E toward the fracture 13 and the first surface 11*a*. Here, one end of the fracture 15 reaches the fracture 13, and the other end of the fracture 15 reaches the first surface 11*a*. In addition, here, two modified regions 14 arrayed in the Z direction are formed. In FIG. 28(*a*), a desired direction in which the fracture 15 is extended (here, the Z direction) is indicated by a line K.

In a state in which the modified regions 12 and 14 and the fractures 13 and 15 are formed as described above, the separation step is performed and a part of the object 11 is separated using the fractures 13 and 15 as a boundary, thereby obtaining the semiconductor member 60A. The fracture 13 defines the outer surface 60*s* of the semiconductor member 60A, and the fracture 15 defines the outer surface 60*r* of the semiconductor member 60A. In the first processing step, the fracture 13 inclined with respect to the Z direction so as to approach from the reference line Az passing through the center of the line Ac (along the Z direction) as it goes toward the first surface 11*a* may be formed in the YZ plane E.

The semiconductor member 60B illustrated in FIG. 27(*b*) includes the first surface 60*a*, the second surface 60*b*, the outer surface 60*s*, and the outer surface 60*r* as the semiconductor member 60A does. Further, the semiconductor member 60B includes an outer surface 60*m*. The outer surface 60*m* is an inclined surface that is inclined with respect to the normal line of the first surface 60*a* and the second surface 60*b*. The direction of the inclination of the outer surface 60*m* is opposite to the direction of the inclination of the outer surface 60*s*. In the semiconductor member 60B, the outer surface 60*s* is connected to the second surface 60*b*, the outer surface 60*m* is connected to the first surface 60*a*, and the outer surface 60*r* is connected to the outer surface 60*s* and the outer surface 60*m*. Thus, the outer surfaces 60*s*, 60*r*, and 60*m* connect the first surface 60*a* and the second surface 60*b*.

Figure 29:
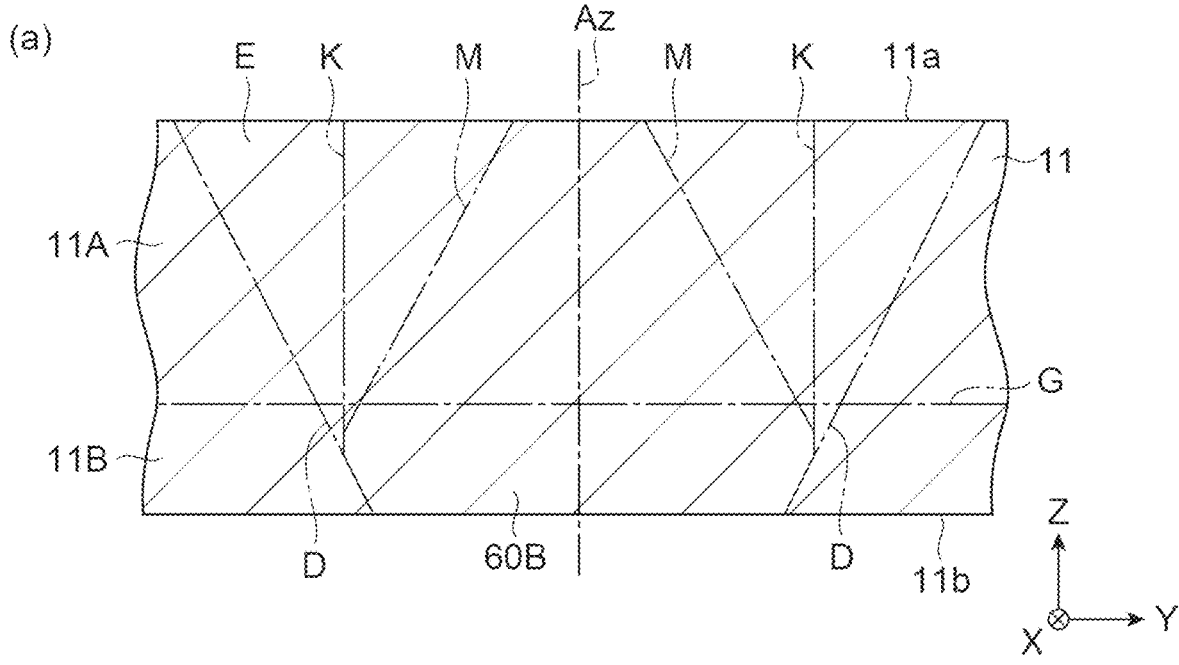
FIG. 29 is a cross-sectional view illustrating another modification of the laser processing step.
Figure 29:
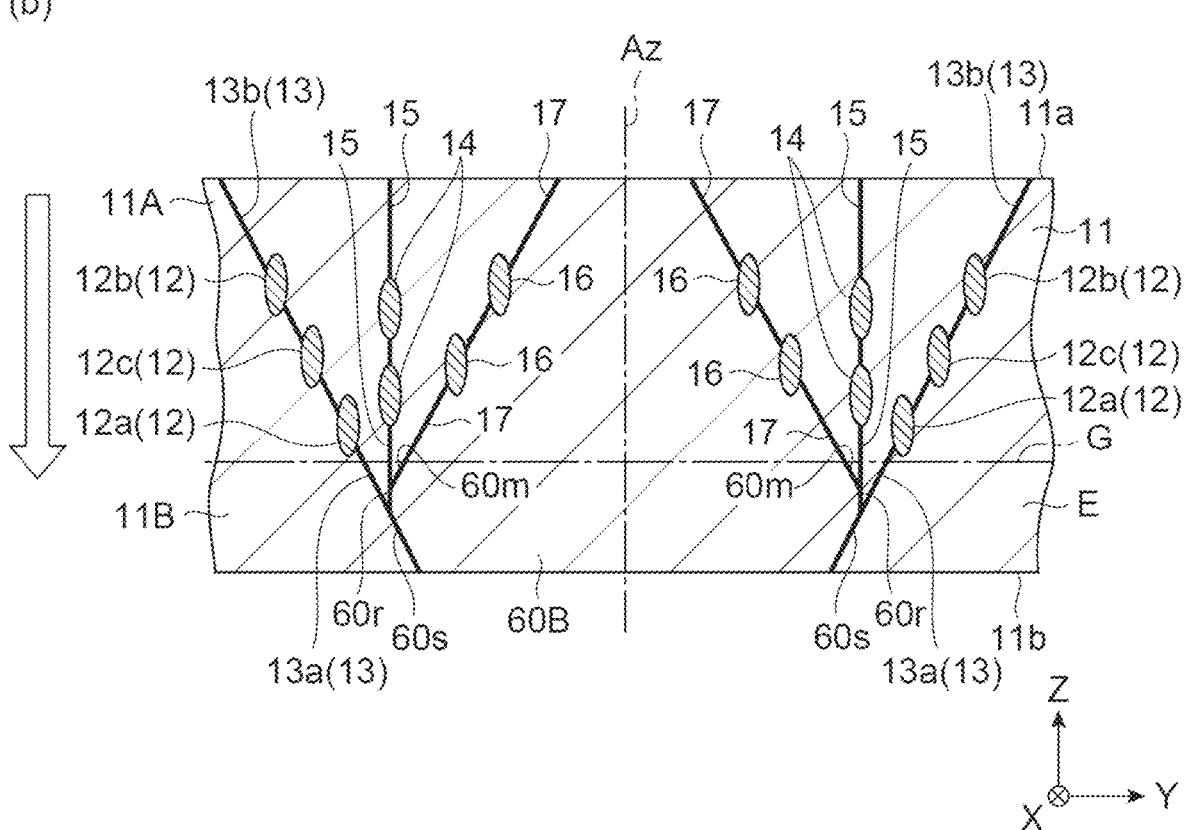

When such a semiconductor member 60B is manufactured, as illustrated in FIG. 29, a modified region (third modified region) 16 and a fracture (third fracture) 17 extended obliquely from the modified region 16 are further formed in the object 11 in addition to the formation of the modified regions 12 and 14 and the fractures 13 and 15 described above. That is, when the semiconductor member 60B is formed, the laser processing step includes a third processing step for forming the modified region 16 and the fracture 17 in addition to the first processing step for forming the modified region 12 and the fracture 13 and the second processing step for forming the modified region 14 and the fracture 15.

The first processing step and the second processing step are as described above. On the other hand, in the third processing step, the converging spot of the laser light is relatively moved with respect to the object 11 along the line Ac, thereby forming the modified region 16 on the first surface 11*a* side with respect to the intersection of the fracture 13 and the fracture 15, and forming the fracture 17 extended toward the fracture 15 from the modified region 16. The fracture 17 is inclined with respect to the Z direction so as to approach the reference line Az as it goes toward the first surface 11*a* in the YZ plane E. As described above, the direction of the inclination of the fracture 17 in the YZ plane E is opposite to the direction of the inclination of the fracture 13. Here, one end of the fracture 17 reaches the fracture 15, and the other end of the fracture 17 reaches the first surface 11*a*. In addition, here, two modified regions 16 arrayed in the YZ plane E are formed. In FIG. 29(*a*), a desired direction in which the fracture 17 is extended is indicated by a line K.

In a state in which the modified regions 12, 14, and 16 and the fractures 13, 15, and 17 are formed as described above, the grinding step and the separation step are performed and a part of the object 11 is separated using the fractures 13, 15, and 17 as a boundary, thereby obtaining the semiconductor member 60B. The fracture 13 defines the outer surface 60*s* of the semiconductor member 60B, the fracture 15 defines the outer surface 60*r* of the semiconductor member 60B, and the fracture 17 defines the outer surface 60*m* of the semiconductor member 60B.

Figure 30:
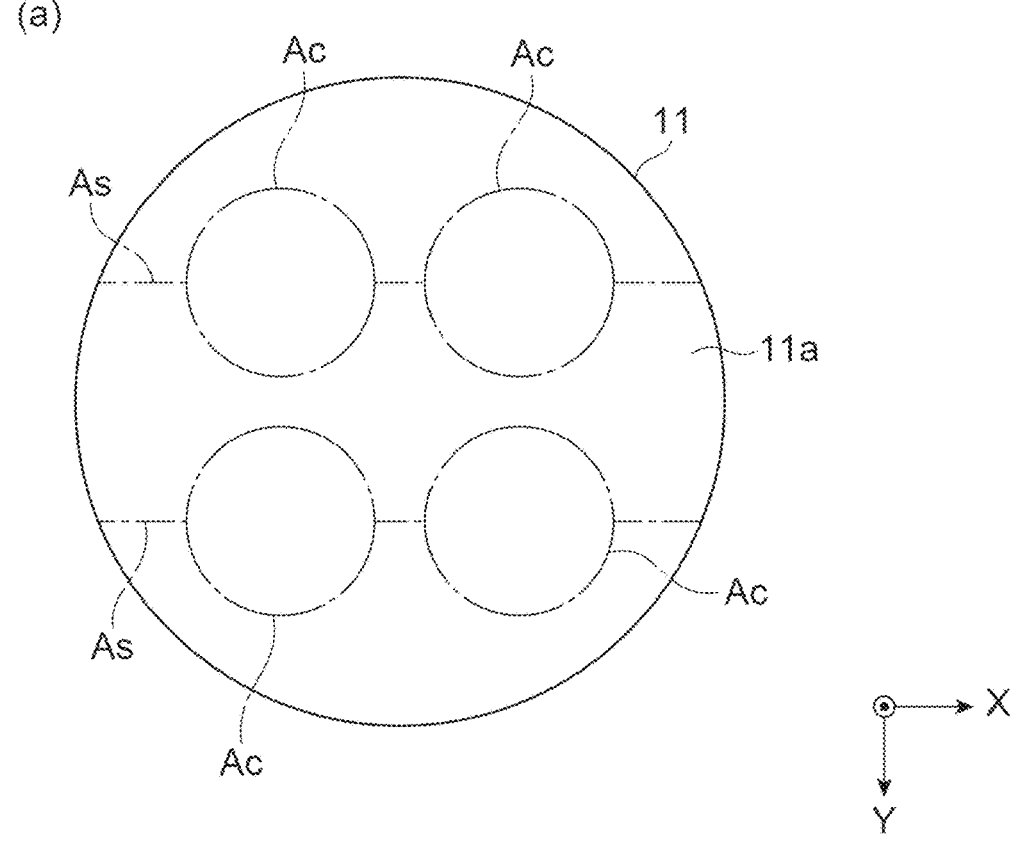
FIG. 30 is a plan view illustrating an object according to the modification.
Figure 30:
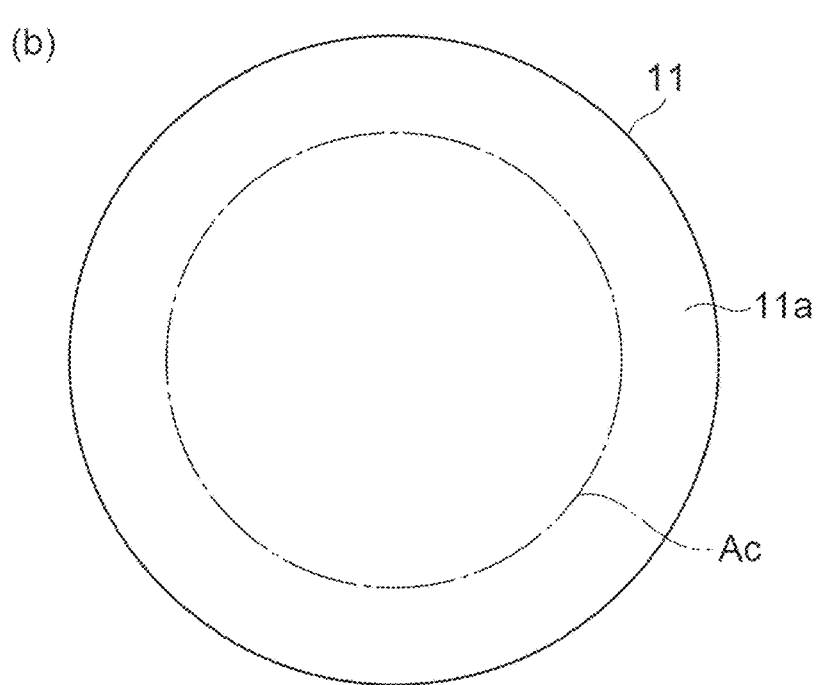

A part of the object 11 corresponding to the semiconductor member 60B has a shape with a relatively large diameter on the center side in the Z direction. For this reason, in the separation step, it is difficult to extract a part corresponding to the semiconductor member 60B from the object 11 while maintaining the shape of the object 11. Thus, in this case, processing for cutting the object 11 into a plurality of portions is required before the separation step. For this purpose, as illustrated in FIG. 30(*a*), a line As is set so as to reach the outer edge of the object 11 from each of the lines Ac when viewed from the Z direction.

The line As is connected to the line Ac so that the object 11 is divided into a plurality of portions by the line As and the line Ac when viewed from the Z direction. Before the separation step, the modified region and the fracture are formed along the line As. As a result, in the separation step, the object 11 is cut using the modified region and the fracture formed along the line As as a boundary, allowing the semiconductor member 60B to be easily separated from the object 11.

In the above example, the case where the grinding process is performed has been described, but the grinding process is not essential. For example, in the YZ plane, the modified regions 12, 14, and 16 are formed in the Z direction by arraying them along the entire Z direction of the object 11, and the fractures 13, 15, and 17 are formed through the modified regions 12, 14, and 16. Then, the object 11 is separated by applying an external force, using the modified regions 12, 14, and 16 and the fractures 13, 15, and 17 as a boundary, thereby acquiring the semiconductor member 60B. The obtained semiconductor member 60B includes modified regions exposed on the outer surfaces 60*s*, 60*r*, and 60*m* (parts of the modified regions 12, 14, and 16). In this case, etching may be performed on the semiconductor member 60B to remove the modified regions exposed on the outer surfaces 60*s*, 60*r*, and 60*m*.

As described above, in the method for manufacturing a semiconductor member (laser processing method) and the laser processing device 1 according to the present embodiment, at least the fracture 13*b* can be an inclined fracture inclined in the direction of the shift in the YZ plane E by shifting the converging spot C2 in the Y direction and controlling the beam shape of the converging spot C2, as in First Embodiment. That is, an inclined fracture can be formed.

In addition, in the method for manufacturing a semiconductor member according to the present embodiment, the converging spot C of the laser light L is relatively moved with respect to the object 11 along the line Ac, thereby forming the modified region 12 and the fracture 13 along the line Ac in the object 11. At this time, the fracture 13 inclined with respect to the Z direction is formed in the intersecting plane (YZ plane E) intersecting with the line Ac. Then, a part of the object 11 is separated using the fracture 13 as a boundary, thereby forming the semiconductor member 60. As a result, the semiconductor member 60 including the inclined surface defined by the fracture 13 as the outer surface 60*s* can be obtained. The inclined outer surface 60*s* can be used, for example, as a bevel for holding the semiconductor member 60 while protecting the front and back surfaces (the first surface 60*a* and the second surface 60*b*) of the semiconductor member 60 (without touching the front and back surfaces) at the time of conveying the semiconductor member 60. Thus, according to the method for manufacturing a semiconductor member according to the present embodiment, the semiconductor member 60 having a bevel can be formed by laser processing.

In the method for manufacturing a semiconductor member according to the present embodiment, the plurality of lines Ac are set in the object 11, and, in the laser processing step, the converging spot C is relatively moved along each of the plurality of lines Ac, thereby forming the modified region 12 and the fracture 13 along each of the plurality of lines Ac. Then, in the separation step, a part of the object 11 is separated along each of the plurality of lines Ac, thereby forming the plurality of semiconductor members 60 from the object 11. The bevel can be formed in each semiconductor member 60 also when the plurality of semiconductor members 60 are manufactured from one object 11 in this manner.

In the method for manufacturing a semiconductor member according to the present embodiment, the laser processing step may include the second processing step of relatively moving the converging spot with respect to the object 11 along the line Ac, thereby forming the modified region 14 on the first surface 11*a* side with respect to the fracture 13 and forming the fracture 15 extended toward the fracture 13 from the modified region 14. In the first processing step, the fracture 13 inclined with respect to the Z direction may be formed so as to get away from the reference line Az passing through the center of the line Ac as it goes toward the first surface 11*a* in the YZ plane E, and in the second processing step, the fracture 15 extended along the Z direction may be formed in the YZ plane E. In this case, the semiconductor member 60A including the inclined surface defined by the fracture 13 (the outer surface 60*s*) and the vertical surface defined by the fracture 15 (the outer surface 60*r*) can be formed.

Further, in the method for manufacturing a semiconductor member according to the present embodiment, the laser processing step can include the third processing step of relatively moving the converging spot with respect to the object 11 along the line Ac, thereby forming the modified region 16 on the first surface 11*a* side with respect to the intersection of the fracture 13 and the fracture 15 and the fracture 17 extended toward the fracture 15 from the modified region 16. In the third processing step, the fracture 17 inclined with respect to the Z direction so as to approach the reference line Az as it goes toward the first surface 11*a* may be formed in the YZ plane E. In this case, the semiconductor member 60B including the inclined surface defined by the fracture 13 (the outer surface 60*s*), the vertical surface defined by the fracture 15 (the outer surface 60*r*), and another inclined surface defined by the fracture 17 (the outer surface 60*m*) can be formed.

In the method for manufacturing a semiconductor member according to the present embodiment, the laser processing step includes the second processing step of relatively moving the converging spot with respect to the object 11 along the line Ac, thereby forming the modified region 14 on the first surface 11*a* side with respect to the fracture 13 and the fracture 15 extended toward the fracture 13 from the modified region 14. In the first processing step, the fracture 13 inclined with respect to the Z direction so as to approach the reference line Az while going toward the first surface 11*a* may be formed in the YZ plane E, and in the second processing step, the fracture 15 extended along the Z direction may be formed in the YZ plane E. In this case, the semiconductor member 60A including the inclined surface defined by the fracture 13 (the outer surface 60*s*) and the vertical surface defined by the fracture 15 (the outer surface 60*r*) as outer surfaces can be formed.

The method for manufacturing a semiconductor member according to the present embodiment further includes the grinding step of grinding the object 11 along the Z direction to remove the modified region 12 and the like from the object 11 between the laser processing step and the separation step. Alternatively, the method for manufacturing a semiconductor member according to the present embodiment further includes the grinding step of grinding the semiconductor member 60 along the Z direction to remove the modified region 12 and the like from the semiconductor member 60 after the separation step. In this case, the semiconductor member 60 from which the modified region 12 has been removed can be obtained.

Note that, as illustrated in FIG. 30(*b*), a single (circular) line Ac may be set in the object 11. Here, the outer shape of the object 11 when viewed from the Z direction is circular. The line Ac has a smaller diameter than the outer shape of the object 11 when viewed from the Z direction. The line Ac is set in the object 11 so as to be concentric with the outer shape of the object 11 when viewed from the Z direction. In this case, in the laser processing step, the modified regions 12, 14, and 16 and the fractures 13, 15, and 17 can be formed along the line Ac by relatively moving the converging spot along the line Ac. Then, in the separation step, a part of the object 11 may be separated along the line Ac, thereby forming one semiconductor member 60 from the object 11. A bevel can be formed in the semiconductor member 60 also when one semiconductor member 60 is manufactured from one object 11 in this manner.

Third Embodiment

Figure 31:
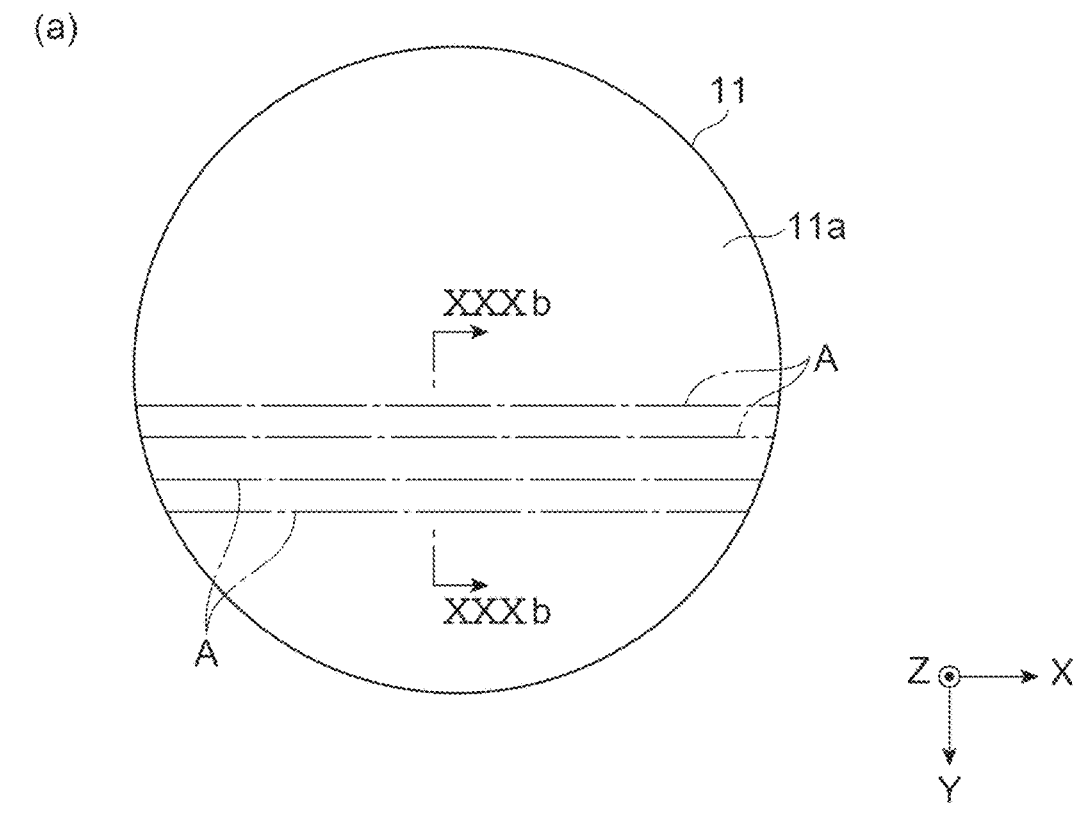
FIG. 31 is a view illustrating an object according to a third embodiment.
Figure 31:
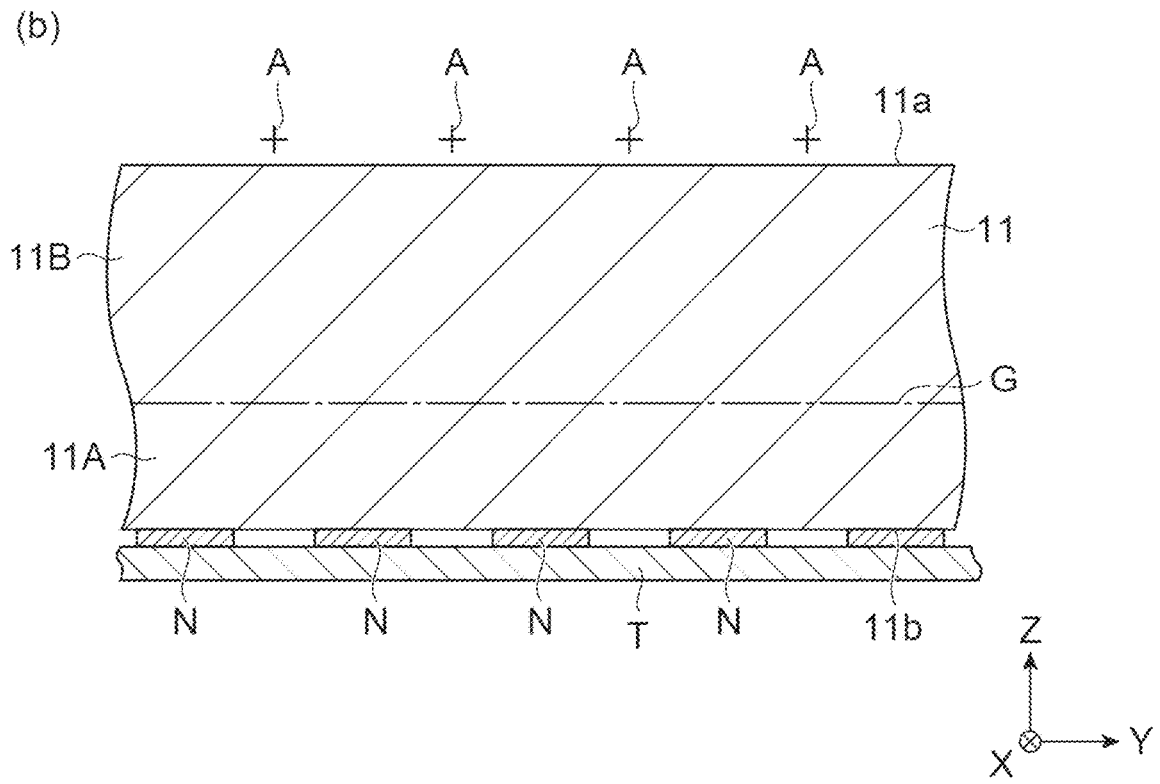

Next, a method for manufacturing a semiconductor member and a laser processing device according to a third embodiment will be described. First, an outline will be described. FIG. 31 is a view illustrating an object according to the third embodiment. FIG. 31(*a*) is a plan view, and FIG. 31(*b*) is a cross-sectional view taken along line XXXb-XXXb in FIG. 31(*a*). The object 11 illustrated in FIG. 31 includes, for example, a semiconductor. The object 11 is, for example, a semiconductor wafer (e.g., a silicon wafer). The object 11 includes a first surface 11*a* and a second surface 11*b* opposite to the first surface 11*a*.

A plurality of lines A parallel to the first surface 11*a* and the second surface 11*b* are set as planned lines of cutting in the object 11. The line A may be set in a lattice shape, but here, a plurality of lines A extended in one direction parallel to each other are illustrated. The lines A are, for example, virtual lines. In addition the object 11 includes a first area 11A including the first surface 11*a* and a second area 11B including the second surface 11*b*. A line G in the figure is a virtual line indicating a boundary between the first area 11A and the second area 11B. The first area 11A is a planned area of grinding.

The object 11 includes a semiconductor structure N formed on the second surface 11*b*. The semiconductor structure N has a structure for causing individual semiconductor members obtained by cutting the object 11 along the line A to function as semiconductor elements. Therefore, the line A is set so as to pass between the semiconductor structures N. The object 11 is held by the holding member T on the second surface 11*b* side and supported by the stage 2 such that the first surface 11*a* faces the converging lens 33 side. The holding member T is, for example, a tape having elasticity.

In the present embodiment, the modified region 12 and the fracture 13 are formed along each of the lines A by irradiating the object 11 with the laser light L while relatively moving the converging spot C of the laser light L along each of the lines A. At this time, the converging spot C is relatively moved in the X direction. That is, here, the X direction is defined as a processing forward direction. In the present embodiment, the fracture 13 including a portion that is inclined in the Y direction with respect to the Z direction is formed in an intersecting plane (YZ plane E) intersecting with (orthogonal to) the X direction that is the processing forward direction.

Figure 32:
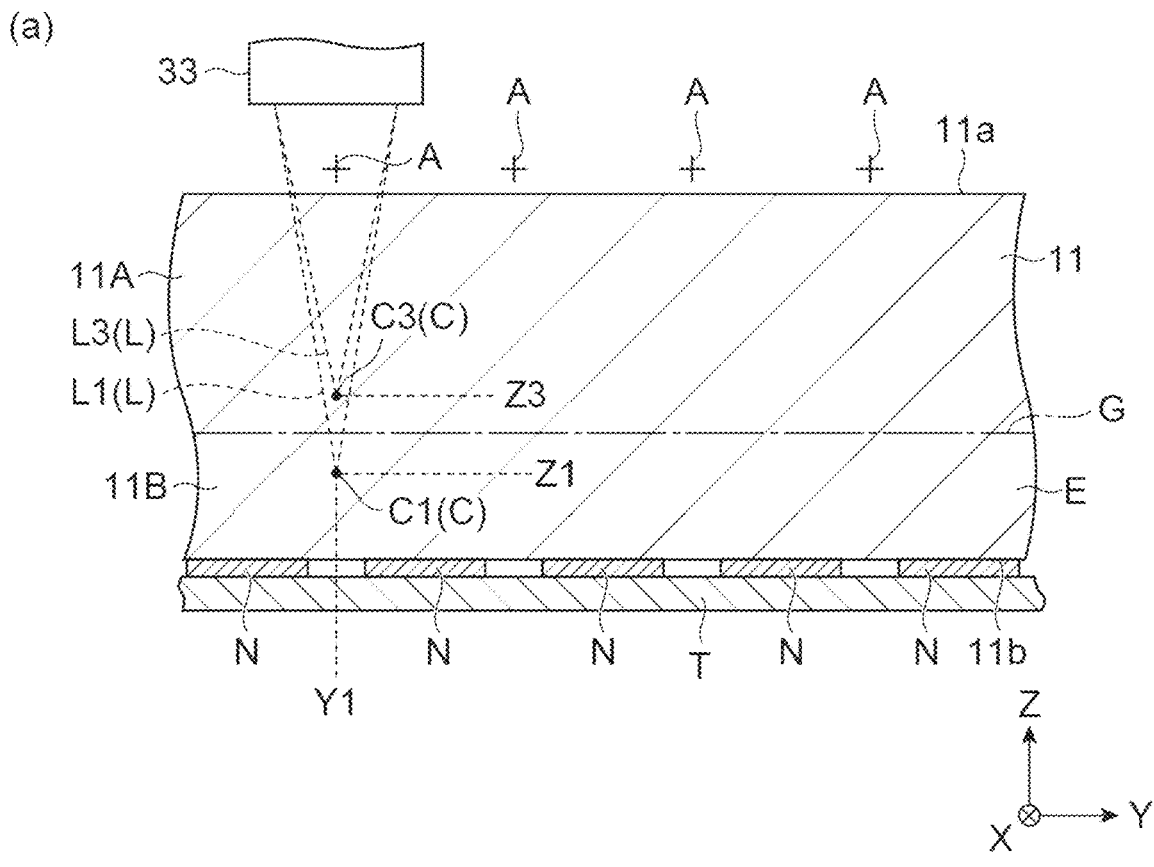
FIG. 32 is a view illustrating a laser processing step according to the third embodiment.
Figure 32:
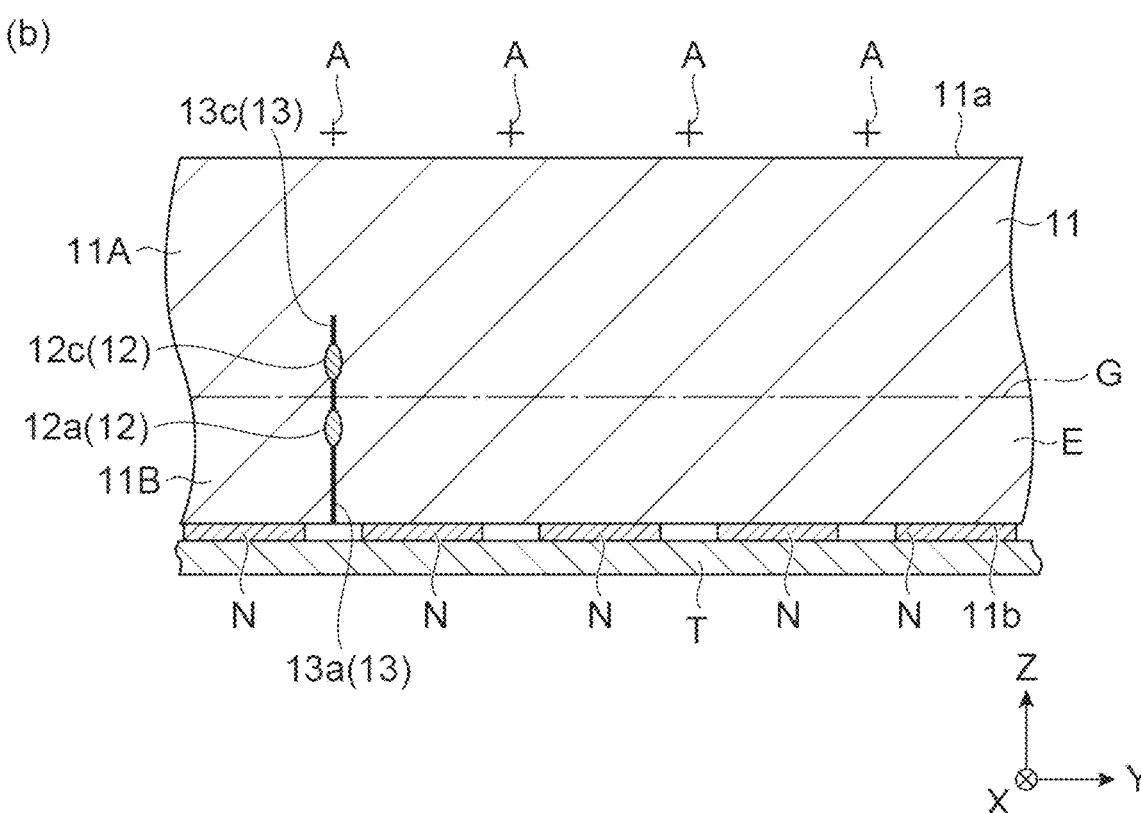

Next, the method for manufacturing a semiconductor member and the laser processing device according to the present embodiment will be specifically described. As illustrated in FIG. 32, in this method, first, the object 11 as described above is prepared, and the object 11 is supported by the stage 2 such that the first surface 11*a* faces the converging lens 33 side and the line A goes along the X direction. In this state, first, a laser processing step is performed on one line A of forming the converging spot C of the laser light L (converging spots C1, C2, and C3 of laser light L1, L2, and L3) in the object 11 while relatively moving the converging spot C with respect to the object 11, thereby performing laser processing in the object 11.

More specifically, in the laser processing step, the first forming step is performed of relatively moving the converging spot C1 along the line A extended in the X direction along the first surface 11*a* while setting a position of the converging spot C1 in the Z direction intersecting with the first surface 11*a* that is the incident surface of the laser light L in the object 11 at the first Z position Z1, thereby forming the modified region 12*a* and the fracture 13*a* extended from the modified region 12*a* in the object 11, and of relatively moving the converging spot C3 along the line A while setting a position of the converging spot C3 in the Z direction at a first Z position Z3, thereby forming the modified region 12*c* and a fracture 13*c* extended from the modified region 12*c* in the object 11.

The first Z position Z3 is a position closer to the first surface 11*a* than the first Z position Z1. In addition, here, the first Z position Z1 is set in the second area 11B, and the first Z position Z3 is set in the first area 11A that is the planned area of grinding. However, one of the first Z positions Z1 and Z3 may be both set in the first area 11A or may be both set in the second area 11B, or may be arbitrarily set according to a request as to whether or not to leave the modified regions 12*a* and 12*c* after the grinding of the object 11.

As described above, in the present embodiment, the converging spots C1 and C3 are formed in each of the plurality of first Z positions Z1 and Z3 having different positions in the Z direction and are relatively moved in the first forming step, thereby forming a plurality of modified regions 12*a* and 12*c* arrayed in the Z direction in the intersection plane intersecting with the line A (YZ plane E), and forming the fractures 13*a* and 13*c* so as to be extended through the plurality of modified regions 12*a* and 12*c*. In the first forming step, the positions of the converging spots C1 and C3 in the Y direction are set at the first Y position Y1, and the fractures 13*a* and 13*c* are formed so as to go along the Z direction in the YZ plane E and reach the second surface 11*b*. These fractures 13*a* and 13*c* are, for example, along the main cleavage plane of the object 11.

Figure 33:
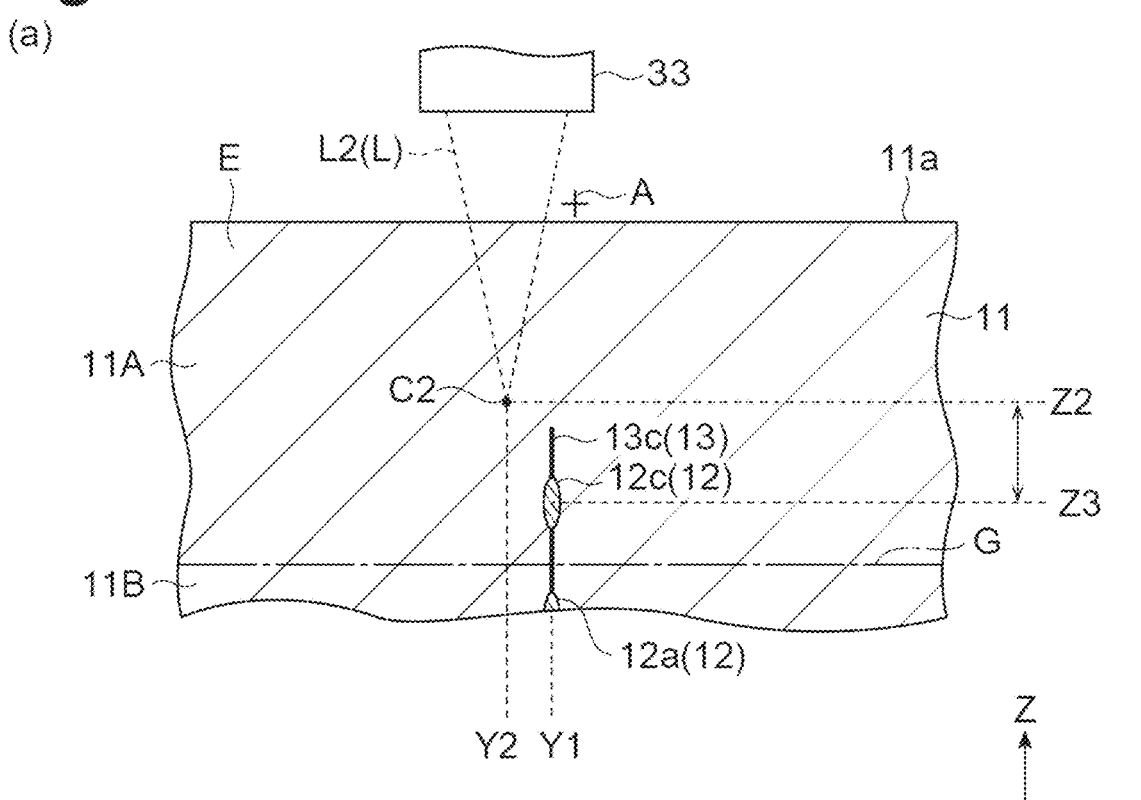
FIG. 33 is a view illustrating a laser processing step according to the third embodiment.
Figure 33:
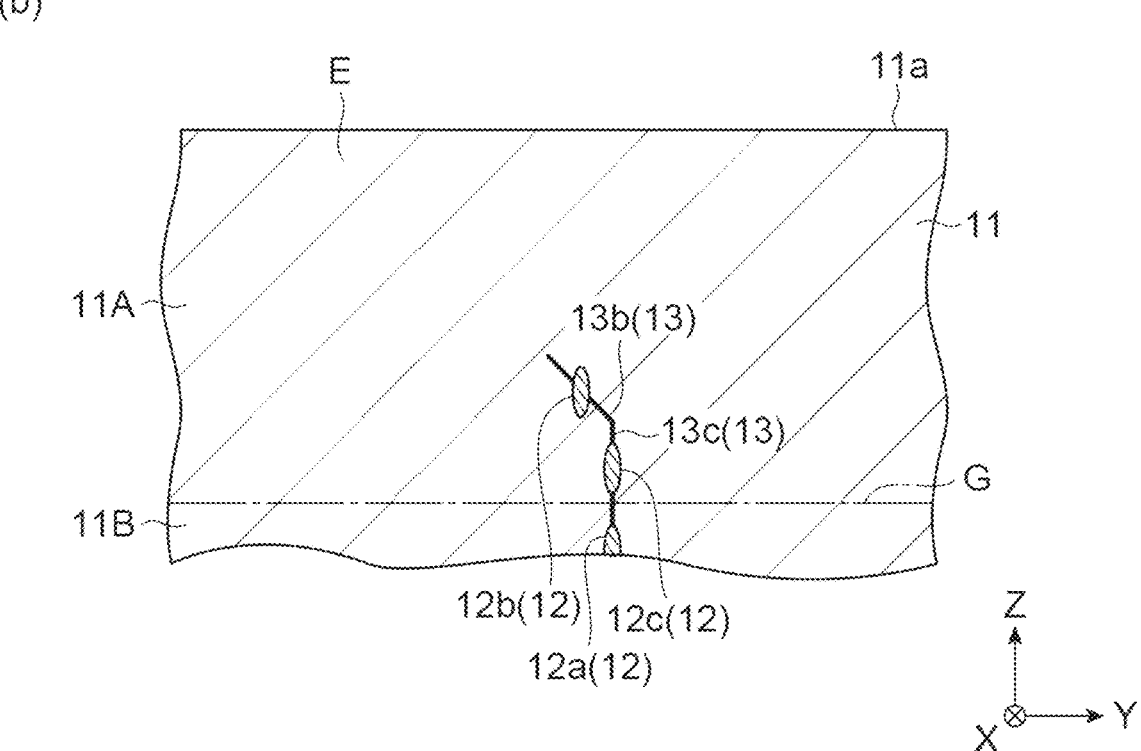

Next, as illustrated in FIG. 33, in a laser forming step, the second forming step is performed after the first forming step, of relatively moving the converging spot C2 along the line A while setting a position of the converging spot C2 of the laser light L2 in the Z direction at the second Z position Z2 that is closer to the first surface 11*a* than the first Z position Z3, thereby forming the modified region 12*b* and the fracture 13*b* extended from the modified region 12*b*. Here, since the first Z position Z3 is set in the first area 11A that is the planned area of grinding as described above, the second Z position Z2 is also set in the first area 11A. In particular, here, the second Z position Z2 is set such that the fracture 13*b* is formed in the first area 11A.

In the second forming step, the position of the converging spot C2 in the Y direction is set at the second Y position Y2 shifted from the first Y position Y1 of the converging spots C1 and C3, and the fracture 13*b* is formed so as to be inclined with respect to the Z direction in the YZ plane E. More specifically, in the second forming step, the laser light L2 is modulated such that the beam shape of the converging spot C2 in the YZ plane E has an inclined shape that is inclined in the direction of the shift at least on the first surface 11*a* side with respect to the center of the converging spot C2, thereby forming the fracture 13*b* so as to be inclined in the direction of the shift in the YZ plane E. Further, in the second forming step, the fracture 13*b* is formed so as to be inclined with respect to the cleavage plane of the object 11 in the YZ plane E.

The laser processing step including the first forming step and the second forming step can be performed, for example, by the control unit 6 of the laser processing device 1 controlling each unit of the laser processing device 1, as in First Embodiment. That is, in the laser processing device 1 according to the present embodiment, the control unit 6 controls the space light modulator 7 and the drive units 4 and 5 to perform a first forming process of relatively moving the converging spots C1 and C3 along the line A while setting the position of the converging spots C1 and C3 in the Z direction at the first Z positions Z1 and Z3, thereby forming the modified regions 12*a* and 12*c* and the fractures 13*a* and 13*c* in the object 11, and a second forming process of relatively moving the converging spot C2 along the line A while setting the position of the converging spot C2 in the Z direction at the second Z position Z2 that is closer to the first surface 11*a* than the first Z positions Z1 and Z3, thereby forming the modified region 12*b* and the fracture 13*b*.

In addition, in the first forming process, the control unit 6 sets the position of the converging spot C1,C3 in the Y direction at the first Y position Y1. In the second forming process, the control unit 6 sets the position of the converging spot C2 in the Y direction at the second Y position Y2 shifted from the first Y position Y1, and modulates the laser light L2 such that the beam shape of the converging spot C2 in the YZ plane E has an inclined shape that is inclined in the direction of the shift at least on the first surface 11*a* side with respect to the center of the converging spot C2 by controlling the modulation pattern to be displayed on the space light modulator 7. Note that the modulation pattern for forming the beam shape into an inclined shape is as described above. In the first forming step (first forming process), the formation of the modified region 12*a* and the fracture 13*a* by the laser light L1 and the formation of the modified region 12*c* and the fracture 13*c* by the laser light L3 may be performed simultaneously (multifocal processing) or sequentially (single-pass processing).

Further, the first forming step (the first forming process) and the second forming step (the second forming process) may be simultaneously performed on one line A set in the object 11 by causing a modulation pattern including a branch pattern for branching the laser light L into the laser light L1, L2, and L3 to be displayed on the space light modulator 7. In this case, it is possible to form only the converging spot C2 among the converging spots C1, C2, and C3 into an inclined shape by combining the modulation patterns so as to generate coma aberration only on the laser light L2 among the laser light L1, L2, and L3.

Figure 34:
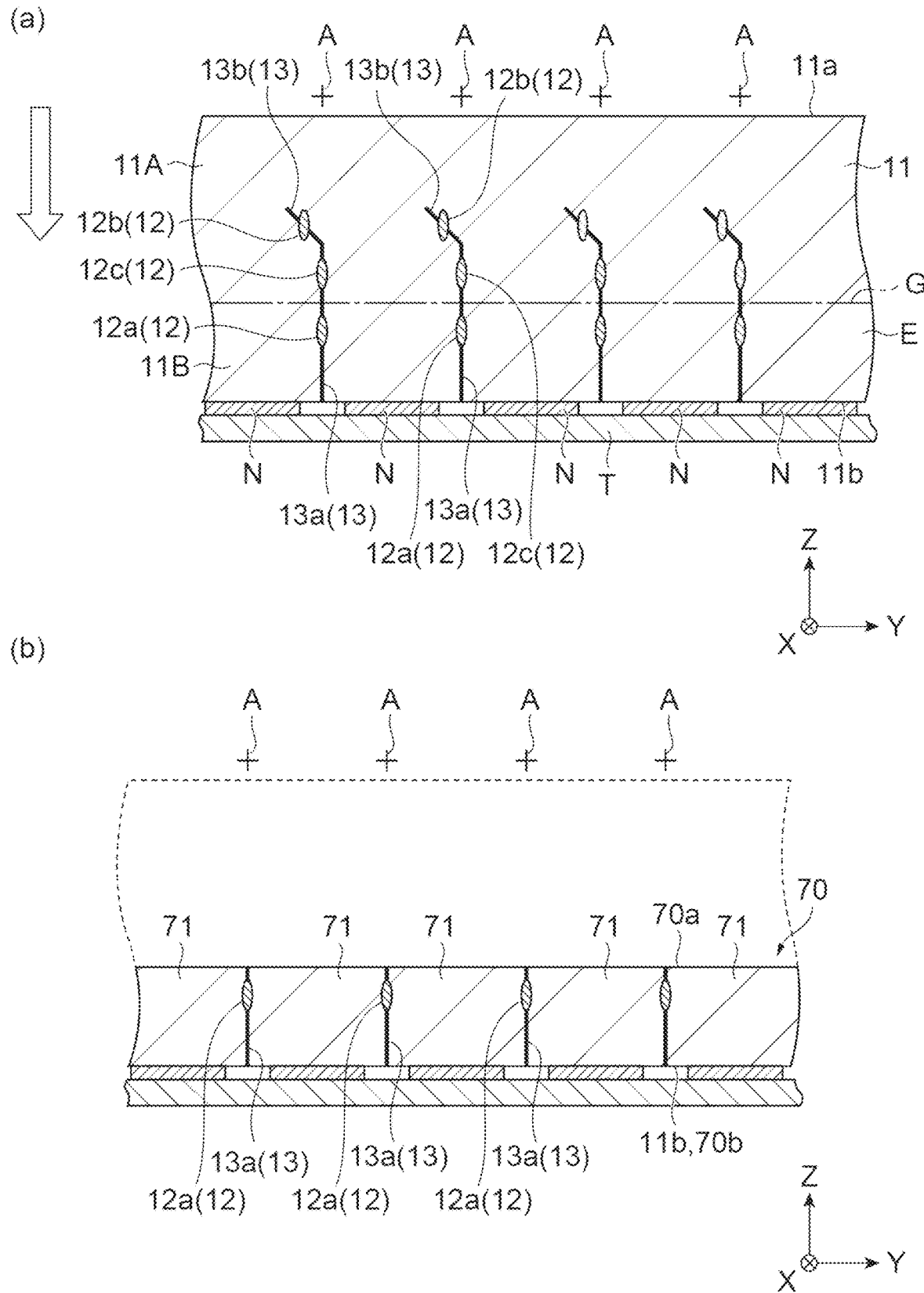
FIG. 34 is a view illustrating a grinding step according to the third embodiment.

In the method for manufacturing a semiconductor member according to the present embodiment, the above-described laser processing step is performed for all the lines A. As a result, the modified region 12 and the fracture 13 are formed along all the lines A, as illustrated in FIG. 34(a). Note that the fracture 13b and the fracture 13c may not be connected to each other or may be connected to each other.

Thereafter, in the method for manufacturing a semiconductor member according to the present embodiment, as illustrated in FIG. 34(b), the object 11 is ground from the first surface 11a side to remove the first area 11A, thereby removing from the object 11 at least the fracture 13b extended obliquely with respect to the Z direction. Here, the modified regions 12b and 12c are also removed in addition to the fracture 13b.

As a result, a semiconductor member 70 as the remaining second area 11B is obtained. The semiconductor member 70 includes a second surface 11b and a new first surface 70a that is a surface opposite to the second surface 11b and is formed by grinding. In the semiconductor member 70, the fracture 13 extended at least from the new first surface 70a to the second surface 11b is formed (here, the modified region 12a remains). Thus, in a subsequent step, the semiconductor member 70 can be separated into a plurality of different semiconductor members using the fracture 13 as a boundary by expanding the holding member T. The above-described method for manufacturing a semiconductor member includes the laser processing method according to the present embodiment. The laser processing method according to the present embodiment includes the above-described laser processing step.

As described above, in the method for manufacturing a semiconductor member (laser processing method) and the laser processing device 1 according to the present embodiment, at least the fracture 13b can be an inclined fracture inclined in the direction of the shift in the YZ plane E by shifting the converging spot C2 in the Y direction and controlling the beam shape of the converging spot C2, as in First Embodiment. That is, an inclined fracture can be formed.

In the laser processing method according to the present embodiment, in the first forming step, the converging spots C1 and C3 of the laser light L1 and L3 are relatively moved along the line A along the X direction to form the modified regions 12a and 12c in the object 11 and form the fractures 13a and 13c extended from the modified regions 12a and 12c in the object 11 so as to reach the second surface 11b of the object 11. At this time, the positions of the converging spots C1 and C3 in the Z direction are defined as the first Z positions Z1 and Z3. In addition, at this time, the fractures 13a and 13c are formed so as to go along the Z direction in the YZ plane E intersecting with the X direction.

Thereafter, in the second forming step, the converging spot C2 is relatively moved along the line A while setting the position of the converging sport C2 of the laser light L2 in the Z direction at the second Z position Z2 that is closer to the first surface 11a than the first Z positions Z1 and Z3 to form the modified region 12b and the fracture 13b in the object 11. At this time, the position of the converging spot C2 in the Y direction is shifted in the Y direction as compared with the first forming step, and the fracture 13b is formed so as to be inclined with respect to the Z direction in the YZ plane E. According to the knowledge of the present inventor, this can stop the extension of the fracture 13c when the fracture 13c begins to extend to the first surface 11a side along the Z direction because the fracture 13c is connected to the fracture 13b. Therefore, it is possible to suppress the extension of the fracture 13 according to this method.

In the laser processing method according to the present embodiment, the planned area of grinding (the first area 11A) including the first surface 11a is set in the object 11, and in the first forming step, the first Z position Z1 is set in an area closer to the second surface 11b than the planned area of grinding. Then, in the second forming step, the second Z position Z2 is set such that the fracture 13b is formed inside the planned area of grinding. As a result, the influence of the inclined fracture is reduced by removing the fracture 13b by grinding the planned area of grinding.

In addition, in the laser processing method according to the present embodiment, the fracture 13b is formed so as to be inclined with respect to the cleavage plane of the object 11 in the YZ plane E in the second forming step. In this case, it is possible to more reliably suppress the extension of the fracture.

Further, in the laser processing method according to the present embodiment, the converging spots C1 and C3 are formed in each of the plurality of first Z positions Z1 and Z3 having different positions in the Z direction and are relatively moved in the first forming step, thereby forming a plurality of modified regions 12a and 12c arrayed in the Z direction in the YZ plane E, and forming the fractures 13a and 13c so as to be extended through the plurality of modified regions 12a and 12c. As a result, the thicker object 11 can be suitably processed by forming the longer fractures 13a and 13c in the Z direction.

In the laser processing method according to the present embodiment, in the first forming step, the fracture 13a may be formed so as to reach the second surface 11b. When the fracture 13a reaches the second surface 11b in this manner, the fracture tends to be unintentionally extended, and thus it is more effective to suppress the extension of the fracture.

Further, in the laser processing method according to the present embodiment, the first forming step and the second forming step may be simultaneously performed on one line A set in the object 11 by branching the laser light L. An inclined fracture can be formed also when the first forming step and the second forming step are simultaneously performed in this manner.

Further, the method for manufacturing a semiconductor member according to the present embodiment is a method for manufacturing the semiconductor member 70 from the object 11 including a semiconductor, in which the object 11 is ground from the first surface 11a side to remove at least the fracture 13b from the object 11 after the laser processing step included in the above-described laser processing method is performed, thereby forming the semiconductor member 70 from the object 11. In this manufacturing method, the laser processing step of the above-described laser processing method is performed. As a result, unintended fracture extension is suppressed. Therefore, the occurrence of chipping is suppressed when the object is ground after the laser processing step. In addition, conveyance to a place where grinding is performed is facilitated.

In the above example, the case where the fracture 13a is formed so as to reach the second surface 11b in the first forming step has been described. However, the fracture 13a may not reach the second surface 11b. In this case, the fracture 13a may extend to the second surface 11b side and reach the second surface 11b when the modified region 12b and the fracture 13b are formed in the second forming step, or the fracture 13a may extend to the second surface 11b side and reach the second surface 11b when the object 11 is ground in the grinding step.

In the above example, the case has been described where the modified region 12b serving as the starting point of the fracture 13*b* extended obliquely with respect to the Z direction is located closer to the first surface 11*a* that is the incident surface of the laser light L than the modified regions 12*a* and 12*c* serving as the starting points of the fractures 13*a* and 13*c* extended along the Z direction. However, the modified region 12*b* and the fracture 13*b* may be located closer to the second surface 11*b* than the modified regions 12*a* and 12*c* and the fractures 13*a* and 13*c*. That is, in the second forming step, the second Z position Z2 can be set in an area closer to the second surface 11*b* than the first Z position Z1. In this case, the beam shape of the converging spot C2 in the YZ plane is controlled to be inclined in the direction from the second Y position Y2 of the converging spot C2 toward the first Y position Y1 of the converging spot C1 at least on the first surface 11*a* side with respect to the center Ca, thereby forming the fracture 13*b* inclined in the same direction with respect to the Z direction.

The above embodiments describe one aspect of the present disclosure. Therefore, the present disclosure can be arbitrarily changed without being limited to the above embodiments.

For example, the number of modified regions 12 formed to be arrayed in the Z direction in the YZ plane E can be arbitrarily set according to the thickness of the object 11, the desired extension amount of the fracture 13, and the like.

In addition, the modulation pattern for modulating the laser light L is not limited to the above examples, and any modulation pattern that can form the beam shape of the converging spot C an inclined shape can be adopted.

Further, the above embodiments can be applied by being arbitrarily combined with each other or partially replaced with each other. For example, when the modified region 12 and the fracture 13 are formed along the circular line Ac as in the second embodiment, the configuration for suppressing the extension of the fracture 13 as in the third embodiment may be adopted.

In the above embodiments, an example has been described where the object 11 is held via the holding member T such as a tape, but the object 11 may be held by, for example, a silicon substrate, a glass substrate, or the like that is attached to the object 11. When a circuit or the like is formed on one surface of the object 11, the circuit surfaces can be bonded to each other.

INDUSTRIAL APPLICABILITY

The semiconductor member manufacturing method in which a semiconductor member having a bevel can be formed by laser processing can be provided.

REFERENCE SIGNS LIST

1 LASER PROCESSING DEVICE
4, 5 DRIVE UNIT (MOVEMENT UNIT)
6 CONTROL UNIT
7 SPACE LIGHT MODULATOR
11 OBJECT
11*a* FIRST SURFACE
11*b* SECOND SURFACE
12, 12*a*, 12*b*, 12*c* MODIFIED REGION
13, 13*a*, 13*b*, 13*c* FRACTURE
C, C1, C2, C3 CONVERGING SPOT
L, L1, L2, L3 LASER LIGHT
31 LIGHT SOURCE
33 CONVERGING LENS

The invention claimed is:

1. A semiconductor member manufacturing method comprising:
   a laser processing step of forming a converging spot of laser light in an object including a semiconductor while relatively moving the converging spot with respect to the object along a line extended in a circular shape when viewed from a Z direction intersecting with an incident surface of the laser light in the object, thereby forming a modified region and a fracture extended from the modified region along the line in the object; and
   a separation step of, after the laser processing step, separating a part of the object using the modified region and the fracture as a boundary, thereby forming a semiconductor member from the object,
   wherein
   the laser processing step includes a first processing step of relatively moving the converging spot with respect to the object along the line, thereby forming a first modified region along the line as the modified region and a first fracture extended from the first modified region as the fracture,
   in the first processing step, the first fracture that is inclined with respect to the Z direction in an intersecting plane intersecting with the line is formed,
   in the separation step, the semiconductor member including an inclined surface defined by the first fracture as an outer side surface is formed, and
   the first processing step includes:
   a first forming step of relatively moving the converging spot along the line while setting a position of the converging spot in the Z direction at a first Z position, thereby forming a fourth modified region as the first modified region; and
   a second forming step of relatively moving the converging spot along the line while setting a position of the converging spot in the Z direction at a second Z position that is closer to the incident surface side than the first Z position, thereby forming a fifth modified region as the first modified region, and forming the first fracture extended from the fifth modified region,
   and wherein
   in the first forming step, a position of the converging spot in a Y direction intersecting with an X direction that is a direction in which the converging spot is relatively moved and the Z direction is set at a first Y position, and
   in the second forming step, a position of the converging spot in the Y direction is set at a second Y position shifted from the first Y position, while the laser light is modulated such that a beam shape of the converging spot in a YZ plane including the Y direction and the Z direction has an inclined shape that is inclined in a direction of the shift at least on the incident surface side with respect to a center of the converging spot, thereby forming the first fracture so as to be inclined in the direction of the shift in the YZ plane.

2. The semiconductor member manufacturing method according to claim 1, wherein
   a plurality of the lines are set in the object,
   in the laser processing step, the converging spot is relatively moved along each of the plurality of lines, thereby forming the modified region and the fracture along each of the plurality of lines, and
   in the separation step, a part of the object is separated along each of the plurality of lines, thereby forming a plurality of semiconductor members from the object.

3. The semiconductor member manufacturing method according to claim 1, wherein the object has a circular outer shape when viewed from the Z direction, and the line concentric with the outer shape of the object when viewed from the Z direction is set in the object.

4. The semiconductor member manufacturing method according to claim 1, wherein the laser processing step includes a second processing step of relatively moving the converging spot with respect to the object along the line, thereby forming a second modified region on the incident surface side with respect to the first fracture as the modified region, and forming a second fracture extended from the second modified region toward the first fracture as the fracture, in the first processing step, the first fracture that is inclined with respect to the Z direction is formed in the intersecting plane so as to get away from a reference line passing through a center of the line as it goes toward the incident surface, and in the second processing step, the second fracture extended along the Z direction is formed in the intersecting plane.

5. The semiconductor member manufacturing method according to claim 4, wherein the laser processing step includes a third processing step of relatively moving the converging spot with respect to the object along the line, thereby forming a third modified region on the incident surface side with respect to an intersection of the first fracture and the second fracture as the modified region, and forming a third fracture extended from the third modified region toward the second fracture as the fracture, and in the third processing step, the third fracture that is inclined with respect to the Z direction is formed in the intersecting plane so as to approach the reference line as it goes toward the incident surface.

6. The semiconductor member manufacturing method according to claim 1, wherein the laser processing step includes a second processing step of relatively moving the converging spot with respect to the object along the line, thereby forming a second modified region on the incident surface side with respect to the first fracture as the modified region, and forming a second fracture extended from the second modified region toward the first fracture as the fracture, in the first processing step, the first fracture that is inclined with respect to the Z direction is formed in the intersecting plane so as to approach a reference line passing through the center of the line as it goes toward the incident surface, and in the second processing step, the second fracture extended along the Z direction is formed in the intersecting plane.

7. The semiconductor member manufacturing method according to claim 1, further comprising a grinding step of grinding the object along the Z direction to remove the modified region from the object between the laser processing step and the separation step.

8. The semiconductor member manufacturing method according to claim 1, further comprising a grinding step of grinding the semiconductor member along the Z direction to remove the modified region from the semiconductor member after the separation step.

\* \* \* \* \*